(12) United States Patent
Yun et al.

(10) Patent No.: US 12,433,079 B2
(45) Date of Patent: Sep. 30, 2025

(54) DISPLAY DEVICE

(71) Applicant: Samsung Display Co., LTD., Yongin-si (KR)

(72) Inventors: Su Yeon Yun, Seoul (KR); Yun Mi Choi, Yongin-si (KR); Eun Ju Kim, Suwon-si (KR); An Na Ryu, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 429 days.

(21) Appl. No.: 17/794,938

(22) PCT Filed: Feb. 27, 2020

(86) PCT No.: PCT/KR2020/002805
§ 371 (c)(1),
(2) Date: Jul. 22, 2022

(87) PCT Pub. No.: WO2021/149863
PCT Pub. Date: Jul. 29, 2021

(65) Prior Publication Data
US 2023/0361259 A1      Nov. 9, 2023

(30) Foreign Application Priority Data

Jan. 23, 2020 (KR) .......................... 10-2020-0009450

(51) Int. Cl.
*H10H 20/857*      (2025.01)
*H01L 25/075*      (2006.01)
(Continued)

(52) U.S. Cl.
CPC ....... *H10H 20/857* (2025.01); *H01L 25/0753* (2013.01); *H01L 25/167* (2013.01);
(Continued)

(58) Field of Classification Search
CPC ................ H10H 20/857; H10H 20/831; H01L 25/0753; H01L 25/167; H01L 21/76895;
(Continued)

(56) References Cited

U.S. PATENT DOCUMENTS 9,935,153 B1      4/2018 Jung et al.
10,283,533 B2 *   5/2019 Lee .................... H10D 30/6729
(Continued)

FOREIGN PATENT DOCUMENTS

CN      1515948 A      7/2004
CN    103918098 A      7/2014
(Continued)

OTHER PUBLICATIONS

International Search Report of PCT/KR2020/002805, Oct. 29, 2020, 5 pages.
(Continued)

*Primary Examiner* — Tan N Tran
(74) *Attorney, Agent, or Firm* — Womble Bond Dickinson (US) LLP

(57) ABSTRACT

A display device comprises: a first voltage wiring line extending in a first direction; a data line spaced apart from the first voltage wiring line and extending in the first direction; a scan line extending in a second direction crossing the first direction; a sensing line spaced apart from the scan line and extending in the second direction; a first internal bank and a second internal bank arranged on the first voltage wiring line and the data line, extending in the first direction and being spaced apart from each other while facing each other; a first electrode arranged on the first internal bank and extending in the first direction; a second electrode arranged on the second internal bank and extend- (Continued)

ing in the first direction; and a plurality of light emitting elements arranged between the first electrode and the second electrode.

24 Claims, 27 Drawing Sheets

(51) Int. Cl.
   *H01L 25/16* (2023.01)
   *H10D 86/40* (2025.01)
   *H10D 86/60* (2025.01)
   *H10H 20/831* (2025.01)

(52) U.S. Cl.
   CPC .......... *H10D 86/441* (2025.01); *H10D 86/60* (2025.01); *H10H 20/831* (2025.01)

(58) Field of Classification Search
   CPC .... H01L 25/105; H10D 86/441; H10D 86/60; H10D 10/821; H10D 30/0295; H10D 64/511; H10D 84/858; A01N 1/146
   See application file for complete search history.

(56) References Cited

U.S. PATENT DOCUMENTS

| | | | |
|---|---|---|---|
| 10,355,138 B2 * | 7/2019 | Wang | H10D 30/6723 |
| 10,811,438 B2 * | 10/2020 | Choi | H10K 59/126 |
| 10,916,610 B2 * | 2/2021 | Oh | H10K 59/1213 |
| 11,367,823 B2 | 6/2022 | Kim et al. | |
| 11,811,012 B2 | 11/2023 | Kim et al. | |
| 2017/0186832 A1 | 6/2017 | Zhang et al. | |
| 2017/0317155 A1 | 11/2017 | Oh et al. | |
| 2018/0145121 A1 | 5/2018 | Park et al. | |
| 2018/0269260 A1 * | 9/2018 | Ghosh | H10K 59/50 |
| 2019/0148477 A1 | 5/2019 | Park et al. | |
| 2021/0272937 A1 | 9/2021 | Lim et al. | |

FOREIGN PATENT DOCUMENTS

| | | | |
|---|---|---|---|
| CN | 110646994 A | | 1/2020 |
| EP | 3787027 A1 | | 3/2021 |
| KR | 10-2017-0124065 A | | 11/2017 |
| KR | 2017-0129508 A | | 11/2017 |
| KR | 10-2018-0057777 A | | 5/2018 |
| KR | 10-2019-0038150 A | | 4/2019 |
| KR | 10-2019-0124359 A | | 11/2019 |
| KR | 10-2020-0001649 A | | 1/2020 |
| KR | 10-2020-0005711 A | | 1/2020 |
| KR | 10-2020-0006651 A | | 1/2020 |
| WO | WO-2019208880 A1 * | | 10/2019 |

OTHER PUBLICATIONS

Chinese Office Action issued Jun. 24, 2024, in corresponding Chinese Patent Application No. CN 202080094244.4 (12 pages).
Extended European Search Report dated Jan. 29, 2024, issued in corresponding European Application No. EP 20915229.7 (13 pages).

* cited by examiner

DISPLAY DEVICE

CROSS-REFERENCE TO RELATED APPLICATION

This application is a U.S. National Phase Patent Application of International Patent Application Number PCT/KR2020/002805, filed on Feb. 27, 2020, which claims priority to Korean Patent Application Number 10-2020-0009450 filed on Jan. 23, 2020, the entire content of all of which is incorporated herein by reference.

BACKGROUND

1. Field

One or more embodiments of the present disclosure relate to a display device.

2. Description of Related Art

Display devices are becoming increasingly important with the development of multimedia. Accordingly, various types (or kinds) of display devices such as organic light emitting displays and liquid crystal displays are being used.

A display device includes a display panel such as an organic light emitting display panel or a liquid crystal display panel as a device for displaying an image of the display device. Among them, a light emitting display panel may include light-emitting elements such as light emitting diodes (LEDs). For example, the LEDs may be organic light emitting diodes (OLEDs) using an organic material as a fluorescent material, or may be inorganic LEDs using an inorganic material as a fluorescent material.

Inorganic LEDs using an inorganic semiconductor as a fluorescent material are durable even in a high-temperature environment and have higher blue light efficiency than OLEDs. In addition, a transfer method using dielectrophoresis (DEP) has been developed for a manufacturing process which has been pointed out as a limitation of conventional (e.g., comparable) inorganic LEDs. Therefore, research is being continuously conducted on inorganic LEDs having better durability and efficiency than OLEDs.

SUMMARY

The present disclosure is directed to providing a display device including an inorganic light emitting element.

The present disclosure is also directed to providing a display device in which a light emitting area and a non-light emitting area are separated so that circuit elements and display elements do not overlap each other.

It should be noted that aspects of the disclosure are not limited thereto and other aspects, which are not mentioned herein, will be apparent to those of ordinary skill in the art from the following description.

According to one or more embodiments of the disclosure, a display device comprises a first voltage wiring line extending in a first direction, a data line spaced apart from the first voltage wiring line and extending in the first direction, a scan line extending in a second direction different from the first direction, a sensing line spaced apart from the scan line and extending in the second direction, a first internal bank and a second internal bank that are provided on the first voltage wiring line and the data line, extend in the first direction, and are spaced apart from each other and face each other, a first electrode provided on the first internal bank and extending in the first direction, a second electrode provided on the second internal bank and extending in the first direction, and a plurality of light emitting elements provided between the first electrode and the second electrode, wherein each of the light emitting elements includes a semiconductor core including a light emitting layer, and an insulating film surrounding (e.g., around) at least a portion of an outer surface of the semiconductor core.

The display device may further include a reference voltage wiring line spaced apart from the data line in the second direction and extending in the first direction, and a reference voltage distribution line spaced apart from the sensing line in the first direction and extending in the second direction, wherein the reference voltage distribution line may be electrically connected to the reference voltage wiring line.

The data line may be provided between the first voltage wiring line and the reference voltage wiring line, and the sensing line may be provided between the scan line and the reference voltage distribution line.

The display device may further include a second voltage wiring line extending in the first direction and spaced apart from the reference voltage wiring line, wherein the first electrode may be electrically connected to the first voltage wiring line through a driving transistor, and the second electrode may be electrically connected to the second voltage wiring line.

The second voltage wiring line may further include a portion extending in the second direction, and the portion of the second voltage wiring line extending in the second direction may partially overlap the second electrode in a plan view.

The first internal bank may partially overlap the first voltage wiring line in a plan view, and the second internal bank may be provided not to overlap the data line in a thickness direction of the display device.

The display device may further include an external bank provided to extend in the first direction and the second direction to surround an area in which the first internal bank and the second internal bank are provided, wherein the first voltage wiring line may extend in the first direction between the second internal bank and the external bank, and the data line may overlap a portion of the external bank, which extends in the first direction, in the thickness direction.

The display device may further include a shielding electrode having at least a portion overlapping the first electrode and provided to surround an area in which the light emitting elements are provided, wherein the shielding electrode may be provided to cover a portion of an outer side of each of the first electrode and the first internal bank with respect to the area in which the light emitting elements are provided.

The display device may further include a third internal bank provided to be spaced apart from and face the first internal bank and a repair electrode provided on the third internal bank, wherein the light emitting elements may further include a first light emitting element provided between the first electrode and the second electrode and a second light emitting element provided between the first electrode and the repair electrode.

The semiconductor core of the light emitting element may include a first semiconductor layer, a second semiconductor layer, and the light emitting layer provided between the first semiconductor layer and the second semiconductor layer, and the insulating film may be provided to surround at least an outer surface of the light emitting layer.

The display device may further include a first contact electrode provided on the first electrode, and electrically connected to the first electrode and one end of the light emitting element, and a second contact electrode provided on the second electrode and electrically connected to the second electrode and the other end of the light emitting element.

According to one or more embodiments of the disclosure, a display device comprises a first substrate, a semiconductor layer provided on the first substrate and including a first active layer of a driving transistor, a first gate insulating layer provided on the first substrate and the semiconductor layer, a first gate conductive layer provided on the first gate insulating layer and including a first gate electrode of the driving transistor, a first interlayer insulating layer provided on the first gate conductive layer, a first data conductive layer provided on the first interlayer insulating layer and including a source electrode and a drain electrode of the driving transistor and a first voltage wiring line, a first protective layer provided on the first data conductive layer, a first planarization layer provided on the first protective layer, a first internal bank and a second internal bank that are provided on the first planarization layer and spaced apart from each other and face each other, a first electrode and a second electrode provided on the first internal bank and the second internal bank, respectively, and a light emitting element provided between the first electrode and the second electrode, wherein the light emitting element includes a semiconductor core including a light emitting layer; and an insulating film surrounding at least a portion of an outer surface of the semiconductor core.

The first electrode may be electrically connected to one of the source electrode or the drain electrode of the driving transistor through an electrode contact hole passing through the first protective layer and the first planarization layer.

The first gate conductive layer may further include a second voltage wiring line, and the second electrode may be electrically connected to the second voltage wiring line.

The first data conductive layer may further include a second voltage wiring line, and the second electrode may be electrically connected to the second voltage wiring line.

The first data conductive layer may further include a conductive pattern in contact with the second voltage wiring line through a first wiring line contact hole passing through the first interlayer insulating layer, and the second electrode may be in contact with the conductive pattern through a second wiring line contact hole passing through the first protective layer and the first planarization layer.

The display device may further include a first contact electrode provided on the first electrode, and electrically connected to the first electrode and one end of the light emitting element, and a second contact electrode provided on the second electrode and electrically connected to the second electrode and another end of the light emitting element.

The display device may further include a thin-film encapsulation structure provided on the first contact electrode and the second contact electrode, and a color filter layer provided on the thin-film encapsulation structure.

The display device may further include a color control layer provided between the color filter layer and the thin-film encapsulation structure.

The display device may further include an external bank provided on the first planarization layer and spaced apart from each of the first internal bank and the second internal bank, wherein a height of the external bank may be greater than a height of each of the first internal bank and the second internal bank.

The display device may further include a reflective layer provided on one surface of the external bank.

The display device may further include a buffer layer provided between the first substrate and the semiconductor layer, and a light blocking layer provided between the buffer layer and the first substrate and configured to partially overlap the first active layer.

According to one or more embodiments of the disclosure, a display device comprises a first substrate in which a light emitting area and a non-light emitting area are defined, a semiconductor layer provided on the non-light emitting area of the first substrate and including a first active layer of a driving transistor, a first gate conductive layer provided in the non-light emitting area and including a first gate electrode provided to overlap the first active layer, a first voltage wiring line provided in the non-light emitting area and the light emitting area and extending in a first direction, a first internal bank and a second internal bank that are provided in the light emitting area, extend in the first direction, and are spaced apart from each other in a second direction, a first electrode including at least a portion provided on the first internal bank and including a portion extending in the first direction, a second electrode including at least a portion provided on the second internal bank and including a portion extending in the first direction, and a plurality of light emitting elements provided between the first electrode and the second electrode and electrically connected to the first electrode and the second electrode, wherein each of the light emitting elements includes a semiconductor core including a light emitting layer, and an insulating film surrounding at least a portion of an outer surface of the semiconductor core.

The display device may further include a scan line provided in the non-light emitting area and extending in the second direction, and a sensing line extending in the second direction and spaced apart from the scan line.

The display device may further include a reference voltage wiring line provided in the non-light emitting area and the light emitting area and extending in the first direction, and a reference voltage distribution line that is provided in the non-light emitting area, extends in the second direction, and is electrically connected to the reference voltage wiring line.

The first electrode may include a first electrode stem portion extending in the second direction and a first electrode branch portion branched from the first electrode stem portion in the first direction, and the second electrode may include a second electrode stem portion extending in the second direction and a second electrode branch portion branched from the second electrode stem portion in the first direction.

The display device may further include a first contact electrode provided on the first electrode branch portion and electrically connected to the first electrode and one end of the light emitting element, and a second contact electrode provided on the second electrode branch portion and electrically connected to the second electrode and another end of the light emitting element.

The display device may further include an external bank provided to cover the non-light emitting area and surround the light emitting area, wherein a height of the external bank may be greater than a height of each of the first internal bank and the second internal bank.

The details of other embodiments are included in the detailed description and the accompanying drawings.

A display device according to one embodiment includes a plurality of light emitting elements provided in an area in which an internal bank is formed and thus can have a top emission structure in which light emitted from the light emitting element is reflected from a side surface of the internal bank.

Further, according to one or more embodiments, in a display device, a light emitting area in which light emitting elements are provided cannot overlap a non-light emitting area in which circuit elements are provided, and the display device can have a bottom emission structure.

It should be noted that objects of the present disclosure are not limited to the above-described objects, and other objects of the present disclosure will be apparent to those skilled in the art from the following descriptions.

The effects according to the embodiments are not limited by the contents exemplified above, and more various effects are included in this disclosure.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

The present disclosure will now be described more fully hereinafter with reference to the accompanying drawings, in which example embodiments of the present disclosure are shown. This present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
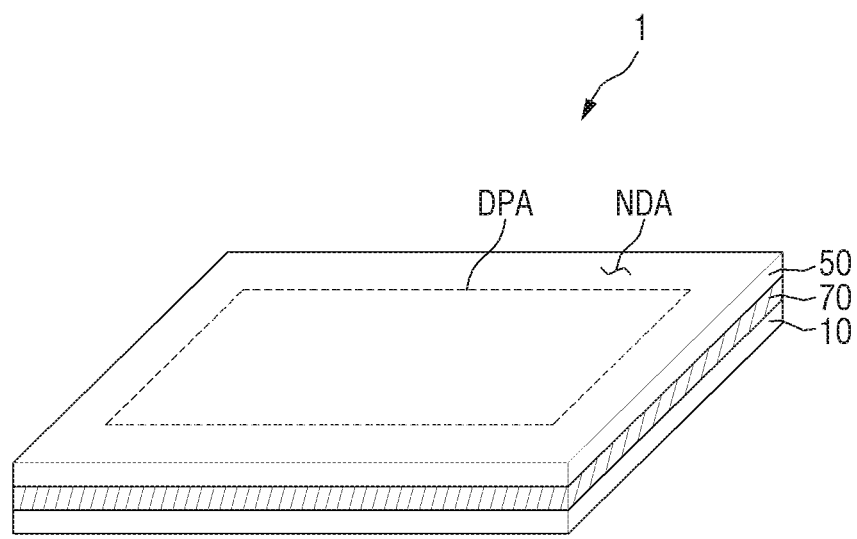
FIG. 1 is a schematic perspective view of a display device according to one or more embodiments.
Figure 2:
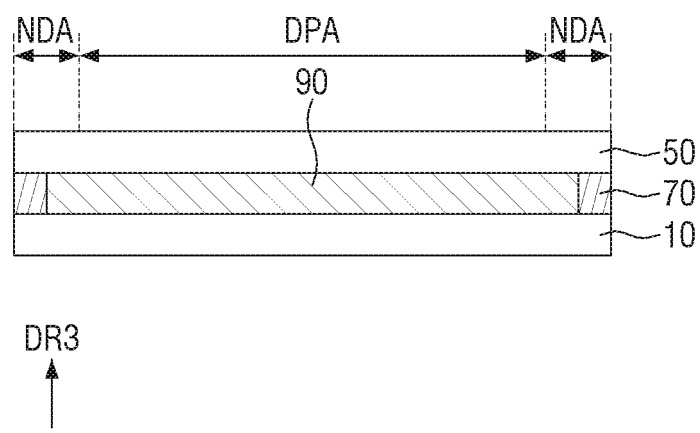
FIG. 2 is a schematic cross-sectional view of the display device of FIG. 1.

FIG. 1 is a schematic perspective view of a display device according to one or more embodiments. FIG. 2 is a schematic cross-sectional view of the display device of FIG. 1.

Referring to FIGS. 1 and 2, a display device 1 may be applied to various electronic devices such as small or middle-sized electronic devices including tablet personal computers (PCs), smartphones, car navigation units, cameras, center information displays (CIDs) provided in vehicles, wristwatch type electronic devices, personal digital assistants (PDAs), portable multimedia players (PMPs), game machines, and the like, and middle or large-sized electronic devices including televisions, external billboards, monitors, PCs, notebook computers, and the like. However, it should be clear to those of ordinary skill in the art that these are provided as embodiments and may be employed in other electronic devices within a suitable range that does not depart from the scope of the present disclosure.

In some embodiments, the display device 1 may have a rectangular shape in a plan view. The display device 1 may include two first sides extending in one direction and two second sides extending in another direction crossing the one direction. A corner of the display device 1, in which the first side meets the second side, may have a right angle, but is not limited thereto, and may have a curved surface. In some embodiments, the first side may be shorter than the second side, but the present disclosure is not limited thereto. A planar shape of the display device 1 is not limited to the illustrated shape, but circular or other shapes may be applied as the planar shape.

The display device 1 may include a display area DPA in which an image is displayed and a non-display area NDA in which an image is not displayed. In some embodiments, the non-display area NDA may be located around the display area DPA and may surround the display area DPA.

In one embodiment, the display device 1 may include a first display substrate 10, a second display substrate 50 opposite to the first display substrate 10, and may further include a sealing portion 70 configured to bond the first display substrate 10 to the second display substrate 50 and a filler 90 filled between the first display substrate and the second display substrate 50.

The first display substrate 10 may include elements and circuits for displaying an image, for example, pixel circuits such as switching elements, a pixel defining film configured to define a light emitting area and a non-light emitting area, which will be described in more detail herein below, in the display area DPA, and self-light emitting elements. In one or more embodiments, the self-light emitting element may include at least one of an organic light emitting diode (LED), a quantum dot LED, or an inorganic material-based micro-LED (for example, a micro-LED), and an inorganic material-based nano LED (for example, a nano LED).

The second display substrate 50 may be located above the first display substrate 10 and may be opposite to (e.g., may face) the first display substrate 10. The second display substrate 50 may include a color conversion pattern that converts a color of incident light. In some embodiments, the color conversion pattern may include at least one of a color filter or a color control layer. A more detailed description thereof will be provided herein below.

The sealing portion 70 may be located between the first display substrate 10 and the second display substrate 50 in the non-display area NDA. The sealing portion 70 may be provided along an edge of each of the first display substrate 10 and the second display substrate 50 in the non-display area NDA, and may surround the display area DPA in a plan view. The first display substrate 10 and the second display substrate 50 may be bonded to each other through the sealing portion 70. In some embodiments, the sealing portion 70 may be made of an organic material. As an example, the sealing portion 70 may be made of an epoxy-based resin, but the present disclosure is not limited thereto.

The filler 90 may be located in a space surrounded (e.g., defined) by the sealing portion 70 between the first display substrate 10 and the second display substrate 50. The space between the first display substrate 10 and the second display substrate 50 may be filled with the filler 90. The filler 90 may be made of a material that is capable of transmitting light. In some embodiments, the filler 90 may be made of an organic material. As an example, the filler 90 may be made of a silicon-based organic material, an epoxy-based organic material, and/or the like, but the present disclosure is not limited thereto. The filler 90 may not be provided in some embodiments.

Figure 3:
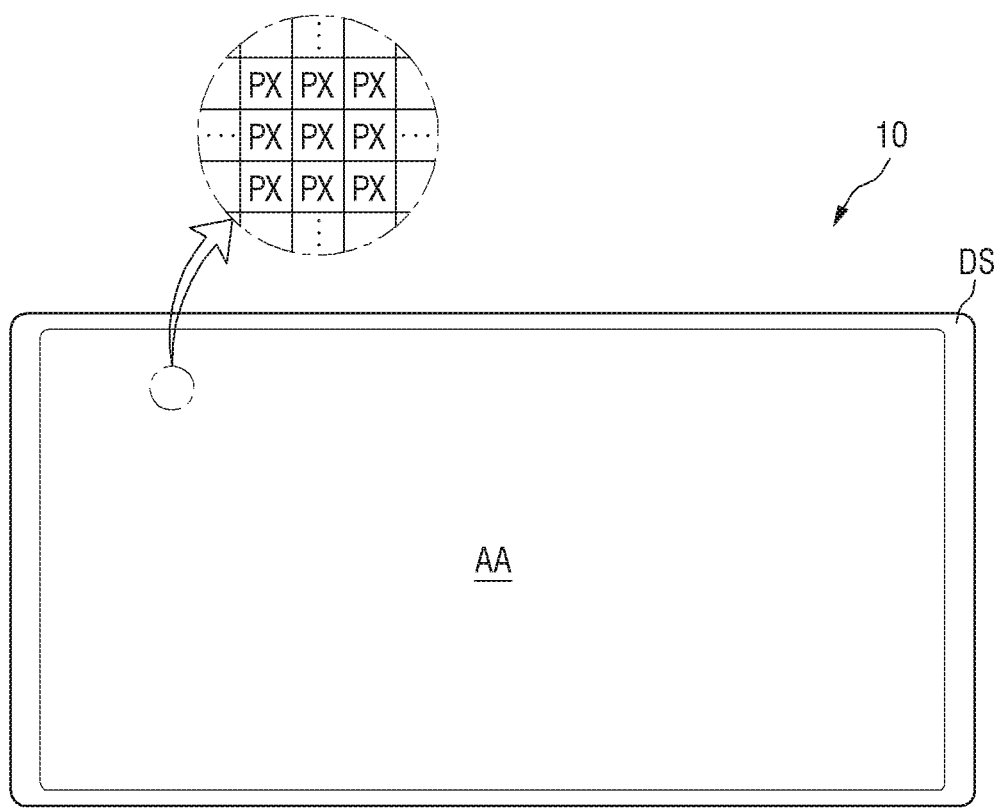
FIG. 3 is a plan view of a first display substrate according to one or more embodiments.

FIG. 3 is a plan view of a first display substrate according to one or more embodiments.

Referring to FIG. 3, the first display substrate 10 may include an active area AA and an inactive area DS. The active area AA is an area in which a screen (e.g., an image) may be displayed, and the inactive area DS is an area in which a screen (e.g., an image) is not displayed. The active area AA may also be referred to as an active area, and the inactive area DS may also be referred to as an inactive area. The active area AA may generally occupy a center of the first display substrate 10.

The first display substrate 10 may have shapes such as a rectangular shape of which lateral sides are long, a rectangular shape of which longitudinal sides are long, a square shape, a quadrangular shape of which corner portions (vertexes) are round, other polygonal shapes, a circular shape, and the like. A shape of the active area AA of the first display substrate 10 may also be similar to the overall shape of the first display substrate 10. In FIG. 3, the first display substrate 10 and the active area AA, which have the rectangular shape of which lateral sides are long, are illustrated. However, the present disclosure is not limited thereto, and the shape of the first display substrate 10 may be variously suitably modified.

The active area AA of the first display substrate 10 may include a plurality of pixels PX. The plurality of pixels PX may be arranged in a matrix form. A shape of each of the pixels PX may be a rectangular shape or a square shape in a plan view, but the present disclosure is not limited thereto, and the shape may be a rhombus shape of which each side is inclined with respect to one direction. The pixels PX may be alternately arranged with each other in a stripe formation or a PenTile® formation (PENTILE® is a registered trademark owned by Samsung Display Co., Ltd.). In addition, each of the pixels PX may include one or more light emitting elements 300 that emit light in a set or specific wavelength range, thereby displaying a set or specific color.

The inactive area DS may be provided around the active area AA. The inactive area DS may completely or partially surround the active area AA. The active area AA has a rectangular shape and the inactive area DS may be provided adjacent to four sides of the active area AA. The inactive area DS may form a bezel of the first display substrate 10. In the inactive area DS, wiring lines and/or circuit drivers included in the first display substrate 10 may be provided, and/or external devices may be mounted.

Figure 4:
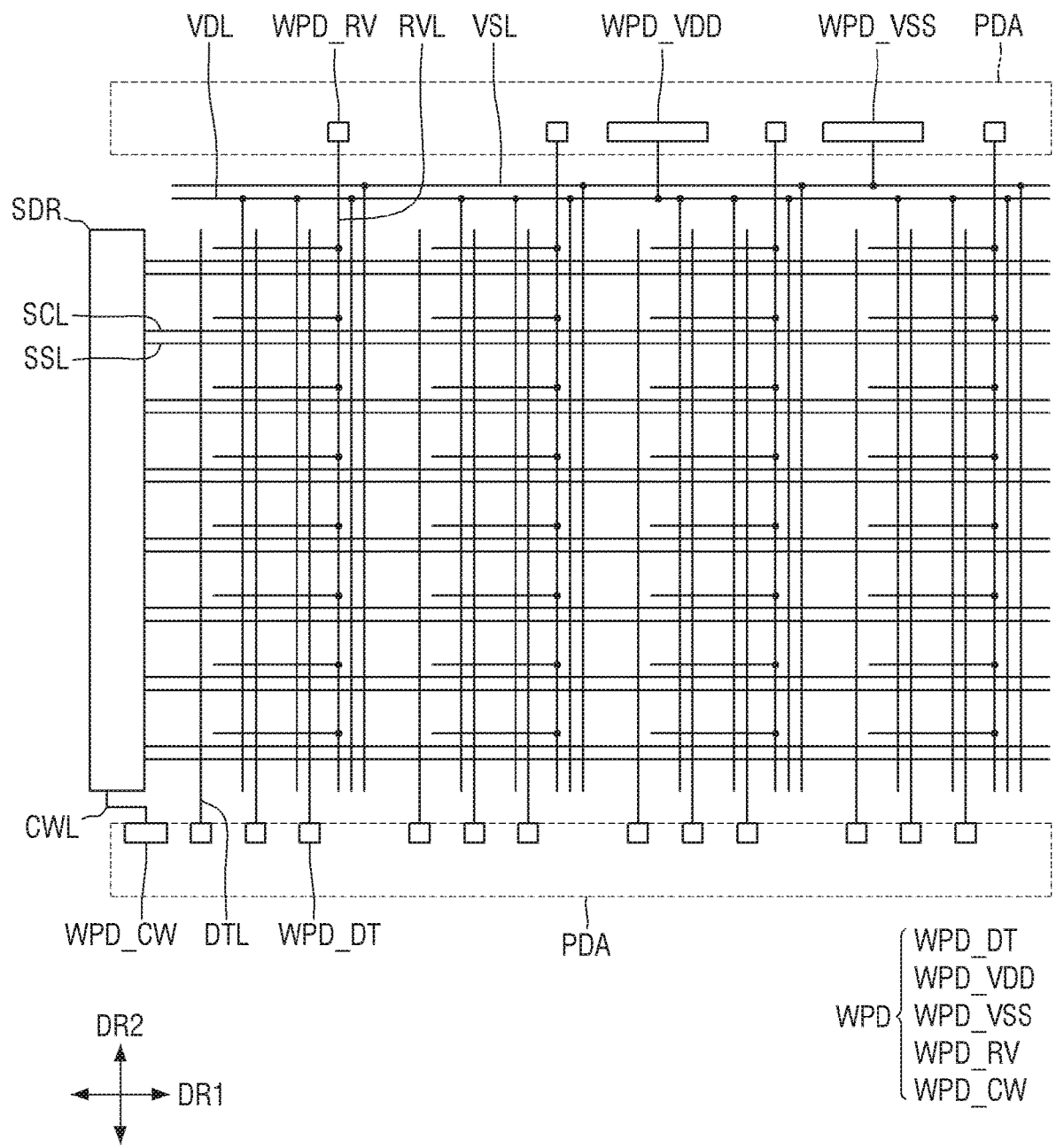
FIG. 4 is a schematic view illustrating wiring lines included in the first display substrate according to one or more embodiments.

FIG. 4 is a schematic view illustrating the wiring lines included in the first display substrate according to one or more embodiments.

Referring to FIG. 4, the first display substrate 10 may include a plurality of wiring lines. The plurality of wiring lines may include a scan line SCL, a sensing line SSL, a data line DTL, a reference voltage wiring line RVL, a first voltage wiring line VDL, a second voltage wiring line VSL, and the like. In addition, although not shown in the drawing, the first display substrate 10 may further include other wiring lines provided therein.

The scan line SCL and the sensing line SSL may extend in a first direction DR1. The scan line SCL and the sensing line SSL may be connected to a scan driver SDR. The scan driver SDR may include a driving circuit. The scan driver SDR may be provided at one side of the active area AA in the first direction DR1, but the present disclosure is not limited thereto. The scan driver SDR may be connected to a signal connection wiring line CWL, and at least one end portion of the signal connection wiring line CWL may form a pad WPD_CW in the inactive area DS to be connected to an external device.

In the specification, the term "connection" may mean that one member is connected to another member through physical contact as well as that one member is connected to another member through still another member. In addition, it may be understood that one member and another member may be integrated into (e.g., may be formed integrally as) one member and one portion of the integrated member may be connected to the other portion of the integrated member.

Furthermore, the connection between one member and another member may be interpreted as including an electrical connection through still another member in addition to a connection through physical contact.

The data line DTL and the reference voltage wiring line RVL may extend in a second direction DR2 crossing the first direction DR1. In addition, the reference voltage wiring line RVL may further include a portion branched in the first direction DR1 from a portion extending in the second direction DR2. Each of the first voltage wiring line VDL and the second voltage wiring line VSL may also include a portion extending in the first direction DR1 and a portion connected to the portion and extending in the second direction DR2. The first voltage wiring line VDL and the second voltage wiring line VSL may have a mesh structure, but the present disclosure is not limited thereto. In addition, although not shown in the drawing, each of the pixels PX of the first display substrate 10 may be connected to at least one data line DTL, reference voltage wiring line RVL, first voltage wiring line VDL, and second voltage wiring line VSL.

The data line DTL, the reference voltage wiring line RVL, the first voltage wiring line VDL, and the second voltage wiring line VSL may each be electrically connected to one or more wiring line pads WPD. Each wiring line pad WPD may be provided in the inactive area DS. In one embodiment, a wiring line pad WPD_DT (hereinafter, referred to as a "data pad") of the data line DTL may be provided in a pad area PDA located on one side of the active area AA in the second direction DR2, and a wiring line pad WPD_RV (hereinafter, referred to as a "reference voltage pad") of the reference voltage wiring line RVL, a wiring line pad WPD_VDD (hereinafter, referred to as a "first power pad") of the first voltage wiring line VDL, and a wiring line pad WPD_VSS (hereinafter, referred to as a "second power pad") of the second voltage wiring line VSL may be provided in a pad area PDA located on the other side of the active area AA in the second direction DR2. As another example, the data pad WPD_DT, the reference voltage pad WPD_RV, the first power pad WPD_VDD, and the second power pad WPD_VSS may all be provided in the same area, for example, the inactive area DS located on an upper side of the active area AA. An external device may be mounted on the wiring line pad VVPD. The external device may be mounted on the wiring line pad WPD through an anisotropic conductive film, ultrasonic bonding, or the like.

Each pixel PX of the first display substrate 10 includes a pixel driving circuit. The above-described wiring lines may apply a driving signal to each pixel driving circuit while passing through or around each pixel PX. The pixel driving circuit may include transistors and capacitors. The number of the transistors and capacitors of each pixel driving circuit may be variously suitably modified. Hereinafter, the pixel driving circuit will be described by taking an example in which the pixel driving circuit has a 3T1C structure, which includes 3 transistors and 1 capacitor, but the present disclosure is not limited thereto, and various other modified structures of the pixel PX, such as a 2T1C structure, a 7T1C structure, and a 6T1C structure may be applied.

Figure 5:
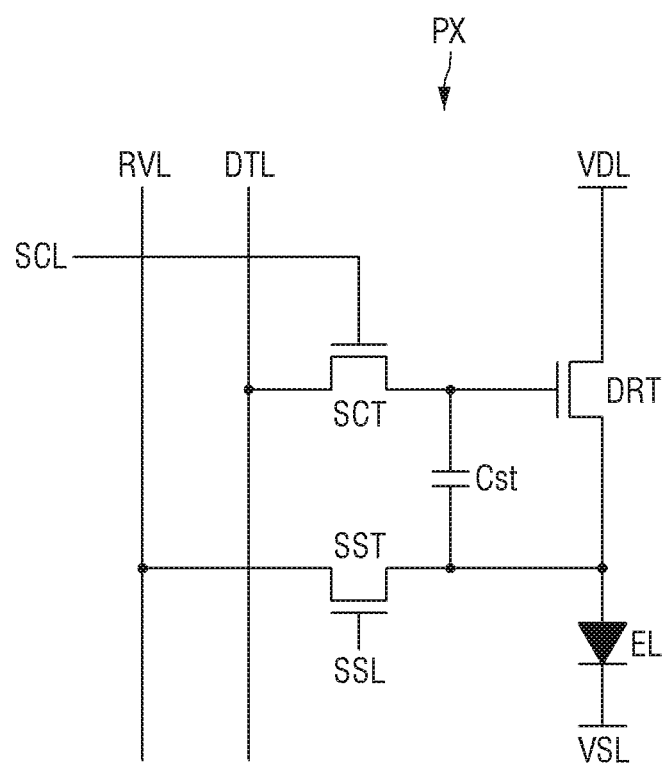
FIG. 5 is an equivalent circuit diagram of one sub-pixel according to one or more embodiments.

FIG. 5 is an equivalent circuit diagram of one sub-pixel according to one or more embodiments.

Referring to FIG. 5, each pixel PX or sub-pixel PXn of the display device according to the embodiments includes three transistors DRT, SCT, and SST and one storage capacitor Cst in addition to a light emitting diode EL.

The light emitting diode EL emits light according to a current supplied through a driving transistor DRT. The light emitting diode EL includes a first electrode, a second electrode, and a light emitting element 300 (see FIG. 11) provided therebetween. The light emitting element 300 may emit light of a set or specific wavelength range due to an electrical signal transmitted from the first electrode and the second electrode. A more detailed description thereof will be provided below.

One end of the light emitting diode EL may be connected to a first source/drain electrode of the driving transistor DRT, and the other end thereof may be connected to the second voltage wiring line VSL through which a low potential voltage (a second power voltage VSS) lower than a high potential voltage (a first power voltage VDD) of the first voltage wiring line VDL is supplied.

The driving transistor DRT adjusts a current flowing to the light emitting diode EL from the first voltage wiring line VDL, through which the first power voltage VDD is supplied, according to a voltage difference between a gate electrode and a source electrode thereof. The gate electrode of the driving transistor DRT may be connected to a first source/drain electrode of a scan transistor SCT, the first source/drain electrode of the driving transistor DRT may be connected to the first electrode of the light emitting diode EL, and a second source/drain electrode of the driving transistor DRT may be connected to the first voltage wiring line VDL through which the first power voltage VDD is applied.

The scan transistor SCT is turned on by a scan signal of the scan line SCL to connect the data line DTL to the gate electrode of the driving transistor DRT. A gate electrode of the scan transistor SCT may be connected to the scan line SCL, the first source/drain electrode of the scan transistor SCT may be connected to the gate electrode of the driving transistor DRT, and a second source/drain electrode of the scan transistor SCT may be connected to the data line DTL.

A sensing transistor SST is turned on by a sensing signal of the sensing line SSL to connect the reference voltage wiring line RVL to the first source/drain electrode of the driving transistor DRT. The sensing transistor SST may include a gate electrode connected to the sensing line SSL, a first source/drain electrode connected to the reference voltage wiring line RVL, and a second source/drain electrode connected to the first source/drain electrode of the driving transistor DRT.

In one embodiment, in each of the transistors DRT, SCT, and SST, the first source/drain electrode may be a source electrode, and the second source/drain electrode may be a drain electrode, but the present disclosure is not limited thereto, and the reverse of the above description may be possible.

The capacitor Cst is formed between the gate electrode and the first source/drain electrode of the driving transistor DRT. The storage capacitor Cst stores a differential voltage between a gate voltage and a first source/drain voltage of the driving transistor DRT.

Each of the transistors DRT, SCT, and SST may be formed as a thin-film transistor. In addition, in FIG. 5, each of the transistors DRT, SCT, and SST has been described as being formed as an n-type metal oxide semiconductor field-effect transistor (MOSFET), but the present disclosure is not limited thereto. For example, each of the transistors DRT, SCT, and SST may be formed as a p-type MOSFET, or some thereof may be formed as n-type MOSFETs, and others thereof may be formed as p-type MOSFETs.

Hereinafter, a structure of one pixel PX of the first display substrate 10 according to one or more embodiments will be described in more detail with further reference to other drawings.

Figure 6:
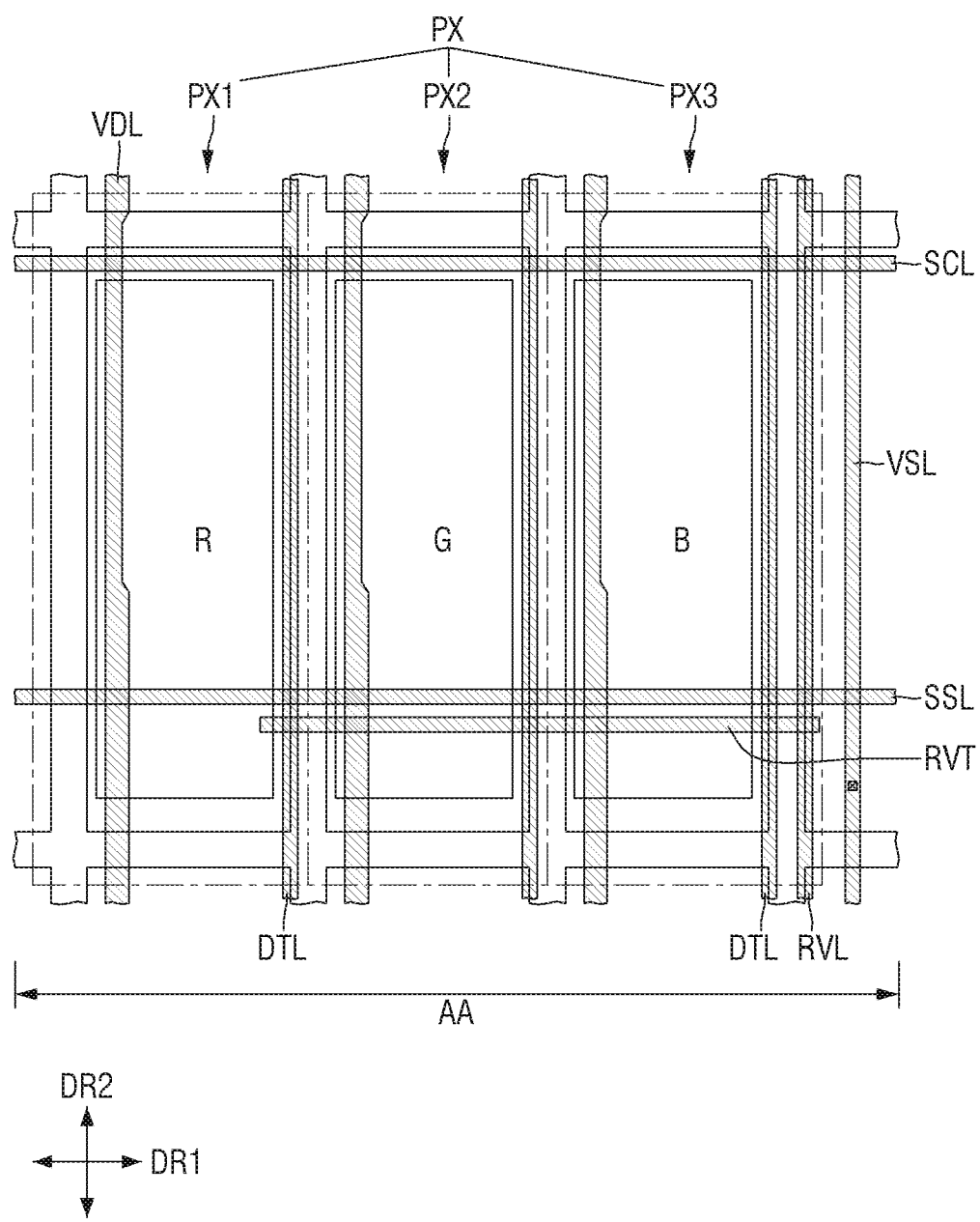
FIG. 6 is a schematic plan view illustrating one pixel of the display device according to one or more embodiments.
Figure 7:
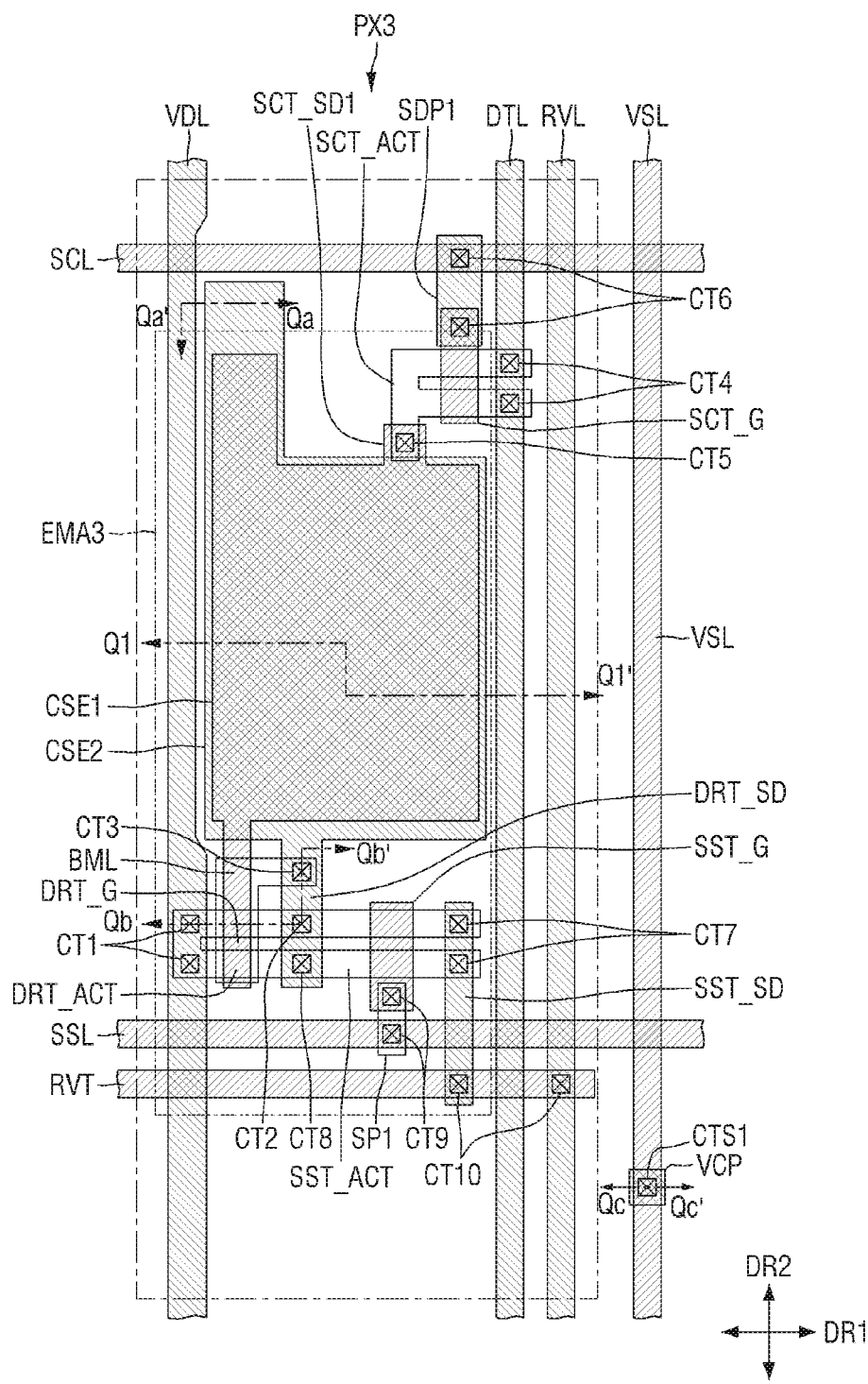
FIG. 7 is a schematic plan view of a circuit element layer included in one sub-pixel of the display device according to one or more embodiments.
Figure 8:
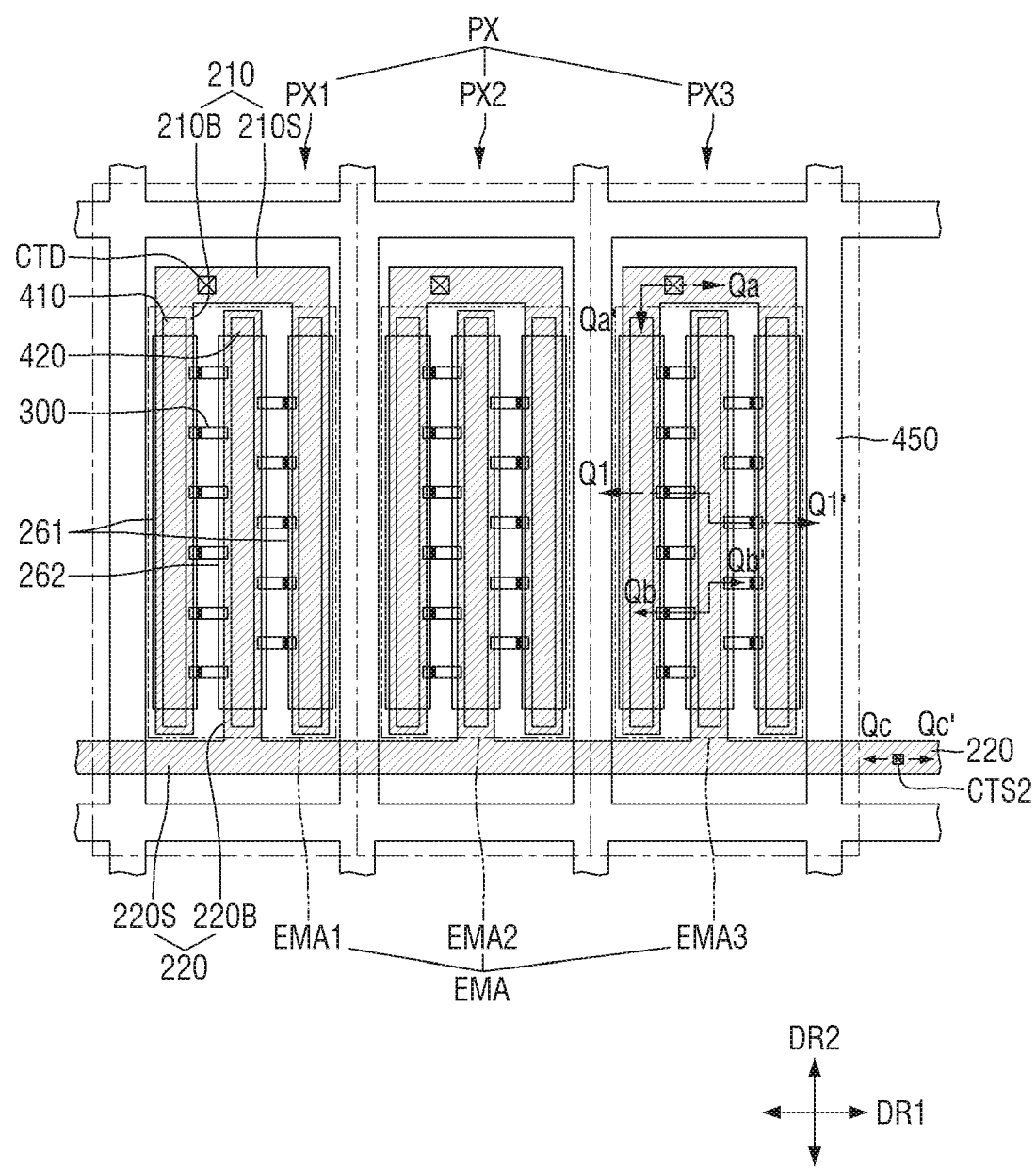
FIG. 8 is a schematic plan view of a display element layer included in one pixel of the display device according to one or more embodiments.
Figure 9:
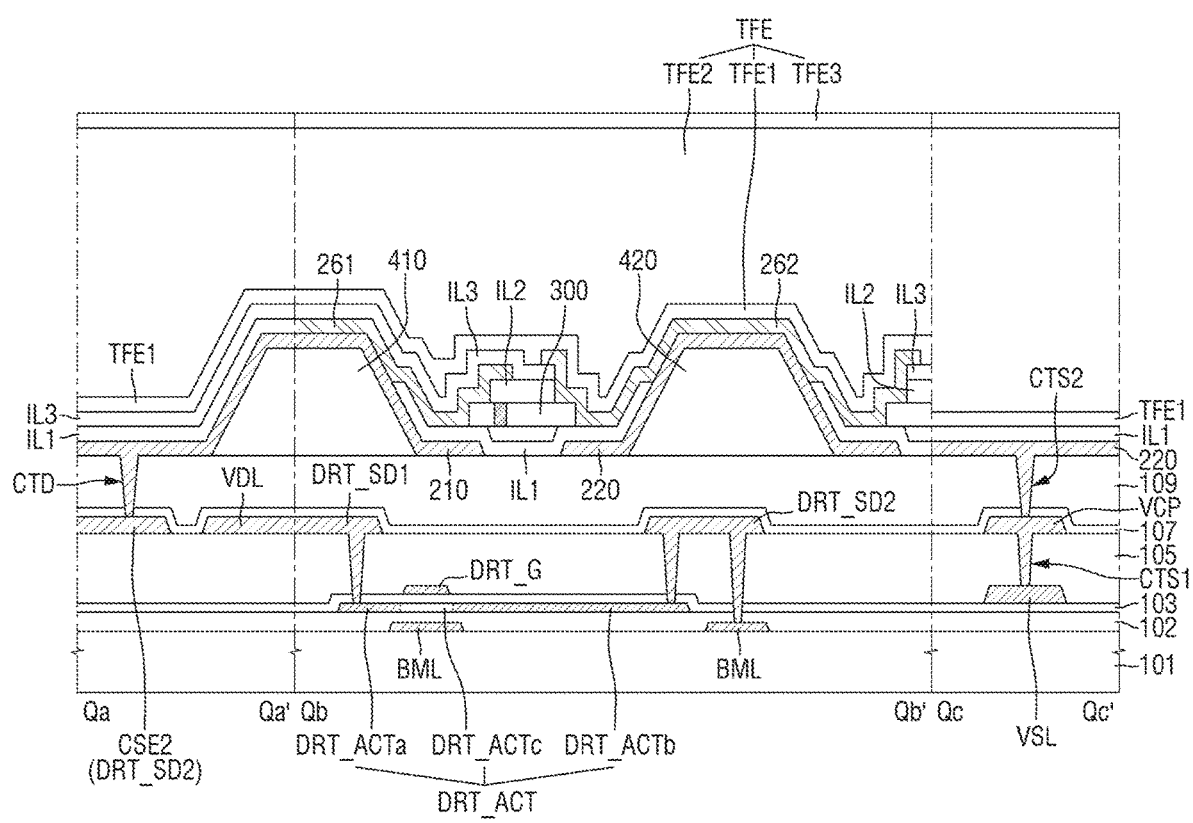
FIG. 9 is a cross-sectional view taken along lines Qa-Qa', Qb-Qb', and Qc-Qc' of FIGS. 7 and 8.
Figure 10:
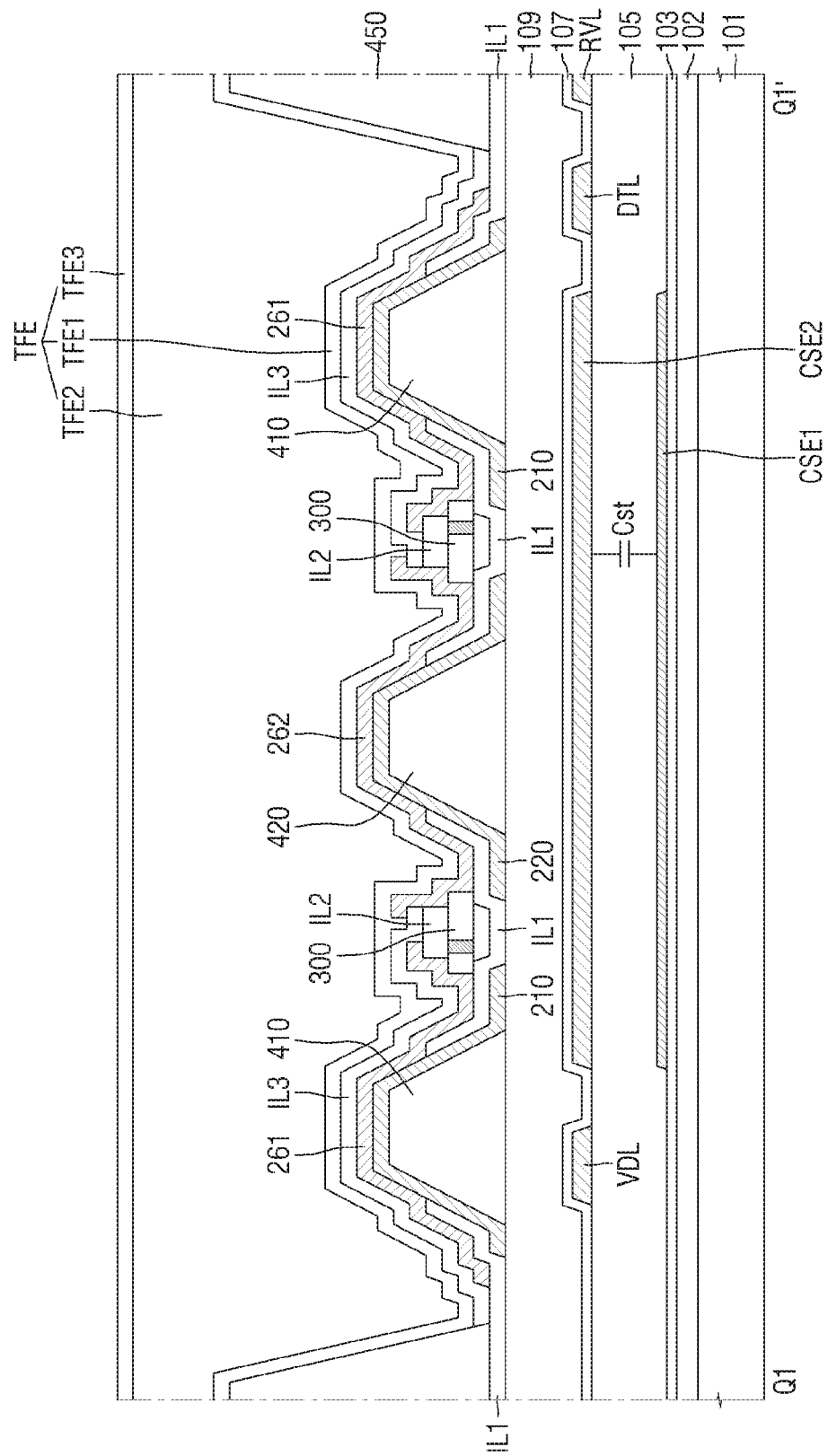
FIG. 10 is a cross-sectional view taken along line Q1-Q1' of FIGS. 7 and 8.

FIG. 6 is a schematic plan view illustrating one pixel of the display device according to one or more embodiments. FIG. 7 is a schematic plan view of a circuit element layer included in one sub-pixel of the display device according to one or more embodiments. FIG. 8 is a schematic plan view of a display element layer included in one pixel of the display device according to one or more embodiments. FIG. 9 is a cross-sectional view taken along lines Qa-Qa', Qb-Qb', and Qc-Qc' of FIGS. 7 and 8. FIG. 10 is a cross-sectional view taken along line Q1-Q1' of FIGS. 7 and 8.

In FIG. 6, circuit elements and display elements provided in each sub-pixel PXn are partially omitted in the illustrated areas marked as "R," "G," and "B" in FIG. 6, and FIG. 7 illustrates the circuit element layer of one sub-pixel (for example, a third sub-pixel PX3), and FIG. 8 illustrates the display element layer included in one pixel PX. FIGS. 9 and 10 illustrate partial cross-sections of the circuit element layer and the display element layer of the sub-pixel PXn. Hereinafter, both sides of the first direction DR1 of FIGS. 6 to 8 may be referred to as left and right sides, respectively, and both sides of the second direction DR2 thereof may be referred to as upper and lower sides, respectively.

Referring to FIGS. 6 to 10, each of the pixels PX may include a first sub-pixel PX1, a second sub-pixel PX2, and the third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red. However, the present disclosure is not limited thereto, and the sub-pixels PXn may emit light having the same color. In addition, in FIG. 6, the pixel PX is illustrated as including three sub-pixels PXn, but is not limited thereto, and may include a larger number of sub-pixels PXn.

Each of the sub-pixels PXn of the first display substrate 10 may include an area defined as a light emitting area EMA. The first sub-pixel PX1 may include a first light emitting area EMA1, the second sub-pixel PX2 may include a second light emitting area EMA2, and the third sub-pixel PX3 may include a third light emitting area EMA3. The light emitting area EMA may be defined as an area in which the light emitting element 300 included in the first display substrate 10 is provided to emit light in a set or specific wavelength range. The light emitted from a light emitting layer 330 of the light emitting element 300 may be emitted to both end surfaces and side surfaces of the light emitting element 300. The light emitting area EMA may include an area in which the light emitting element 300 is provided, and may include an area which is adjacent to the light emitting element 300 and through which the light emitted from the light emitting element 300 is emitted.

The present disclosure is not limited thereto; and the light emitting area EMA may also include an area in which the light emitted from the light emitting element 300 is reflected and/or refracted due to another member and emitted. A plurality of light emitting elements 300 may be provided in each sub-pixel PXn, and the area in which the light emitting elements 300 are provided and an area adjacent to the area may form the light emitting area EMA.

Although not shown in the drawing, each of the sub-pixels PXn of the first display substrate 10 may include a non-light emitting area that is defined as an area except for the light emitting area EMA. The non-light emitting area may be an area in which the light emitting elements 300 are not provided and the light emitted from the light emitting elements 300 does not reach, so that light is not emitted.

In the first display substrate according to one embodiment, each pixel PX or sub-pixel PXn may include the circuit element layer and the display element layer. The display element layer may be a layer in which a first electrode 210 and a second electrode 220, including the light emitting elements 300, are provided, and the circuit element layer may be a layer in which a plurality of wiring lines, including pixel circuit elements for driving the light emitting element 300, are provided. For example, the circuit element layer may include the scan line SCL, the sensing line SSL, the data line DTL, the reference voltage wiring line RVL, the first voltage wiring line VDL, the second voltage wiring line VSL, and the like, in addition to the driving transistor DRT, the scan transistor SCT, the sensing transistor SST, and the storage capacitor Cst.

For example, the first display substrate 10 may include a first substrate 101, and the circuit element layer and the display element layer may be provided on the first substrate 101. The first substrate 101 may be made of an insulating material such as glass, quartz, a polymer resin, and/or the like. In addition, the first substrate 101 may be a rigid substrate but may also be a flexible substrate that s bendable, foldable, rollable, and/or the like.

A light blocking layer BML may be provided on the first substrate 101. The light blocking layer BML may be provided to overlap a portion of a first active layer DRT_ACT of the driving transistor DRT, which will be described in more detail herein below. The light blocking layer BML may include a material that blocks or reduces light, thereby preventing or reducing light from being incident on the first active layer DRT_ACT. As an example, the light blocking layer BML may be made of an opaque metal material that blocks or reduces light from being transmitted. However, the present disclosure is not limited thereto, and in some cases, the light blocking layer BML may be omitted or may be provided in a larger number to overlap active layers of other transistors.

A buffer layer 102 is provided on the first substrate 101, including the light blocking layer BML. The buffer layer 102 may be entirely provided on the first substrate 101. The buffer layer 102 may be formed on the first substrate 101 to protect the transistors of the pixel PX from moisture permeating through the first substrate 101 that is vulnerable to moisture permeation, and may perform a surface planarization function. The buffer layer 102 may be formed as a plurality of inorganic layers that are alternately stacked. For example, the buffer layer 102 may be formed of multiple layers in which one or more inorganic layers of a silicon oxide (SiOx) layer, a silicon nitride (SiNx) layer, or a silicon oxynitride (SiON) layer are alternately stacked.

A semiconductor layer is provided on the buffer layer 102. The semiconductor layer may form an active layer of each of the transistors. The semiconductor layer may include the first active layer DRT_ACT of the driving transistor DRT, a second active layer SCT_ACT of the scan transistor SCT, and a third active layer SST_ACT of the sensing transistor SST. Each of the active layers may be provided to partially overlap gate electrodes of a first gate conductive layer, which will be described in more detail herein below. In the drawing(s), the first active layer DRT_ACT and the third active layer SST_ACT may be provided on a lower side with respect to a center of each sub-pixel PXn, and the second active layer SCT_ACT may be provided on an upper side with respect to the center of each sub-pixel PXn. In addition, the first active layer DRT_ACT and the third active layer SST_ACT may be integrally formed as one semiconductor layer, and the driving transistor DRT and the sensing transistor SST may be electrically connected to each other.

Further, the semiconductor layer may further include a first semiconductor pattern SP1. The first semiconductor pattern SP1 may be connected to the gate electrode of the sensing transistor SST and the sensing line SSL, which will be described in more detail herein below.

In one or more embodiments, the semiconductor layer may include polycrystalline silicon, single-crystalline silicon, an oxide semiconductor; and the like. When the semiconductor layer includes polycrystalline silicon, each of the active layers may include a doped area and a channel area. For example, the first active layer DRT_ACT may include a first doped area DRT_ACTa, a second doped area DRT_ACTb, and a first channel area DRT_ACTc. Each doped area may be an area doped with impurities, and the channel area may be provided between the doped areas. The polycrystalline silicon may be formed by crystallizing amorphous silicon. Examples of the crystallization method may include a rapid thermal annealing (RTA) method, a solid phase crystallization (SPC) method, an excimer laser annealing (ELA) method, a metal induced lateral crystallization (MILL) method, and a sequential lateral solidification (SLS) method, and the like, but the present disclosure is not limited thereto. As another example, the semiconductor layer may include single-crystalline silicon, low temperature polycrystalline silicon, amorphous silicon, and/or the like.

However, the semiconductor layer is not necessarily limited to the above description. In one or more embodiments, the semiconductor layer may include an oxide semiconductor. In this case, each doped area may be a conductor area. In one or more embodiments, when the semiconductor layer includes an oxide semiconductor, the oxide semiconductor may be an oxide semiconductor containing indium (In). In some embodiments, the oxide semiconductor may include indium-tin oxide (ITO), indium-zinc oxide (IZO), indium-gallium oxide (IGO), indium-zinc-tin oxide (IZTO), indium-gallium-tin oxide (IGTO), indium-gallium-zinc-tin oxide (IGZTO), and/or the like. However, the present disclosure is not limited thereto.

A first gate insulating layer 103 is provided on the semiconductor layer and the buffer layer 102. The first gate insulating layer 103 may serve as a gate insulating film of each of the transistors. The first gate insulating layer 103 may be formed as an inorganic layer including an inorganic material such as silicon oxide (SiOx), silicon nitride (SiNx), and silicon oxynitride (SON), or in a stacked structure thereof.

The first gate conductive layer is provided on the first gate insulating layer 103. The first gate conductive layer may include gate electrodes of each of the transistors, the scan line SCL, the sensing line SSL, the second voltage wiring line VSL, a reference voltage distribution line RVT, and a first capacitor electrode CSE1 of the storage capacitor Cst.

The gate electrodes of each of the transistors may be provided to partially overlap the respective active layers. For example, a first gate electrode DRT_G of the driving transistor DRT may overlap a portion of the first active layer DRT_ACT, and a second gate electrode SCT_G of the scan transistor SCT may overlap a portion of the second active layer SCT_ACT, and a third gate electrode SST_G of the sensing transistor SST may overlap a portion of the third active layer SST_ACT. The first gate electrode DRT_G may be connected to the first capacitor electrode CSE1 to form a single pattern. The second gate electrode SCT_G may be electrically connected to the scan line SCL, and the third gate electrode SST_G may be electrically connected to the sensing line SSL through the first semiconductor pattern SP1.

The scan line SCL may extend in the first direction DR1 and may be provided beyond a boundary of the adjacent sub-pixels PXn. The scan line SCL may be provided on the upper side with respect to the center of the sub-pixel PXn. The scan line SCL may be electrically connected to the second gate electrode SCT_G through a conductive pattern of a first data conductive layer to be described in more detail herein below, and may transmit a scan signal to the scan transistor SCT.

The sensing line SSL may extend in the first direction DR1 and may be provided beyond a boundary of the adjacent sub-pixels PXn. The sensing line SSL may be provided on the lower side with respect to the center of the sub-pixel PXn in the second direction DR2. The sensing line SSL may be electrically connected to the third gate electrode SST_G through the first semiconductor pattern SP1 and may transmit a sensing signal to the sensing transistor SST.

The reference voltage distribution line RVT may be provided on a lower side of the sensing line SSL and may extend in the first direction DR1. The reference voltage distribution line RVT may be provided to extend from the first sub-pixel PX1 to the third sub-pixel PX3, and each pixel PX, that is, for example, three sub-pixels PXn, may share one reference voltage distribution line RVT. The reference voltage distribution line RVT may be electrically connected to the reference voltage wiring line RVL and the first source/drain electrode of the sensing transistor SST of each sub-pixel PXn, which will be described in more detail herein below. The reference voltage distribution line RVT may transmit a reference voltage applied from the reference voltage wiring line RVL to the sensing transistor SST.

The second voltage wiring line VSL may extend in the second direction DR2 and may be provided beyond a boundary of the sub-pixels PXn adjacent in the second direction DR2. One second voltage wiring line VSL may be provided in each one pixel PX, that is, for example, for every three sub-pixels PXn. For example, the second voltage wiring line VSL may be provided on a right side of the third sub-pixel PX3 to extend in the second direction DR2, and may not be provided in the first sub-pixel PX1 or the second sub-pixel PX2. As described above, the second voltage wiring line VSL may be electrically connected to the wiring line pads WPD so that the second power voltage VSS may be connected to the second voltage wiring line VSL. The second voltage wiring line VSL may be electrically connected to the second electrode 220, which will be described in more detail herein below, so that the second power voltage VSS may be applied to the light emitting element 300.

However, the present disclosure is not limited thereto. In some embodiments, the second voltage wiring line VSL may further include a portion extending in the first direction DR1. The second electrode 220 of each sub-pixel PXn may be electrically connected to the portion of the second voltage wiring line VSL extending in the first direction DR1. In addition, the second voltage wiring line VSL is not necessarily provided in the first gate conductive layer and may be provided in the first data conductive layer, which will be described in more detail herein below.

The first capacitor electrode CSE1 of the storage capacitor Cst is provided between the scan line SCL and the sensing line SSL. The first capacitor electrode CSE1 of the storage capacitor Cst may be electrically connected to the first gate electrode DRT_G and a first source/drain electrode SCT_SD1 of the scan transistor SCT. In addition, as will be described in more detail herein below, the first capacitor electrode CSE1 may be located between the first voltage wiring line VIAL and the data line DTL in a plan view.

The first source/drain electrode SCT_SD1 of the scan transistor SCT may be in contact with the second active layer SCT_ACT through a fifth contact hole CT5 in an area overlapping one side of the second active layer SCT_ACT. The scan transistor SCT may be connected to the first capacitor electrode CSE1 of the storage capacitor Cst. For example, the first source/drain electrode SCT_SD1 of the scan transistor SCT may be integrated with the first capacitor electrode CSE1 of the storage capacitor Cst.

The first gate conductive layer may be formed as a single layer or a multi-layer that is made of one of molybdenum (Mo), aluminum (Al), chromium (Cr), gold (Au), titanium (Ti), nickel (Ni), neodymium (Nd), copper (Cu), or an ahoy thereof. However, the present disclosure is not limited thereto.

A first interlayer insulating layer 105 is provided on the first gate conductive layer. The first interlayer insulating layer 105 may serve as an insulating film between the first gate conductive layer and other layers provided thereon. The first interlayer insulating layer 105 may be formed as an inorganic layer including an inorganic material such as silicon oxide (SiOx), silicon nitride (SiNx), and silicon oxynitride (SiON), or in a stacked structure thereof.

Meanwhile, although not shown in the drawing, more insulating layers and conductive layers may be provided on the first gate conductive layer and the first interlayer insulating layer 105. At least a portion of the conductive layer may be provided to overlap the first gate conductive layer with the insulating layer therebetween.

The first data conductive layer is provided on the first interlayer insulating layer 105. The first data conductive layer may include the data line DTL, the first voltage wiring line VDL, the reference voltage wiring line RVL, the source/drain electrodes of each of the transistors, a plurality of conductive patterns SDP1 and VCP, and a second capacitor electrode CSE2 of the storage capacitor Cst.

The data line DTL may extend in the second direction DR2 and may be provided beyond a boundary of the adjacent sub-pixels PXn. The data line DTL may be provided on a right side with respect to the center of the sub-pixel PXn. The data line DTL may be in contact with one side of the second active layer SCT_ACT through a fourth contact hole CT4. A portion of the data line DTL may be the second source/drain electrode of the scan transistor SCT, and a data signal applied to the data line DTL may be transmitted to the scan transistor SCT.

The first voltage wiring line VDL may extend in the second direction DR2 and may be provided beyond a boundary of the adjacent sub-pixels PXn. The first voltage wiring line VDL may be provided on a left side with respect to the center of the sub-pixel PXn. The first voltage wiring line VDL may be in contact with one side of the first active layer DRT_ACT through a first contact hole CT1. For example, a portion of the first voltage wiring line VDL may be connected to a first source/drain electrode DRT_SD1 (see FIG. 9) of the driving transistor DRT, and the first power voltage VDD applied to the first voltage wiring line VDL may be transmitted to the driving transistor DRT.

The first voltage wiring line VDL and the data line DTL may be provided in each sub-pixel PXn. The first voltage wiring line VDL and the data line DTL may be provided on the left and right sides with respect to the center of each sub-pixel PXn, respectively, and may be provided to extend in the second direction DR2.

The reference voltage wiring line RVL may extend in the second direction DR2 and may be provided beyond a boundary of the sub-pixels PXn adjacent in the second direction DR2. One reference voltage wiring line RVL may be provided in each one pixel PX, that is, for example, for every three sub-pixels PXn. For example, the reference voltage wiring line RVL may be provided on a left side of the data line DTL in the third sub-pixel PX3 and may not be provided in the first sub-pixel PX1 or the second sub-pixel PX2. The reference voltage wiring line RVL may be electrically connected to the reference voltage distribution line RVT described above. The reference voltage wiring line RVL may be electrically connected to the reference voltage distribution line RVT through a tenth contact hole CT10. A reference voltage applied through the reference voltage wiring line RVL may be transmitted to the sensing transistor SST of each sub-pixel PXn through the reference voltage distribution line RVT.

The second capacitor electrode CSE2 of the storage capacitor Cst is provided between the first voltage wiring line VDL and the data line DTL. The second capacitor electrode CSE2 of the storage capacitor Cst may be provided to overlap the first capacitor electrode CSE1, and a storage capacitor (see "Cst" in FIG. 10) may be formed therebetween. For example, in one or more embodiments, each of the first capacitor electrode CSE1 and the second capacitor electrode CSE2 may be located between the first voltage wiring line VDL and the data line DTL in a plan view. The second capacitor electrode CSE2 of the storage capacitor Cst may be connected to the second source/drain electrode DRT_SD (or "DRT_SD2" in FIG. 9) of the driving transistor DRT. For example, the second capacitor electrode CSE2 of the storage capacitor Cst may be integrated with the second source/drain electrode DRT_SD2 of the driving transistor DRT. The second source/drain electrode DRT_SD2 of the driving transistor DRT may be in contact with a portion of the first active layer DRT_ACT through a second contact hole CT2 and may be in contact with a portion of the light blocking layer BML through a third contact hole CT3. In addition, the second source/drain electrode DRT_SD2 of the driving transistor DRT may also be in contact with one side of the third active layer SST_ACT through an eighth contact hole CT8, and the one side may constitute the source/drain electrode of the sensing transistor SST.

A first source/drain electrode SST_SD of the sensing transistor SST may be in contact with the other side of the third active layer SST_ACT and the reference voltage distribution line RVT. The first source/drain electrode SST_SD of the sensing transistor SST may be in contact with the third active layer SST_ACT through a seventh contact hole CT7 and may be in contact with the reference voltage distribution line RVT through the tenth contact hole CT10.

A first conductive pattern SDP1 and a second conductive pattern VCP of the first data conductive layer may be connected to a portion of the first gate conductive layer. The first conductive pattern SDP1 may be connected to the scan line SCL and the second gate electrode SCT_G, and the scan signal applied from the scan line SCL may be transmitted to the scan transistor SCT. The first conductive pattern SDP1 may be in contact with the scan line SCL and the second gate electrode SCT_G of the scan transistor SCT through a sixth contact hole CT6 passing through the first interlayer insulating layer 105. The second gate electrode SCT_G may be electrically connected to the scan line SCL through the first conductive pattern SDP1, and the scan signal may be transmitted to the scan transistor SCT.

The second conductive pattern VCP may be provided to overlap the second voltage wiring line VSL. The second conductive pattern VCP may be in contact with the second voltage wiring line VSL through a first wiring line contact hole CTS1 passing through the first interlayer insulating layer 105. In addition, the second conductive pattern VCP may be in contact with the second electrode 220 through a second wiring line contact hole CTS2, which will be described in more detail herein below. The second electrode 220 may be electrically connected to the second voltage wiring line VSL through the second conductive pattern VCP.

The first data conductive layer may be formed as a single layer or a multi-layer that is made of one of molybdenum (Mo), aluminum (Al), chromium (Cr), gold (Au), titanium (Ti), nickel (Ni), neodymium (Nd), copper (Cu), or an alloy thereof. However, the present disclosure is not limited thereto.

A first protective layer 107 is provided on the first data conductive layer. The first protective layer 107 may be provided to cover the first data conductive layer and may perform a function of protecting the first data conductive layer. The first protective layer 107 may be formed as an inorganic layer including an inorganic material such as silicon oxide (SiOx), silicon nitride (SiNx), and silicon oxynitride (SiON), or in a stacked structure thereof.

A first planarization layer 109 is provided on the first protective layer 107. The first planarization layer 109 may include an organic insulating material, for example, an organic material such as polyimide (PI), and may perform a surface planarization function. However, the present disclosure is not limited thereto. A larger number of conductive layers may be provided between the first planarization layer 109 and the first protective layer 107.

The display element layer, which includes internal banks 410 and 420, a plurality of electrodes 210 and 220, an external bank 450, a plurality of contact electrodes 261 and 262, and the light emitting element 300, is provided on the first planarization layer 109. In addition, a plurality of insulating layers IL1, IL2, and IL3 may be further provided on the first planarization layer 109.

The internal banks 410 and 420 are provided directly on the first planarization layer 109. The internal banks 410 and 420 may include a first internal bank 410 and a second internal bank 420 adjacent to a center portion of each pixel PX or sub-pixel PXn.

The first internal bank 410 and the second internal bank 420 may be provided to be spaced apart from each other and face each other in the first direction DR1. In addition, the first internal bank 410 and the second internal bank 420 may extend in the second direction DR2, and may be separated and terminated at a boundary between the sub-pixels PXn so as not to extend to another sub-pixel PXn adjacent in the second direction DR2. The first internal bank 410 and the second internal bank 420 may be provided in each sub-pixel PXn to form a pattern on the entire surface of the active area AA. By positioning the internal banks 410 and 420 to be spaced apart from each other and face each other, an area in which the light emitting element 300 is provided may be formed therebetween. In the drawing, it is illustrated that two first internal banks 410 and one second internal bank 420 therebetween are provided, but the present disclosure is not limited thereto. In some cases, a larger number of internal banks 410 and 420 may be further provided according to the number of the electrodes 210 and 220.

According to one or more embodiments, the first internal bank 410 and the second internal bank 420 may be located between the first voltage wiring line VDL and the data line DTL in a plan view. As will be described in more detail herein below, the external bank 450 may be provided at a boundary of each of the sub-pixels PXn, and the first voltage wiring line VDL and the data line DTL may be provided in each sub-pixel PXn, and may partially overlap the external bank 450 in a thickness direction. The first internal bank 410 and the second internal bank 420 may each be provided to be spaced apart from the external bank 450, and may be located between the first voltage wiring line VDL and the data line DTL. For example, the first voltage wiring line VDL may extend in the second direction DR2 between the second internal bank 420 and the external bank 450, which is adjacent to the second internal bank 420, in a plan view, and in some cases, may overlap the first internal bank 410 in the thickness direction. The data line DTL may extend in the second direction DR2 between the first internal bank 410 and the external bank 450, which is adjacent to the first internal bank 410, in a plan view, and in some cases, may overlap the second internal bank 420 in the thickness direction. As used herein, the term "thickness direction" may refer to a vertical direction in a cross section, or a direction in which a plurality of layers overlap. Members that overlap in the thickness direction may indicate that at least portions of the members are provided to overlap each other in a plan view. For example, the first voltage wiring line VDL and the data line DTL may be provided to partially overlap the first internal bank 410 and the second internal bank 420, respectively, in a plan view, but the present disclosure is not limited thereto.

Further, in some embodiments, at least a portion of the first internal bank 410 may overlap the first voltage wiring line VDL in the thickness direction, and the second internal bank 420 may not overlap the data line DTL in the thickness direction. On the other hand, the data line DTL may overlap a portion of the external bank 450, which extends in the second direction DR2, in the thickness direction; and the first voltage wiring line VSL may not overlap the portion of the external bank 450, which extends in the second direction DR2, in the thickness direction. However, the present disclosure is not limited thereto.

Each of the first internal bank 410 and the second internal bank 420 may have a set or predetermined width and may have a structure in which at least a portion thereof protrudes with respect to an upper surface of the first planarization layer 109. Each of the first internal bank 410 and the second internal bank 420 may have the same width, the protruding portion thereof may have inclined side surfaces, and light emitted from the light emitting element 300 provided between the first internal bank 410 and the second internal bank 420 may travel toward the inclined side surfaces of the internal banks 410 and 420. As will be described in more detail herein below, the electrodes 210 and 220 respectively provided on the internal banks 410 and 420 may include a material having a high reflectance, and the light emitted from the light emitting element 300 may be reflected from the electrodes 210 and 220 provided on the side surfaces of the internal banks 410 and 420 to be emitted in an upward direction with respect to the first substrate 101. For example, the internal banks 410 and 420 may provide an area in which the light emitting element 300 is provided and simultaneously (or concurrently) may serve as a reflective partition wall that reflects the light emitted from the light emitting element 300 upward. In one or more embodiments, the internal banks 410 and 420 may include an organic insulating material such as polyimide (PI), but the present disclosure is not limited thereto.

The plurality of electrodes 210 and 220 are provided on the internal banks 410 and 420 and the first planarization layer 109. The plurality of electrodes 210 and 220 may include the first electrode 210 provided on the first internal bank 410 and the second electrode 220 provided on the second internal bank 420.

The first electrode 210 and the second electrode 220 may respectively include electrode stem portions 210S and 220S extending in the first direction DR1 and one or more electrode branch portions 210B and 220B respectively branched from the electrode stem portions 210S and 220S in the second direction DR2.

For example, the first electrode 210 may include a first electrode stem portion 210S provided to extend in the first direction DR1 and one or more first electrode branch portions 210B branched from the first electrode stem portion 210S to extend in the second direction DR2. Both ends of the first electrode stem portion 210S of any one sub-pixel PXn may be spaced apart from each other between the sub-pixels PXn and terminated, and placed on the substantially same straight line with the first electrode stem portion 210S of an adjacent sub-pixel PXn in the same row (e.g., which is adjacent in the first direction DR1). Because both ends of each of the first electrode stem portions 210S provided in each sub-pixel PXn are spaced apart from each other, an electrical signal may be independently transmitted to each of the first electrode branch portions 2108.

The first electrode branch portion 210B is branched from at least a portion of the first electrode stem portion 210S and provided to extend in the second direction DR2. The first electrode branch portion 210B may be terminated in a state of being spaced apart from a second electrode stem portion 220S provided to face the first electrode stem portion 210S.

The first electrode 210 may be electrically connected to the driving transistor DRT. For example, the first electrode 210 may be in contact with the second source/drain electrode DRT_SD2 through an electrode contact hole CTD that is formed at a portion overlapping the first electrode stem portion 210S and passes through the first planarization layer 109 to expose a portion of an upper surface of the second source/drain electrode DRT_SD2 of the driving transistor DRT. However, the present disclosure is not limited thereto. In some embodiments, a larger number of conductive layers may be provided between the first planarization layer 109 and the first data conductive layer, and the first electrode 210 may be electrically connected to the driving transistor DRT through the conductive layer.

The second electrode 220 may include the second electrode stem portion 220S provided to extend in the first direction DR1 and one or more second electrode branch portions 220B branched from the second electrode stem portion 220S to extend in the second direction DR2. The second electrode stem portion 220S may be provided to be spaced apart from and face the first electrode stem portion 210S in the second direction DR2, and the second electrode branch portion 2208 may be provided to be spaced apart from and face the one or more first electrode branch portions 210B in the first direction DR1. As an example, the second electrode branch portion 220B may be provided between two first electrode branch portions 210B, and both sides of the second electrode branch portion 220B may be spaced apart from and face the first electrode branch portions 210B, respectively.

Unlike the first electrode stem portion 210S, the second electrode stem portion 220S may be provided to extend in the first direction DR1 to cross each of the sub-pixels PXn. The second electrode branch portion 220B may be branched from the second electrode stem portion 220S in the second direction DR2, and terminated in a state of being spaced apart from the first electrode stem portion 210S. The plurality of light emitting elements 300 may be provided between the second electrode branch portion 220B and the first electrode branch portion 210B.

The second electrode 220 may be electrically connected to the second voltage wiring line VSL. For example, the second electrode 220 may be in contact with the second conductive pattern VCP through the second wiring line contact hole CTS2 that is formed between the third sub-pixel PX3 and the sub-pixel PXn adjacent in the first direction DR1 and passes through the first planarization layer 109 to expose a portion of an upper surface of the second conductive pattern VCP. The second electrode 220 may be electrically connected to the second voltage wiring line VSL through the second conductive pattern VCP. However, the present disclosure is not limited thereto. When the second voltage wiring line VSL is provided in the first data conductive layer, the second conductive pattern VCP may be omitted and the second electrode 220 may be in direct contact with the second voltage wiring line VSL.

In the drawing(s), it is illustrated that two first electrode branch portions 210B and one second electrode branch portion 220B are provided in one sub-pixel PXn, and the first electrode 210 is provided in a shape surrounding an outer surface of the second electrode branch portion 220B. However, the present disclosure is not limited thereto. A larger or smaller number of electrode branch portions 210B and 220B may be provided in each sub-pixel PXn. In this case, the first electrode branch portions 210B and the second electrode branch portions 220B may be alternately provided to be spaced apart from each other.

Each of the first electrode 210 and the second electrode 220 may not necessarily have a shape extending in one direction; and may have various suitable shapes. For example, the first electrode 210 and the second electrode 220 may each have a partially curved or bent shape; and one electrode of the first electrode 210 and the second electrode 220 may also be provided to surround the other electrode thereof. As long as at least a partial area of the first electrode 210 and at least a partial area of the second electrode 220 are spaced apart from each other and face each other to form an area in which the light emitting element 300 is to be provided therebetween, the arrangement structures and shapes of the first electrode 210 and the second electrode 220 are not particularly limited.

The plurality of electrodes 210 and 220 may be electrically connected to the light emitting elements 300 and may receive a set or predetermined voltage to allow the light emitting element 300 to emit light. For example; the plurality of electrodes 210 and 220 may be electrically connected to the light emitting element 300 through the contact electrodes 261 and 262, which will be described in more detail herein below, and may transmit an electrical signal applied to the electrodes 210 and 220 to the light emitting element 300 through the contact electrodes 261 and 262.

In one or more embodiments, the first electrode 210 may be a pixel electrode separated for each sub-pixel PXn, and the second electrode 220 may be a common electrode connected in common along one or more sub-pixels PXn. One of the first electrode 210 and the second electrode 220 may be an anode of the light emitting element 300, and the other one thereof may be a cathode of the light emitting element 300. However, the present disclosure is not limited thereto and the reverse of the above description may be possible.

Further, each of the electrodes 210 and 220 may be utilized to form an electric field in the sub-pixel PXn, thereby aligning the light emitting element 300. The light emitting element 300 may be provided between the first electrode 210 and the second electrode 220 through a process of forming an electric field between the first electrode 210 and the second electrode 220 by applying an alignment signal to the first electrode 210 and the second electrode 220. The light emitting elements 300 may be sprayed onto the first electrode 210 and the second electrode 220 in a state of being dispersed in an ink through an inkjet printing process, and may be aligned between the first electrode 210 and the second electrode 220 through a method of applying a dielectrophoretic force to the light emitting elements 300 by applying the alignment signal between the first electrode 210 and the second electrode 220.

The first electrode 210 and the second electrode 220 may be provided on the first internal bank 410 and the second internal bank 420, respectively, and may be spaced apart from each other and face each other in the first direction DR1. The plurality of light emitting elements 300 may be provided between the first internal bank 410 and the second internal bank 420, and at least one end of each light emitting element 300 may be electrically connected to the first electrode 210 and the second electrode 220. The first electrode 210 and the second electrode 220 provided on the first internal bank 410 and the second internal bank 420 may be a portion of the first electrode branch portion 210B and a portion of the second electrode branch portion 220B, respectively.

In some embodiments, the first electrode 210 and the second electrode 220 may be formed to have greater widths than the first internal bank 410 and the second internal bank 420, respectively. For example, the first electrode 210 and the second electrode 220 may be provided to cover outer surfaces of the first internal bank 410 and the second internal bank 420, respectively. The first electrode 210 and the second electrode 220 may be provided on side surfaces of the first internal bank 410 and the second internal bank 420, respectively, and a separation distance (e.g., in the first direction DR1) between the first electrode 210 and the second electrode 220 may be less than a separation distance between the first internal bank 410 and the second internal bank 420. In addition, at least a partial area of each of the first electrode 210 and the second electrode 220 may be provided directly on the first planarization layer 109.

Each of the electrodes 210 and 220 may include a transparent conductive material. As an example, each of the electrodes 210 and 220 may include materials such as indium tin oxide (ITO), indium zinc oxide (IZO), indium tin-zinc oxide (ITZO), and the like, but the present disclosure is not limited thereto. In some embodiments, each of the electrodes 210 and 220 may include a conductive material having a high reflectance. For example, each of the electrodes 210 and 220 may include a metal such as silver (Ag), copper (Cu), aluminum (Al), or the like as the material having a high reflectance. In this case, each of the electrodes 210 and 220 may reflect light, which is emitted from the light emitting element 300 and travels to the side surfaces of the first internal bank 410 and the second internal bank 420, in an upward direction with respect to each sub-pixel PXn.

The present disclosure is not limited thereto, and each of the electrodes 210 and 220 may be formed in a structure, in which one or more layers of a transparent conductive material and a metal layer having a high reflectance are stacked, or formed as a single layer including the transparent conductive material and the metal layer. In one or more embodiments, each of the electrodes 210 and 220 may have a stacked structure of ITO/Ag/ITO/IZO, or may be an alloy including Al, Ni, lanthanum (La), and/or the like.

A first insulating layer IL1 is provided on the first planarization layer 109, the first electrode 210, and the second electrode 220. The first insulating layer IL1 may also be provided on a side opposite to the area between the internal banks 410 and 420 with respect to the internal banks 410 and 420 (e.g., outside of the internal banks 410 and 420), in addition to the area between the electrodes 210 and 220 and/or between the internal banks 410 and 420 being spaced apart from each other. For example, the first insulating layer IL1 may be entirely provided on the first planarization layer 109, including the first electrode 210 and the second electrode 220, and may be provided to expose a portion of an upper surface of each of the first electrode 210 and the second electrode 220. An opening (not shown) partially exposing the first electrode 210 and the second electrode 220 may be formed in the first insulating layer IL1, and the first insulating layer IL1 may be provided to cover only the sides (e.g., one side and the other side) of each of the first electrode 210 and the second electrode 220. Some of portions of the first electrode 210 and the second electrode 220, which are respectively provided on the internal banks 410 and 420, may be partially exposed due to the opening.

The first insulating layer IL1 may protect the first electrode 210 and the second electrode 220 and, simultaneously (e.g., also), insulate the first electrode 210 from the second electrode 220. In addition, the first insulating layer IL1 may prevent or reduce damage to the light emitting element 300 provided on the first insulating layer IL1 by being in direct contact with other members. However, the shape and structure of the first insulating layer RA are not limited thereto.

In some embodiments, a step difference may be formed on a portion of an upper surface of the first insulating layer IL1 between the first electrode 210 and the second electrode 220. In some embodiments, the first insulating layer IL1 may include an inorganic insulating material, and a portion of the upper surface of the first insulating layer IL1 provided to partially cover the first electrode 210 and the second electrode 220 may be stepped by (e.g., due to) the electrodes 210 and 220 provided below the first insulating layer IL1. Accordingly, an empty space may be formed between the light emitting element 300, which is provided on the first insulating layer IL1 between the first electrode 210 and the second electrode 220, and the upper surface of the first insulating layer IL1. The empty space may be filled with a material forming a second insulating layer IL2, which will be described in more detail herein below.

However, the present disclosure is not limited thereto. The first insulating layer IL1 may be formed such that a portion thereof provided between the first electrode 210 and the second electrode 220 has a flat upper surface. The upper surface extends in one direction toward the first electrode 210 and the second electrode 220, and the first insulating layer IL1 may also be provided in areas in which the electrodes 210 and 220 overlap the inclined side surfaces of the first internal bank 410 and the second internal bank 420, respectively. The contact electrodes 261 and 262, which will be described in more detail herein below, may be in contact with the exposed areas of the first electrode 210 and the second electrode 220 and may be smoothly in contact with a respective end of the light emitting element 300 on the flat upper surface of the first insulating layer IL1.

The external bank 450 may be provided on the first insulating layer IL1 The external bank 450 may be provided at a boundary between each of the sub-pixels PXn. The external bank 450 may be provided to extend in the first direction DR1 and the second direction DR2 to surround some of the internal banks 410 and 420 and the electrodes 210 and 220, including the area in which the light emitting element 300 is provided between the internal banks 410 and 420 and between the electrodes 210 and 220. The external bank 450 may form a grid pattern on the entire surface of the active area AA of the first display substrate 10.

The external bank 450 may be provided at the boundary between each of the sub-pixels PXn and may partially overlap the wiring lines, which are provided in each sub-pixel PXn or pixel PX, in the thickness direction. In one or more embodiments, the external banks 450 may each overlap the data line DTL, which is provided in each sub-pixel PXn, in the thickness direction in a plan view, and some of the external banks 450 may overlap the reference voltage wiring line RVL, which is provided in each pixel PX, in the thickness direction. Portions of the external banks 450 extending in the second direction DR2 may partially overlap the wiring lines extending in the second direction DR2 while being provided at boundaries of the sub-pixels PXn adjacent in the first direction DR1. In addition, even the wiring lines extending in the first direction DR1, for example, the scan line SCL and the sensing line SSL, may be provided to overlap the portion of the external bank 450, which extends in the second direction DR2, in the thickness direction. However, the scan line SCL and the sensing line SSL may be provided not to overlap the portion of the external bank 450, which extends in the first direction DR1, in the thickness direction.

According to one or more embodiments, a height of the external bank 450 may be greater than a height of each of the internal banks 410 and 420. Unlike the internal banks 410 and 420, the external bank 450 may divide adjacent sub-pixels PXn, and simultaneously (e.g., also), prevent or reduce the overflow of the ink from to the adjacent sub-pixels PXn in the inkjet printing process for disposing the light emitting element 300 during the manufacturing process of the first display substrate 10. For example, the external bank 450 may separate inks in which different light emitting elements 300 are dispersed in different sub-pixels PXn from each other so as to prevent or reduce the mixing of the inks with each other. Like the internal banks 410 and 420, the external bank 450 may include polyimide (PI), but the present disclosure is not limited thereto.

The light emitting element 300 may be provided in an area formed between the first electrode 210 and the second electrode 220, or between the first internal bank 410 and the second internal bank 420. One end of the light emitting element 300 may be electrically connected to the first electrode 210, and the other end thereof may be electrically connected to the second electrode 220. The light emitting element 300 may be electrically connected to the first electrode 210 and the second electrode 220 respectively through contact electrodes 261 and 262.

The plurality of light emitting elements 300 may be provided to be spaced apart from each other and aligned to be substantially parallel to each other. A separation distance between the light emitting elements 300 is not particularly limited. In some cases, the plurality of light emitting elements 300 may be provided adjacent to each other to form a group, and a plurality of other light emitting elements 300 may be grouped in a state of being spaced apart at a set or predetermined interval, and may be oriented and aligned in one direction with a non-uniform density. In one or more embodiments, the light emitting element 300 may have a shape extending in one direction, and a direction in which each of the electrodes 210 and 220 extends may be substantially perpendicular to a direction in which the light emitting element 300 extends. However, the present disclosure is not limited thereto, and the light emitting element 300 may be obliquely provided without being perpendicular to the direction in which each of the electrodes 210 and 220 extends.

The light emitting elements 300 according to one or more embodiments may include light emitting layers 330 having different materials to emit light in different wavelength ranges to the outside. According to one embodiment, the sub-pixels PXn may respectively include the light emitting elements 300 that emit light in different wavelength ranges. The light emitting element 300 of the first sub-pixel PX1 may include a light emitting layer 330 that emits light of a first color having a first wavelength at a central wavelength range, the light emitting element 300 of the second sub-pixel PX2 may include a light emitting layer 330 that emits light of a second color having a second wavelength at a central wavelength range, and the light emitting element 300 of the third sub-pixel PX3 may include a light emitting layer 330 that emits light of a third color having a third wavelength at a central wavelength range.

Thus, the light of the first color may be emitted from the first sub-pixel PX1, the light of the second color may be emitted from the second sub-pixel PX2, and the light of the third color may be emitted from the third sub-pixel PX3. However, the present disclosure is not limited thereto. In some cases, the first sub-pixel PX1, the second sub-pixel PX2, and the third sub-pixel PX3 may include the same type (or kind) of light emitting elements 300 to emit light of the substantially same color.

The light emitting element 300 may be provided on the first insulating layer IL1 between the internal banks 410 and 420 or between the electrodes 210 and 220. In addition, the light emitting element 300 may be provided such that a partial area thereof overlaps each of the electrodes 210 and 220 in the thickness direction. One end of the light emitting element 300 may overlap the first electrode 210 in the thickness direction and may be placed on the first electrode 210, and the other end thereof may overlap the second electrode 220 in the thickness direction and may be placed on the second electrode 220. However, the present disclosure is not limited thereto, and although not shown in the drawing, at least some of the light emitting elements 300 provided in each sub-pixel PXn may be provided in areas other than an area formed between the internal banks 410 and 420, for example, areas between the internal banks 410 and 420 and the external bank 450.

The light emitting element 300 may be provided between the first internal bank 410 and the second internal bank 420, and the first capacitor electrode CSE1 and the second capacitor electrode CSE2 may be provided between the first voltage wiring line VDL and the data line DTL. According to one embodiment, at least some of the light emitting elements 300 may be provided to overlap the first capacitor electrode CSE1 and the second capacitor electrode CSE2 of the circuit element layer in the thickness direction. As described above, the internal banks 410 and 420 and the first and second capacitor electrodes CSE1 and CSE2 may be located between the first voltage wiring line VDL and the data line DTL in a plan view. At least some of the light emitting elements 300 provided between the internal banks 410 and 420 may be provided to overlap the first capacitor electrode CSE1 and the second capacitor electrode CSE2 of the circuit element layer. Light emitted from both end surfaces of the light emitting element 300 may be reflected by the electrodes 210 and 220 provided on the side surfaces of the internal banks 410 and 420 to be emitted in an upward direction with respect to the first substrate 101.

However, the present disclosure is not limited thereto. In some embodiments, the non-light emitting area in which circuit elements are provided, and a light emitting area EMA in which the light emitting elements 300 are provided, may be separately located in the first display substrate 10, and the light emitting elements 300 may not overlap the circuit elements in the thickness direction. In the first display substrate 10, light emitted from the light emitting elements 300 may be emitted in an upward or backward direction with respect to the first substrate 101.

The light emitting element 300 may include a plurality of layers provided therein in a direction parallel to an upper surface of the first substrate 101 and/or the first planarization layer 109. The light emitting element 300 according to one or more embodiments may have a shape extending in one direction and have a structure in which a plurality of semiconductor layers are sequentially provided in the one direction. The light emitting element 300 may be provided such that the one direction, in which the light emitting element 300 extends, is parallel to the first planarization layer 109, and the plurality of semiconductor layers included in the light emitting element 300 may be sequentially provided in the direction parallel to the upper surface of the first planarization layer 109. However, the present disclosure is not limited thereto. In some cases, when the light emitting element 300 has a different structure, the plurality of layers may be provided in a direction perpendicular to the first planarization layer 109.

The second insulating layer IL2 may be partially provided on the light emitting element 300 provided between the first electrode 210 and the second electrode 220. The second insulating layer IL2 may be provided on the first insulating layer IL1 between the first electrode 210 and the second electrode 220, and the light emitting element 300 may be provided between the first insulating layer IL1 and the second insulating layer IL2. In one or more embodiments, in the light emitting element 300, an insulating film 380 (see FIG. 11) formed on an outer surface of the light emitting element 300 may be in direct contact with the first insulating layer IL1 and the second insulating layer IL2. For example, the second insulating layer IL2 may be provided to partially surround the outer surface of the light emitting element 300 and thus may protect the light emitting element 300, and simultaneously (e.g., also), may fix the light emitting element 300 during the manufacturing process.

A portion of the second insulating layer IL2 provided on the light emitting element 300 may have a shape extending in the second direction DR2 between the first electrode 210 and the second electrode 220 in a plan view. As an example, the second insulating layer IL2 may form a stripe pattern or island type pattern in each sub-pixel PXn.

The second insulating layer IL2 may be provided on the light emitting element 300 and may expose one end and the other end of the light emitting element 300. The exposed ends of the light emitting element 300 may be in contact with the contact electrodes 261 and 262, respectively, which will be described in more detail herein below. Such a shape of the second insulating layer IL2 may be formed by a patterning process using a material forming the second insulating layer IL2 by using a typical mask process. A mask for forming the second insulating layer IL2 has a width less than a length of the light emitting element 300, and the material forming the second insulating layer IL2 may be patterned to expose both ends of the light emitting element 300. However, the present disclosure is not limited thereto.

Further, in one or more embodiments, a portion of the material of the second insulating layer IL2 may be provided between the first insulating layer IL1 and a lower surface of the light emitting element 300. The second insulating layer IL2 may be formed to fill a space between the first insulating layer IL1 and the light emitting element 300, which is formed during the manufacturing process. Accordingly, the second insulating layer IL2 may be formed to surround the outer surface of the light emitting element 300. However, the present disclosure is not limited thereto.

The plurality of contact electrodes 261 and 262 and a third insulating layer IL3 may be provided on the second insulating layer IL2.

The plurality of contact electrodes 261 and 262 may each have a shape extending in one direction. The plurality of contact electrodes 261 and 262 may be in contact with the electrodes 210 and 220, respectively, and the light emitting element 300, and the light emitting elements 300 may receive electrical signals from the first electrode 210 and the second electrode 220 through the contact electrodes 261 and 262.

The contact electrodes 261 and 262 may include a first contact electrode 261 and a second contact electrode 262. The first contact electrode 261 and the second contact electrode 262 may be provided on the first electrode 210 and the second electrode 220, respectively. For example, the first contact electrode 261 may be provided on the first electrode branch portion 210B, the second contact electrode 262 may be provided on the second electrode branch portion 220B, and the first contact electrode 261 and the second contact electrode 262 may each have a shape extending in the second direction DR2. The first contact electrode 261 and the second contact electrode 262 may be spaced apart from each other and face each other in the first direction DR1, and may form a stripe pattern in the light emitting area EMA of each sub-pixel PXn.

In some embodiments, a width of each of the first contact electrode 261 and the second contact electrode 262, which is measured in one direction, may be greater than or equal to a width of each of the first electrode branch portion 210B and the second electrode branch portion 220B, which is measured in the one direction. The first contact electrode 261 and the second contact electrode 262 may be provided to be in contact with one end and the other end of the light emitting element 300, respectively, and simultaneously (e.g., concurrently), to cover both side surfaces of the first electrode branch portion 210B and the second electrode branch portion 220B, respectively. As described above, the upper surface of each of the first electrode 210 and the second electrode 220 may be partially exposed, and the first contact electrode 261 and the second contact electrode 262 may be in contact with the exposed upper surfaces of the first electrode 210 and the second electrode 220, respectively. The first contact electrode 261 may be in contact with a portion of the first electrode 210, which is located on the first internal bank 410, and the second contact electrode 262 may be in contact with a portion of the second electrode 220, which is located on the second internal bank 420. However, the present disclosure is not limited thereto, and in some cases, the widths of the first contact electrode 261 and the second contact electrode 262 may be formed to be less than those of the first electrode 210 and the second electrode 220, respectively, and the first contact electrode 261 and the second contact electrode 262 may be provided to cover only the exposed portions of the upper surfaces of the first electrode 210 and the second electrode 220, respectively. In addition, at least a partial area of each of the first contact electrode 261 and the second contact electrode 262 is provided on the first insulating layer IL1.

According to one embodiment, the light emitting element 300 has the semiconductor layer exposed on both end surfaces thereof in an extending direction, and the first contact electrode 261 and the second contact electrode 262 may be in contact with the light emitting element 300 on the end surfaces on which the semiconductor layer is exposed. However, the present disclosure is not limited thereto. Both end side surfaces of the light emitting element 300 may be partially exposed. In a process of forming the second insulating layer IL2 covering the outer surface of the light emitting element 300, the insulating film 380 (see FIG. 11) surrounding the outer surface of the semiconductor layer of the light emitting element 300 may be partially removed, and the exposed side surface of the semiconductor layer of the light emitting element 300 may be in contact with the first contact electrode 261 and the second contact electrode 262. One end of the light emitting element 300 may be electrically connected to the first electrode 210 through the first contact electrode 261, and the other end thereof may be electrically connected to the second electrode 220 through the second contact electrode 262.

In the drawing(s), it is illustrated that two first contact electrodes 261 and one second contact electrode 262 are provided in one sub-pixel PXn, but the present disclosure is not limited thereto. The number of the first contact electrodes 261 and second contact electrodes 262 may vary depending on the number of the first electrodes 210 and second electrodes 220 provided in each sub-pixel PXn.

The first contact electrode 261 may be provided on the first electrode 210 and the second insulating layer IL2. The first contact electrode 261 may be in contact with one end of the light emitting element 300 and the exposed upper surface of the first electrode 210. The one end of the light emitting element 300 may be electrically connected to the first electrode 210 through the first contact electrode 261.

The third insulating layer IL3 is provided on the first contact electrode 261. The third insulating layer IL3 may electrically insulate the first contact electrode 261 and the second contact electrode 262 from each other. The third insulating layer IL3 may be provided to cover the first contact electrode 261 and may not be provided on the other end of the light emitting element 300 so that the light emitting element 300 may be in contact with the second contact electrode 262. The third insulating layer IL3 may be partially in contact with the first contact electrode 261 and the second insulating layer IL2 at an upper surface of the second insulating layer IL2. A side surface of the third insulating layer IL3 in a direction in which the second electrode 220 is provided may be aligned with one side surface of the second insulating layer IL2. In addition, the third insulating layer IL3 may also be provided on the first insulating layer IL1 provided on the first planarization layer 109. However, the present disclosure is not limited thereto.

The second contact electrode 262 is provided on the second electrode 220, the second insulating layer IL2, and the third insulating layer IL3. The second contact electrode 262 may be in contact with the other end of the light emitting element 300 and the exposed upper surface of the second electrode 220. The other end of the light emitting element 300 may be electrically connected to the second electrode 220 through the second contact electrode 262.

For example, the first contact electrode 261 may be provided between the first electrode 210 and the third insulating layer IL3, and the second contact electrode 262 may be provided on the third insulating layer IL3. The second contact electrode 262 may be partially in contact with the second insulating layer IL2, the third insulating layer IL3, the second electrode 220, and the light emitting element 300. One end of the second contact electrode 262 in a direction in which the first electrode 210 is provided may be provided on the third insulating layer IL3. The first contact electrode 261 and the second contact electrode 262 may not be in contact with each other due to the second insulating layer IL2 and the third insulating layer IL3. However, the present disclosure is not limited thereto, and in some cases, the third insulating layer IL3 may be omitted.

The contact electrodes 261 and 262 may include a conductive material. For example, the contact electrodes 261 and 262 may include ITO, IZO, ITZO, aluminum (Al), and/or the like. As an example, the contact electrodes 261 and 262 may include a transparent conductive material, and light emitted from the light emitting element 300 may pass through the contact electrodes 261 and 262 and travel toward the electrodes 210 and 220. Each of the electrodes 210 and 220 may include a material having a high reflectance, and the electrodes 210 and 220 provided on the inclined side surfaces of the internal banks 410 and 420 may reflect incident light in an upward direction with respect to the first substrate 101. However, the present disclosure is not limited thereto.

The first insulating layer IL1, the second insulating layer IL2, and the third insulating layer IL3, which are described above, may each include an inorganic insulating material or an organic insulating material. In one or more embodiments, the first insulating layer IL1, the second insulating layer IL2, and the third insulating layer IL3 may each independently include an inorganic insulating material such as silicon oxide (SiOx), silicon nitride (SiNx), silicon oxynitride (SiOxNy), aluminum oxide (Al2O3), aluminum nitride (AlN), or the like. In some embodiments, the first insulating layer IL1, the second insulating layer IL2, and the third insulating layer IL3 may each independently include an organic insulating material such as an acrylic resin, an epoxy resin, a phenolic resin, a polyimide resin, a PI resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the present disclosure is not limited thereto.

Thin-film encapsulation structures TFE1, TFE2, and TFE3 (collectively referred to as "TFE") may be provided on the third insulating layer IL3 and the second contact electrode 262. The thin-film encapsulation structure TFE may include at least one thin-film encapsulation layer. For example, the thin-film encapsulation layer may include a first inorganic film TFE1, an organic film TFE2, and a second inorganic film TFE3. Each of the first inorganic film TFE1 and the second inorganic film TFE3 may include silicon nitride, silicon oxide, silicon oxynitride, or the like. The organic film TFE2 may include an organic insulation material such as acryl resin, epoxy resin, phenolic resin, polyimide resin, polyimide resin, unsaturated polyester resin, polyphenylene ether resin, polyphenylene sulfide resin, benzocyclobutene (BCB), or the like.

The light emitting element 300 may be a light emitting diode, and for example, may be an inorganic light emitting diode having a size of a micrometer unit or a nanometer unit and made of an inorganic material. The inorganic light emitting diode may be aligned between two electrodes in which polarity is formed when forming an electric field in a set or specific direction between the two electrodes facing each other. The light emitting element 300 may be aligned between the two electrodes due to the electric field formed on the two electrodes.

The light emitting element 300 according to one embodiment may have a shape extending in one direction. The light emitting element 300 may have a shape such as a rod, a wire, or a tube. In one or more embodiments, the light emitting element 300 may have a cylindrical shape or a rod shape. However, the shape of the light emitting element 300 is not limited thereto, and the light emitting element 300 may have various suitable shapes including a shape of a cube, a rectangular parallelepiped, a polygonal pillar such as a hexagonal pillar, or the like, or a shape that extends in one direction and has a partially inclined outer surface. A plurality of semiconductors included in the light emitting element 300 may have a structure in which the semiconductors are sequentially provided or stacked in the one direction.

The light emitting element 300 may include a semiconductor layer doped with an arbitrary conductive-type (for example, p-type or n-type) impurity. The semiconductor layer may receive an electrical signal applied from an external power source and emit light in a set or specific wavelength range.

Figure 11:
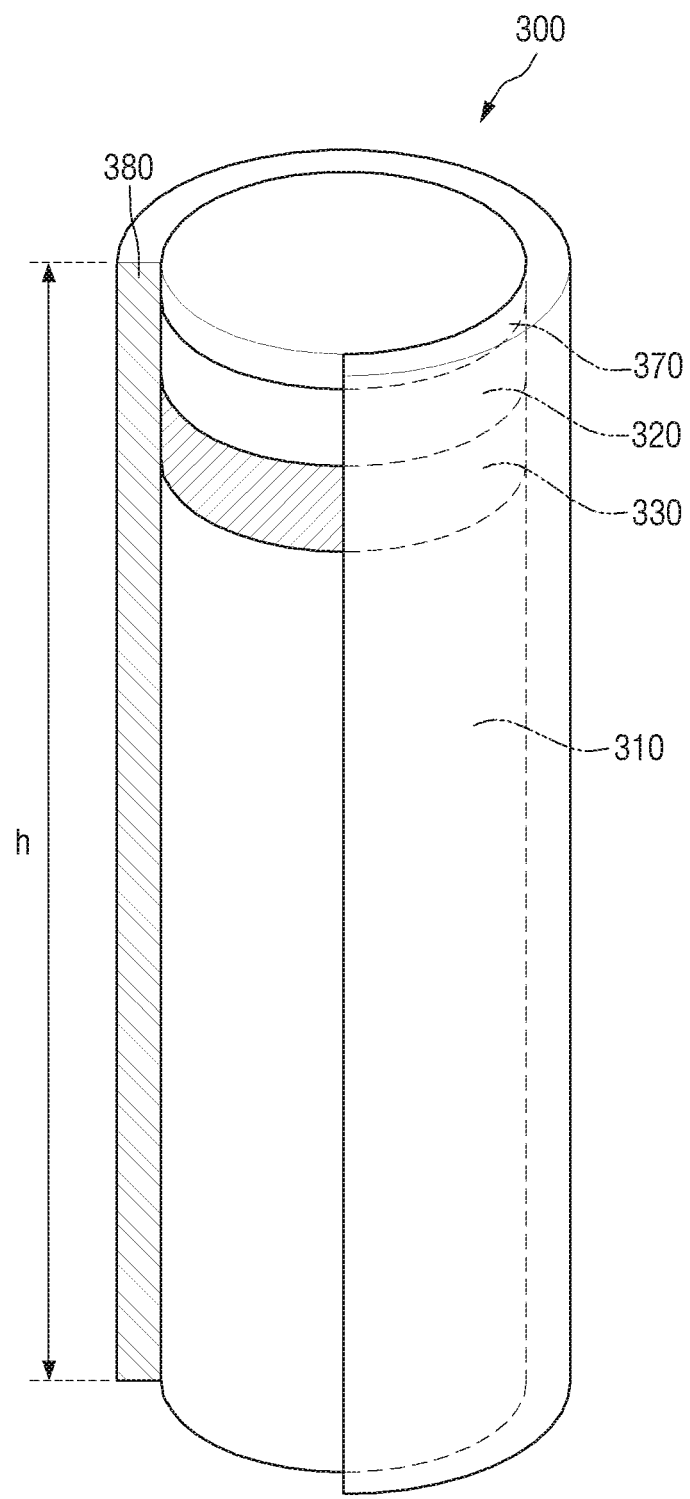
FIG. 11 is a schematic view of a light emitting element according to one or more embodiments.

FIG. 11 is a schematic view of the light emitting element according to one or more embodiments.

Referring to FIG. 11, the light emitting element 300 may include a semiconductor core and the insulating film 380 surrounding an outer surface of the semiconductor core. The semiconductor core may include at least a first semiconductor layer 310, a second semiconductor layer 320, and a light emitting layer 330. In some embodiments, the semiconductor core of the light emitting element 300 may further include an electrode layer 370. Hereinafter, the embodiment will be described taking as an example a case in which the light emitting element 300 includes the first semiconductor layer 310, the second semiconductor layer 320, the light emitting layer 330, the electrode layer 370, and the insulating film 380.

The first semiconductor layer 310 may be an n-type semiconductor. As an example, when the light emitting element 300 emits light in a blue wavelength range, the first semiconductor layer 310 may include a semiconductor material having a chemical formula of $Al_xGa_yIn_{1-x-y}N$ ($0<=x<=1$, $0<=y<=1$, and $0<=x+y<=1$). For example, the semiconductor material may be one or more selected from among AlGaInN, GaN, AlGaN, InGaN, AlN, and InN that are doped with an n-type impurity. The first semiconductor layer 310 may be doped with an n-type dopant, and as an example, the n-type dopant may be Si, Ge, Sn, or the like. In an embodiment, the first semiconductor layer 310 may be n-GaN doped with n-type Si. A length of the first semiconductor layer 310 may range from 1.5 µm to 5 µm, but the present disclosure is not limited thereto.

The second semiconductor layer 320 is provided on the light emitting layer 330 that will be described in more detail herein below. The second semiconductor layer 320 may be a p-type semiconductor, and as an example, when the light emitting element 300 emits light in a blue or green wavelength range, the second semiconductor layer 320 may include a semiconductor material having a chemical formula of $Al_xGa_yIn_{1-x-y}N$ ($0<=x<=1$, $0<=y<=1$, and $0<=x+y<=1$). For example, the semiconductor material may be one or more selected from among AlGaInN, GaN, AlGaN, InGaN, AlN, and InN that are doped with a p-type impurity. The second semiconductor layer 320 may be doped with a p-type dopant, and as an example, the p-type dopant may be Mg, Zn, Ca, Se, Ba, or the like. In an embodiment, the second semiconductor layer 320 may be p-GaN doped with p-type Mg. A length of the second semiconductor layer 320 may range from 0.05 µm to 0.10 µm, but the present disclosure is not limited thereto.

Meanwhile, in the drawing, each of the first semiconductor layer 310 and the second semiconductor layer 320 is illustrated as being formed as one layer, but the present disclosure is not limited thereto. According to some embodiments, each of the first semiconductor layer 310 and the second semiconductor layer 320 may further include a larger number of layers, e.g., a clad layer and/or a tensile strain barrier reducing (TSBR) layer according to a material of the light emitting layer 330. A more detailed description thereof will be provided below with reference to other drawings.

The light emitting layer 330 is provided between the first semiconductor layer 310 and the second semiconductor layer 320. The light emitting layer 330 may include a material having a single or multi-quantum well structure. When the light emitting layer 330 includes a material having a multiple quantum well structure, the light emitting layer 330 may have a structure in which quantum layers and well layers are alternately stacked. The light emitting layer 330 may emit light due to a combination of electron-hole pairs in response to electrical signals applied through the first semiconductor layer 310 and the second semiconductor layer 320. As an example, when the light emitting layer 330 emits light in a blue wavelength range, the light emitting layer 330 may include a material such as AlGaN, AlGaInN, or the like. In some embodiments, when the light emitting layer 330 has a multiple quantum well structure in which quantum layers and well layers are alternately stacked, the quantum layer may include a material such as AlGaN or AlGaInN, and the well layer may include a material such as GaN or AlInN. In one or more embodiments, the light emitting layer 330 includes AlGaInN as a quantum layer and AlInN as a well layer. As described above, the light emitting layer 330 may emit blue light having a central wavelength range ranging from 450 nm to 495 nm.

However, the present disclosure is not limited thereto, and the light emitting layer 330 may have a structure in which semiconductor materials having large bandgap energy and semiconductor materials having small bandgap energy are alternately stacked, or may include other group III-V semiconductor materials according to the wavelength range of emitted light. The light emitted by the light emitting layer 330 is not limited to light in the blue wavelength range, and in some cases, the light emitting layer 330 may also emit light in a red or green wavelength range. A length of the light emitting layer 330 may range from 0.05 µm to 0.10 µm, but the present disclosure is not limited thereto.

The light emitted from the light emitting layer 330 may be emitted to not only an outer surface of the light emitting element 300 in a length direction thereof, but also both side surfaces of the light emitting element 300. The directivity of the light emitted from the light emitting layer 330 is not limited to one direction.

The electrode layer 370 may be an ohmic contact electrode. However, the present disclosure is not limited thereto, and the electrode layer 370 may also be a Schottky contact electrode. The light emitting element 300 may include at least one electrode layer 370. Although the light emitting element 300 is illustrated in FIG. 11 as including a single electrode layer 370, the present disclosure is not limited thereto. In some cases, the light emitting element 300 may include a larger number of electrode layers 370, or the electrode layer 370 may be omitted. The description of the light emitting element 300 may be identically applied even when the number of the electrode layers 370 is varied or another structure is further included.

When the light emitting element 300 is electrically connected to the electrodes 210 and 220 and/or the contact electrodes 261 and 262, the electrode layer 370 may reduce resistance between the light emitting element 300 and the electrode or contact electrode. The electrode layer 370 may include a conductive metal. For example, the electrode layer 370 may include at least one selected from among aluminum (Al), titanium (Ti), indium (in), gold (Au), silver (Ag), indium tin oxide (ITO), indium zinc oxide (IZO), and indium tin-zinc oxide (ITZO). In some embodiments, the electrode layer 370 may include a semiconductor material doped with an n-type or p-type impurity. The electrode layer 370 may include the same material or different materials, but the present disclosure is not limited thereto.

The insulating film 380 is provided to surround the semiconductor core, for example, the plurality of semiconductor layers, and the outer surfaces of the electrode layers, which are described above. In an embodiment, the insulating film 380 may be provided to surround at least an outer surface of the light emitting layer 330 and may extend in one direction in which the light emitting element 300 extends. The insulating film 380 may serve to protect the members. As an example, the insulating film 380 may be formed to surround side surface portions of the members and expose both ends of the light emitting element 300 in the length direction.

In the drawing, the insulating film 380 is illustrated as being formed to extend in the length direction of the light emitting element 300 to cover from the first semiconductor layer 310 to a side surface of the electrode layer 370, but the present disclosure is not limited thereto. Because the insulating film 380 covers only outer surfaces of some semiconductor layers, including the light emitting layer 330, or covers only a portion of the outer surface of the electrode layer 370, the outer surface of the electrode layer 370 may be partially exposed. In some embodiments, an upper surface of the insulating film 380 may be formed to be rounded in cross section in an area adjacent to at least one end of the light emitting element 300.

A thickness of the insulating film 380 may range from 10 nm to 1.0 μm, but the present disclosure is not limited thereto. For example, the thickness of the insulating film 380 may be about 40 nm.

The insulating film 380 may include a material having insulating properties, for example, silicon oxide (SiOx), silicon nitride (SiNx), silicon oxynitride (SiOxNy), aluminum nitride (AlN), aluminum oxide (Al2O3), or the like. Accordingly, it is possible to prevent or reduce the risk of an electrical short circuit which may occur when the light emitting layer 330 is in direct contact with the electrode through which an electrical signal is transmitted to the light emitting element 300. In addition, because the insulating film 380 protects the outer surface of the light emitting element 300, including the light emitting layer 330, it is possible to prevent or reduce degradation in light-emitting efficiency.

Further, in some embodiments, an outer surface of the insulating film 380 may be surface treated. The light emitting elements 300 may be aligned by being sprayed onto electrodes in a state of being dispersed in an ink. Here, in order to maintain a state in which the light emitting element 300 is dispersed in the ink without aggregating with another adjacent light emitting element 300, the surface of the insulating film 380 may be hydrophobically or hydrophilically treated.

The light emitting element 300 may have a length h ranging from 1 μm to 10 μm or from 2 μm to 6 μm, and for example, from 3 μm to 5 μm. A diameter of the light emitting element 300 may range from 300 nm to 700 nm, and an aspect ratio of the light emitting element 300 may range from 1.2 to 100. However, the present disclosure is not limited thereto, and the plurality of light emitting elements 300 may have different diameters according to a composition difference of the light emitting layer 330. For example, the diameter of the light emitting element 300 may have a range of about 500 nm.

The light emitting elements 300 included in the first display substrate 10 may be electrically connected to the first electrode 210 and the second electrode 220 to emit light in a set or specific wavelength range. The light emitted from the first display substrate 10 may travel in an upward direction with respect to the first substrate 101 to be incident on the second display substrate 50. Hereinafter, the second display substrate 50 will be described with further reference to other drawings.

Figure 12:
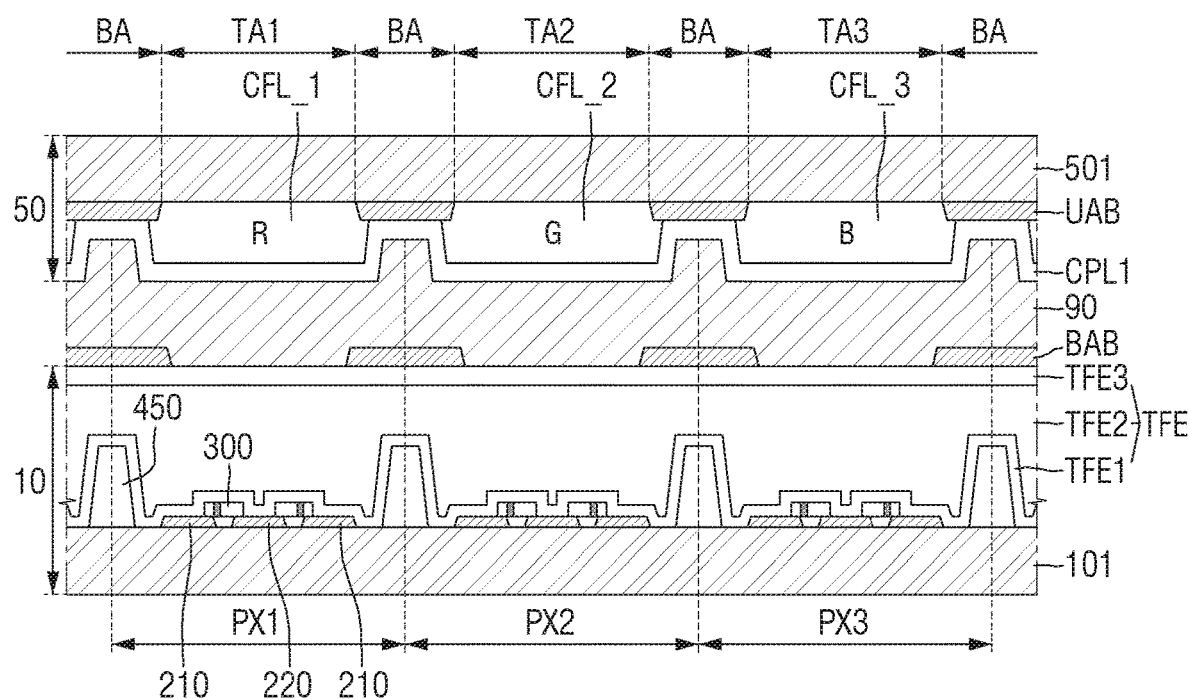
FIG. 12 is a schematic cross-sectional view of the display device according to one or more embodiments.

FIG. 12 is a schematic cross-sectional view of the display device according to one or more embodiments.

Referring to FIG. 12, the second display substrate 50 may be provided above the thin-film encapsulation structure TFE so as to be opposite (e.g., facing) thereto. When a cross-sectional structure of the second display substrate 50 is described in a downward order in the drawing, a second substrate 501 of the second display substrate 50 may include a transparent material. The second substrate 501 may include a transparent insulating material such as glass or quartz. The second substrate 501 may be a rigid substrate. However, the second substrate 501 is not limited to those illustrated above, and the second substrate 501 may also include plastic such as polyimide and may have a flexible property capable of twisting, bending, folding, or rolling.

The second substrate 501 may include the same substrate as the first substrate 101, but a material, a thickness, a transmittance, and/or the like of the second substrate 501 may be different from those of the first substrate 101. For example, the second substrate 501 may have a higher transmittance than the first substrate 101. The second substrate 501 may be thicker or thinner than the first substrate 101.

An upper light absorbing member UAB may be provided on one surface of the second substrate 501 facing the first substrate 101 along a boundary between the sub-pixels PXn. The upper light absorbing member UAB may overlap the external bank 450 of the first display substrate 10, and may be located in a light blocking area BA. The upper light absorbing member UAB may include an opening, which exposes one surface of the second substrate 501, overlapping the light emitting area EMA (see FIG. 8) of the first display substrate 10. The upper light absorbing member UAB may not only serve to block or reduce the emission of light from the display device but also serve to suppress or reduce the reflection of external light. The upper light absorbing member UAB may be formed in a grid shape in a plan view.

The upper light absorbing member UAB may be made of an organic material. In one embodiment, the upper light absorbing member UAB may include a light absorbing material that absorbs a visible light wavelength range. For example, the upper light absorbing member UAB may be made of a material used as a black matrix of the display device. The upper light absorbing member UAB may be a kind of light blocking member.

The upper light absorbing member UAB may define the light blocking area BA and a light outputting area TA. An area in which the upper light absorbing member UAB is provided may be the light blocking area BA, and the second substrate 501, which is not covered by the upper light absorbing member UAB or is exposed by the upper light absorbing member UAB, may be the light outputting area TA. In some embodiments, in the second display substrate 50, the light outputting area TA may be formed to correspond to each pixel PX or sub-pixel PXn of the first display substrate 10. As an example, the second display substrate 50 may include a first light outputting area TA1 provided to correspond to the first sub-pixel PX1 of the first display substrate 10, a second light outputting area TA2 provided to correspond to the second sub-pixel PX2, and a third light outputting area TA3 provided to correspond to the third sub-pixel PX3. Each of the light outputting areas TA1, TA2, and TA3 may be repeatedly provided in a matrix form, and the light blocking area BA in which the upper light absorbing member UAB is provided may be between the light outputting areas TA1, TA2, and TA3.

In another embodiment, the upper light absorbing member UAB may absorb light in a set or specific wavelength range of a visible light wavelength range and may transmit light in other set or specific wavelength ranges. For example, the upper light absorbing member UAB may include the same material as that of one color filter layer CFL. For example, the upper light absorbing member UAB may be made of the same material as that of a third color filter layer (see "CFL_3") for a blue color. In some embodiments, the upper light absorbing member UAB may be formed integrally with the third color filter layer CFL_3. The upper light absorbing member UAB may be omitted.

The color filter layer CFL may be provided on one surface of the second substrate 501 on which the upper light absorbing member UAB is provided. The color filter layer CFL may serve to block or reduce the emission of light of a set color, which is not a color corresponding to each sub-pixel PXn. The color filter layer CFL may be provided on one surface of the second substrate 501, which is exposed through the opening of the upper light absorbing member UAB. Furthermore, the color filter layer CFL may also be partially provided on an adjacent upper light absorbing member UAB.

The color filter layer CFL may include a first color filter layer CFL_1 provided in the first sub-pixel PX1, a second color filter layer CFL_2 provided in the second sub-pixel PX2, and a third color filter layer CFL_3 provided in the third sub-pixel PX3. Each color filter layer CFL may include a colorant such as a dye or a pigment that absorbs wavelengths other than a corresponding color wavelength. The first color filter layer CFL_1 may be a red color filter layer, the second color filter layer CFL_2 may be a green color filter layer, and the third color filter layer CFL_3 may be a blue color filter layer. Adjacent color filter layers CFL are illustrated in the drawing as being spaced apart from each other on the upper light absorbing member UAB. However, the adjacent color filter layers CFL may also partially overlap each other on the upper light absorbing member UAB.

A first capping layer CPL1 may be provided on the color filter layer CFL. The first capping layer CPL1 may prevent or reduce permeation of impurities such as external moisture or air into the color filter layer CFL to damage or contaminate the color filter layer CFL. In addition, the first capping layer CPL1 may prevent or reduce the diffusion of the colorant of the color filter layer CFL into other components.

The first capping layer CPL1 may be in direct contact with one surface (upper surface in FIG. 12) of the color filter layer CFL. The first capping layer CPL1 may be made of an inorganic material. For example, the first capping layer CPL1 may be made of silicon nitride, aluminum nitride, zirconium nitride, titanium nitride, hafnium nitride, tantalum nitride, silicon oxide, aluminum oxide, titanium oxide, tin oxide, silicon oxynitride, or the like.

Meanwhile, a lower light absorbing member BAB may be provided on the thin-film encapsulation structure TFE of the first display substrate 10. The lower light absorbing member BAB may be provided to overlap the external bank 450. The lower light absorbing member BAB may serve to block or reduce the mixing of light emitted from the light emitting element 300 into a light outputting area TA of an adjacent sub-pixel PXn. According to one embodiment, the display device 1 may further include the lower light absorbing member BAB so that color mixing for each sub-pixel PXn may be further blocked or reduced.

The lower light absorbing member BAB may be made of an organic material. In one embodiment, the lower light absorbing member BAB may include a light absorbing material that absorbs a visible light wavelength range. For example, the lower light absorbing member BAB may be made of a material used as a black matrix of the display device. The lower light absorbing member BAB may be a kind of light blocking member. The lower light absorbing member BAB may overlap the upper light absorbing member UAB in the thickness direction. A width of the lower light absorbing member BAB may be less than or equal to a width of the external bank 450, or may be greater than the width of the external bank 450.

The filler 90 may be provided between the first display substrate 10 and the second display substrate 50. The filler 90 may fill a space between the first display substrate 10 and the second display substrate 50 and may serve to bond the first display substrate 10 and the second display substrate 50 to each other. The filler 90 may be provided between the thin-film encapsulation structure TFE of the first display substrate 10 and the first capping layer CPL1 of the second display substrate 50. The filler 90 may be made of a silicon (Si)-based organic material, an epoxy-based organic material, or the like, but the present disclosure is not limited thereto.

Hereinafter, various embodiments of the display device 1 will be described with reference to other drawings.

Figure 13:
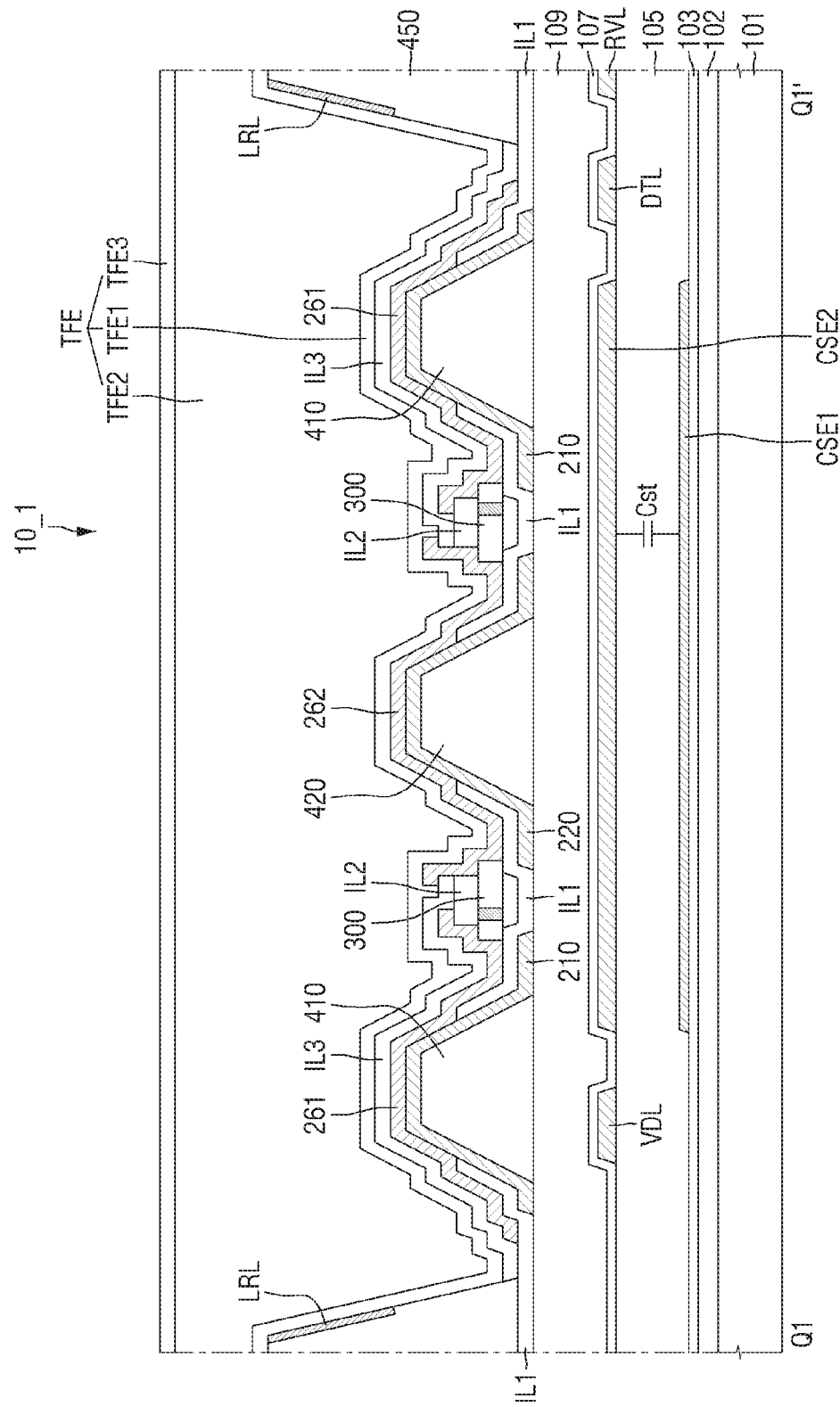
FIG. 13 is a partial cross-sectional view of a first display substrate according to one or more other embodiments.

FIG. 13 is a partial cross-sectional view of a first display substrate according to one or more other embodiments.

Referring to FIG. 13, a first display substrate 10_1 of a display device 1 may further include a reflective layer LRL formed on one surface of an external bank 450. The embodiment of FIG. 13 is different from the embodiment of FIG. 10 in that the reflective layer LRL is further included.

A light emitting element 300 is provided between internal banks 410 and 420, and light emitted from the light emitting element 300 may be reflected by electrodes 210 and 220 respectively placed on inclined side surfaces of the internal banks 410 and 420. However, the present disclosure is not limited thereto, and at least some of the light emitted from the light emitting element 300 may not be reflected by the electrodes 210 and 220, but may be emitted in an upward direction with respect to a first substrate 101. In addition, some of the light may travel toward the external bank 450 located at a boundary of adjacent sub-pixels PXn.

According to one embodiment, the reflective layer LRL may be further provided on at least one surface of the external bank 450, and at least a portion of the light emitted from the light emitting element 300 may be reflected toward a second display substrate 50 due to the reflective layer LRL. The reflective layer LRL may include a material having a high reflectance. In the drawing, the reflective layer LRL is illustrated as being formed only on a portion of one surface of the external bank 450 facing an area in which the light emitting element 300 is provided, but the present disclosure is not limited thereto. An area, a width, or the like of an area, in which the reflective layer LRL is formed, on one surface of the external bank 450 may be variously modified according to the arrangement and the number of the light emitting elements 300. Other descriptions may be the same as described above.

Figure 14:
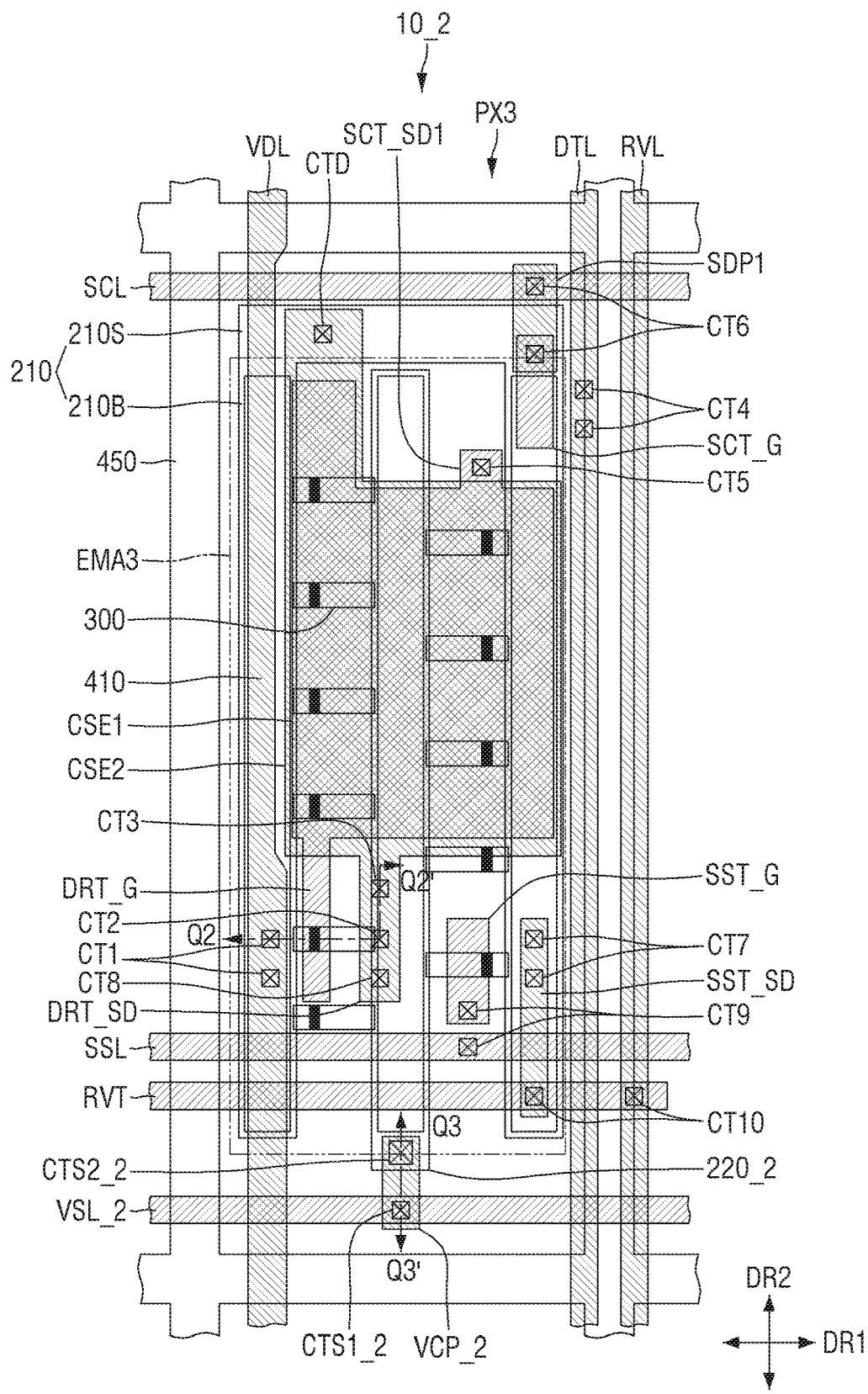
FIG. 14 is a schematic cross-sectional view illustrating one sub-pixel of a display device according to one or more other embodiments.
Figure 15:
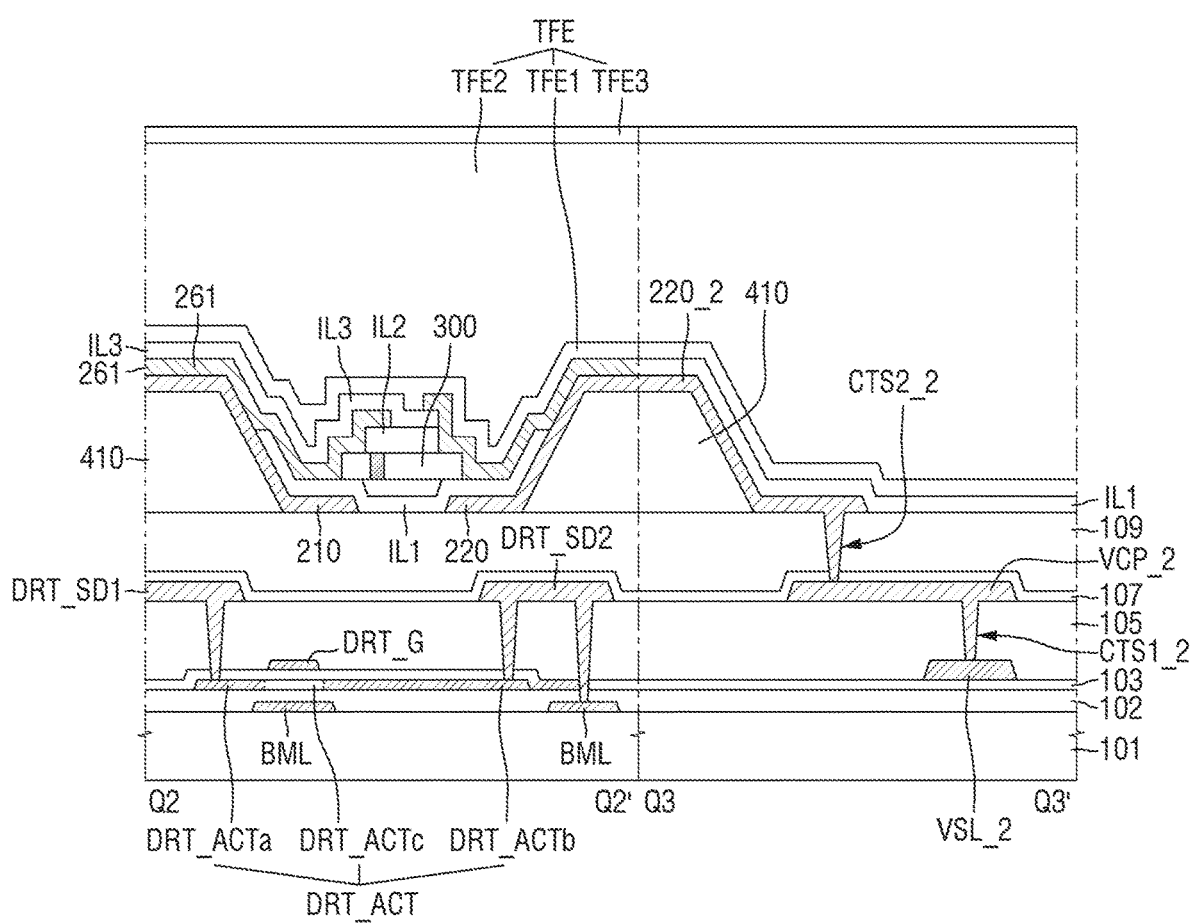
FIG. 15 is a cross-sectional view taken along lines Q2-Q2' and Q3-Q3' of FIG. 14.

FIG. 14 is a schematic cross-sectional view illustrating one sub-pixel of a display device according to one or more other embodiments. FIG. 15 is a cross-sectional view taken along lines Q2-Q2' and Q3-Q3' of FIG. 14. In FIG. 14, for convenience of description, description will be made by omitting a semiconductor layer and contact electrodes 261 and 262.

Referring to FIGS. 14 and 15, in a first display substrate 10_2 of a display device 1 according to one or more embodiments, a second voltage wiring line VSL_2 may further include a portion extending in the first direction DR1, and a second electrode stem portion 220S may be omitted from a second electrode 220_2. The embodiment of FIGS. 14 and 15 is different from the other embodiments in that the second electrode 220_2 of each sub-pixel PXn may be electrically connected to the second voltage wiring line VSL_2 because the second voltage wiring line VSL_2 further includes a portion extending in the first direction DR1.

Although not shown in the drawing, the second voltage wiring line VSL_2 may further include a portion extending in the first direction DR1 in addition to a portion extending in the second direction DR2 as in the embodiment of FIG. 7. The second voltage wiring line VSL_2 may form a grid or mesh pattern on the first substrate 101 similar to an external bank 450. The second voltage wiring line VSL_2 may be provided in each sub-pixel PXn, and the second electrode 220_2 of each sub-pixel PXn may be electrically connected to the second voltage wiring line VSL_2.

For example, the second electrode stem portion 220S may be omitted from the second electrode 220_2. The second electrode 220_2 has a shape extending in the second direction DR2 and may be provided between first electrode branch portions 210B. A second conductive pattern VCP_2 may be provided in each sub-pixel PXn, and may be in contact with each of the second electrode 220_2 and the second voltage wiring line VSL_2.

The second conductive pattern VCP_2 may be in contact with the second voltage wiring line VSL_2 through a first wiring line contact hole CTS1_2 that exposes a portion of an upper surface of the second voltage wiring line VSL_2 through a first interlayer insulating layer 105. The second electrode 220_2 may be in contact with the second conductive pattern VCP_2 through a second wiring line contact hole CTS2_2 that exposes a portion of an upper surface of the second conductive pattern VCP_2 through a first planarization layer 109 and a first protective layer 107. According to one embodiment, because the second electrode 220_2 may be electrically connected to the second voltage wiring line VSL_2 through the second conductive pattern VCP_2 provided in each sub-pixel PXn, and the second voltage wiring line VSL_2 is provided in each sub-pixel PXn, there is an effect of preventing or reducing a voltage drop of the second power voltage VSS.

Figure 16:
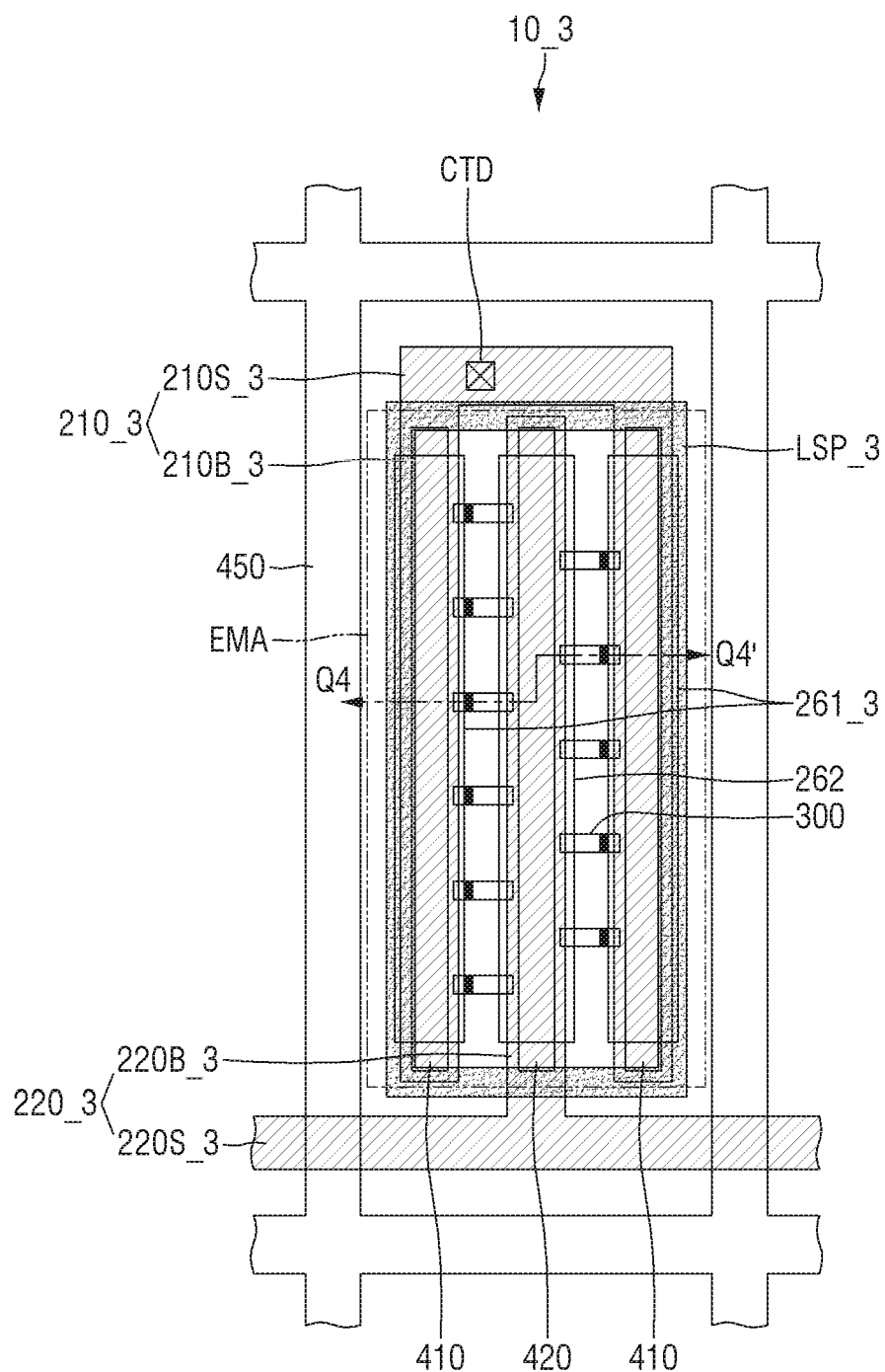
FIG. 16 is a schematic plan view of a display element layer included in one sub-pixel of a display device according to one or more other embodiments.
Figure 17:
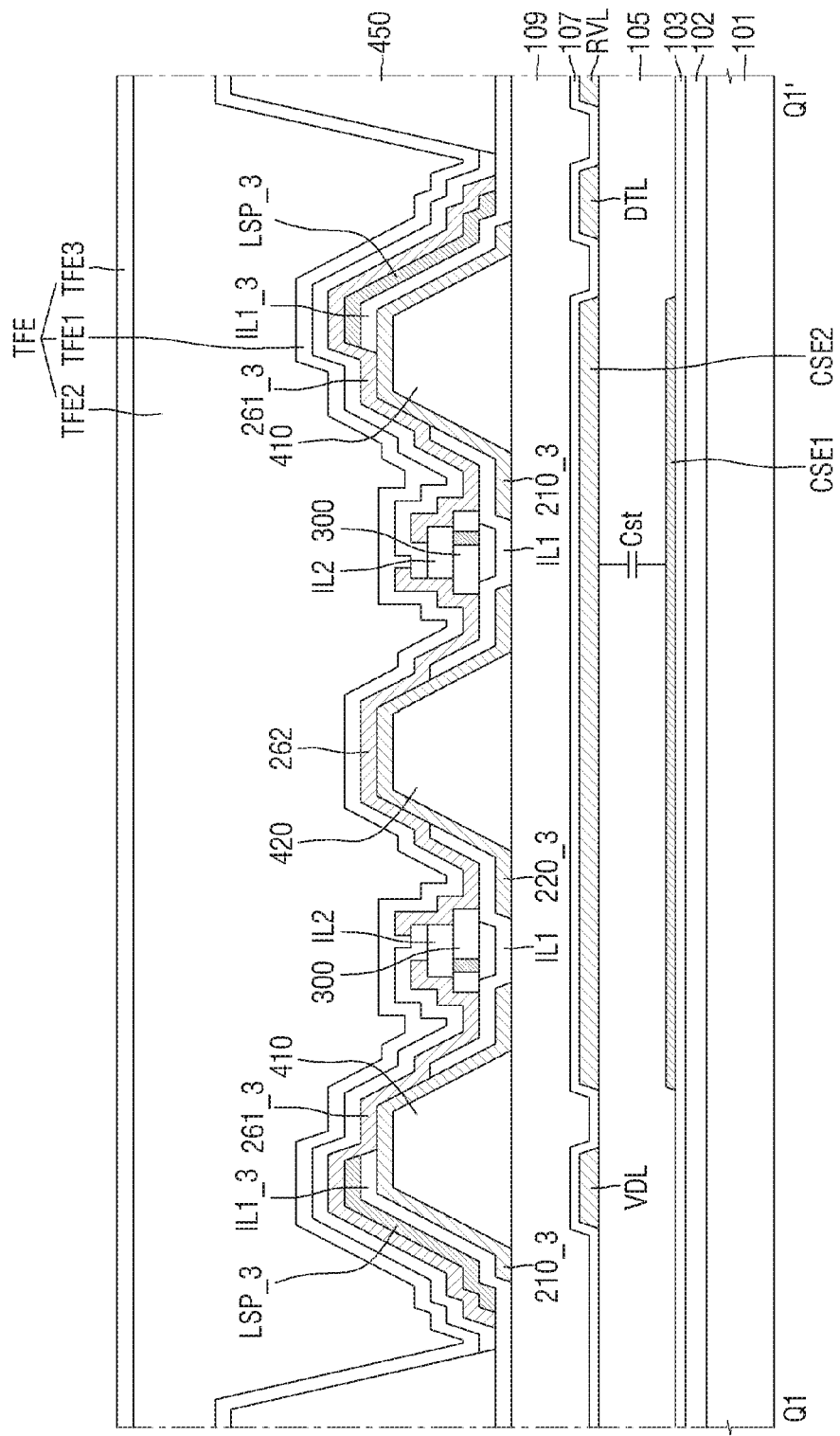
FIG. 17 is a cross-sectional view taken along line Q4-Q4' of FIG. 16.

FIG. 16 is a schematic plan view of a display element layer included in one sub-pixel of a display device according to one or more other embodiments. FIG. 17 is a cross-sectional view taken along line Q4-Q4' of FIG. 16. In FIG. 16, for convenience of description, a circuit element layer is omitted and a plan view of only the display element layer is illustrated.

Referring to FIGS. 16 and 17, a first display substrate 10_3 of a display device 1 according to one or more embodiments may further include a shielding electrode LSP_3 provided in a partial area on a first electrode 210_3 and a second electrode 220_3. The embodiment of FIGS. 16 and 17 is different from the embodiment of FIG. 8 in that the first display substrate 10_3 further includes the shielding electrode LSP_3.

Light emitting elements 300 may be provided between the first electrode 210_3 and the second electrode 220_3, or between a first internal bank 410 and a second internal bank 420. For example, the light emitting elements 300 may be provided between a first electrode branch portion 210B_3 and a second electrode branch portion 220B_3 and electrically connected thereto. In a process of placing the light emitting elements 300 between the first electrode 210_3 and the second electrode 220_3, or between the first internal bank 410 and the second internal bank 420, an alignment signal may be applied to the first electrode 210_3 and the second electrode 220_3 so that an electric field may be generated on the first electrode 210_3 and the second electrode 220_3. The light emitting elements 300 placed in the electric field may be provided between the first electrode 210_3 and the second electrode 220_3 while changing orientation directions and locations. However, it may be preferable that the light emitting elements 300 are not provided in a portion in which at least one end of the light emitting element 300 is not electrically connected to each of the electrodes 210_3 and 220_3, for example, between the first electrode branch portion 210B_3 and the external bank 450 or in each of electrode stem portions 210S_3 and 220S_3.

According to one embodiment, the display device 1 may further include the shielding electrode LSP_3 provided to cover at least a portion of each of the first electrode 210_3 and the second electrode 220_3 of the first display substrate 10_3. When an alignment signal is applied to the first electrode 210_3 and the second electrode 220_3, the shielding electrode LSP_3 may prevent or reduce generation of an electric field in a partial area. The shielding electrode LSP_3 may include a shielding material that prevents or reduces the generation of the electric field, and for example, the shielding electrode LSP_3 may include a carbon pigment, Cr/CrOx, CrOx, MoOx, and the like. However, the present disclosure is not limited thereto.

The shielding electrode LSP_3 may be provided to cover one side of the first electrode branch portion 210B_3. For example, the shielding electrode LSP_3 may be provided to cover a portion of the first electrode branch portion 210B_3 facing an external bank 450, for example, the other side of the second electrode branch portion 220B_3 opposite to one side of the first electrode branch portion 210B_3 facing the second electrode branch portion 220B_3. The shielding electrode LSP_3 may overlap the other side of the first internal bank 410 opposite to one side of the first internal bank 410, which is spaced apart from and face the second internal bank 420, in the thickness direction. A first insulating layer IL1 may be provided between the shielding electrode LSP_3 and the first electrode 210_3, which may be insulated from each other. The shielding electrode LSP_3 may have a shape extending in the second direction DR2 along the first electrode branch portion 210B_3, and may prevent or reduce the generation of an electric field between the first electrode branch portion 210B_3 and the external bank 450.

Further, the shielding electrode LSP_3 may also be provided at portions in which the electrode branch portions 210B_3 and 220_8 are connected to the electrode stem portions 210S_3 and 220S_3, respectively. The shielding electrode LSP_3 may further include a portion extending in the first direction DR1, and may also be provided on a portion in which the first electrode branch portion 210B_3 and a first electrode stem portion 210S_3 are connected and a portion in which the second electrode branch portion 220B_3 and a second electrode stem portion 220S_3 are connected. For example, the shielding electrode LSP_3 may be provided to surround an area, in which the light emitting elements 300 are substantially provided, for example, a space between the first internal bank 410 and the second internal bank 420. The shielding electrode LSP_3 may be provided to cover a portion of an outer side of each of the first electrode branch portion 210B_3 and the first internal bank 410 with respect to the area in which the light emitting elements 300 are provided.

In a process of placing the light emitting element 300, the shielding electrode LSP_3 may block or reduce the generation of an electric field outside an area between the first internal bank 410 and the second internal bank 420, and the light emitting element 300 may be intensively provided in the area between the internal banks 410 and 420.

Figure 18:
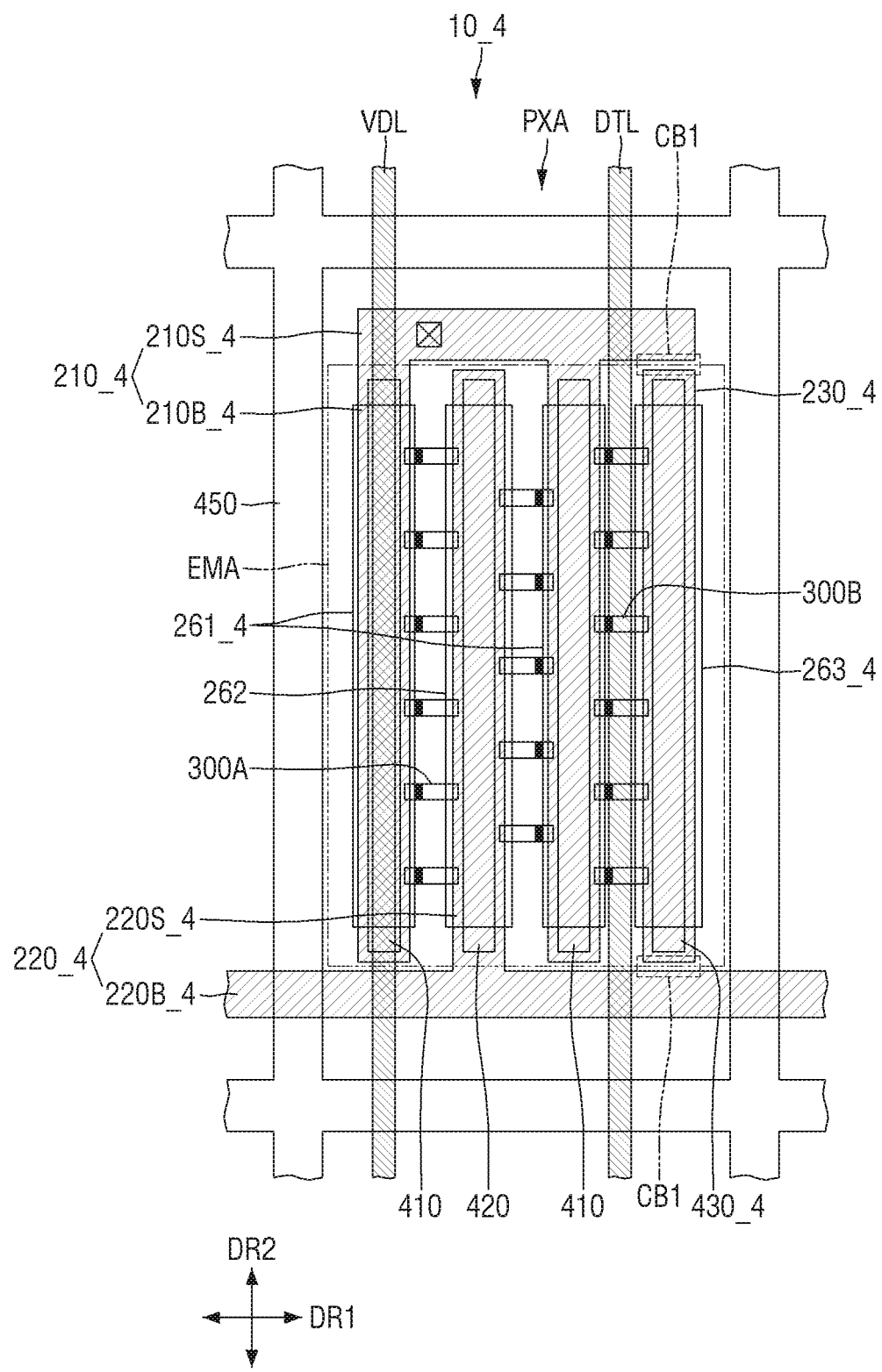
FIGS. 18 to 20 are schematic plan views of a display element layer included in one sub-pixel of a display device according to one or more other embodiments.
Figure 19:
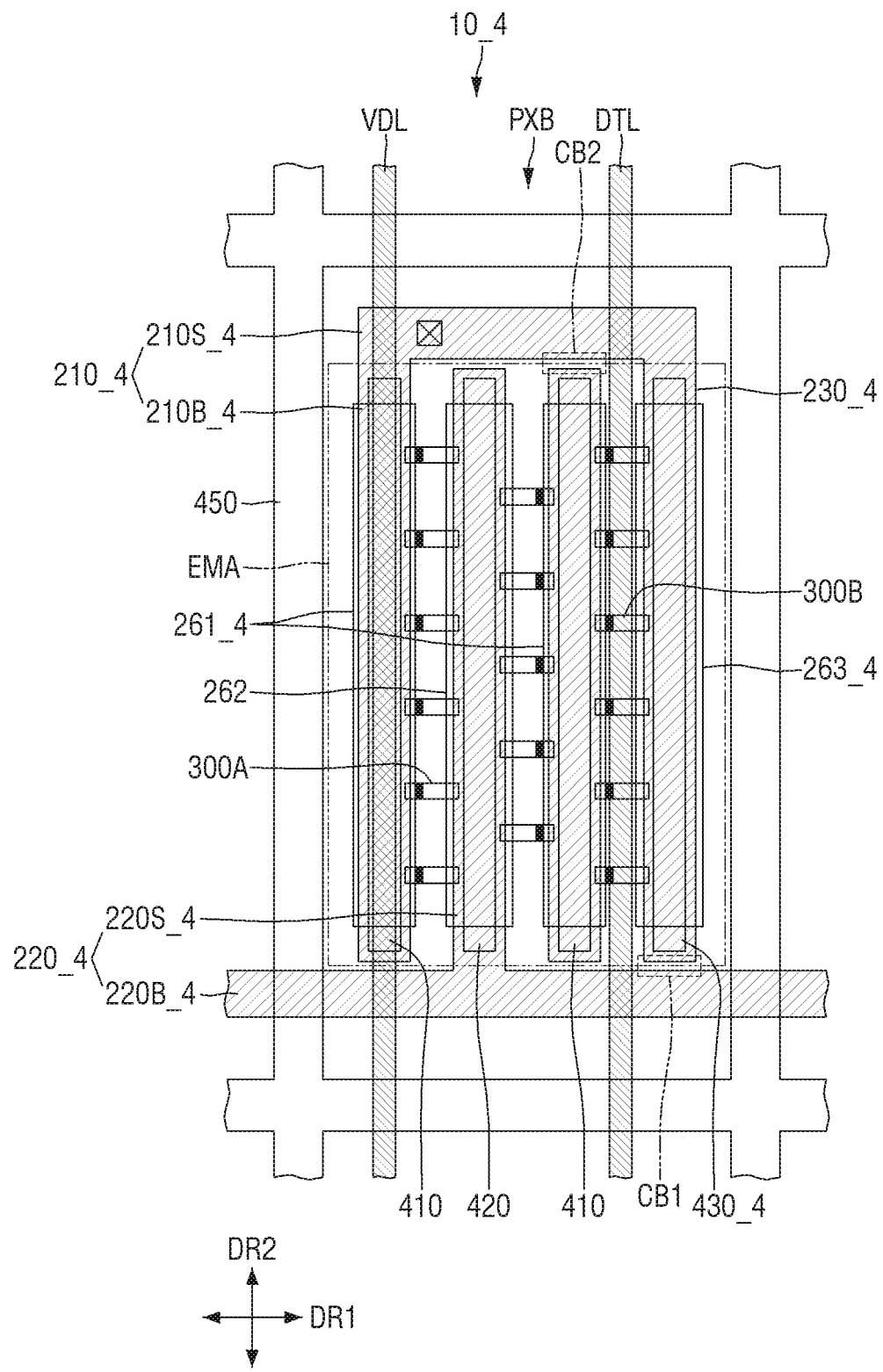
Figure 20:
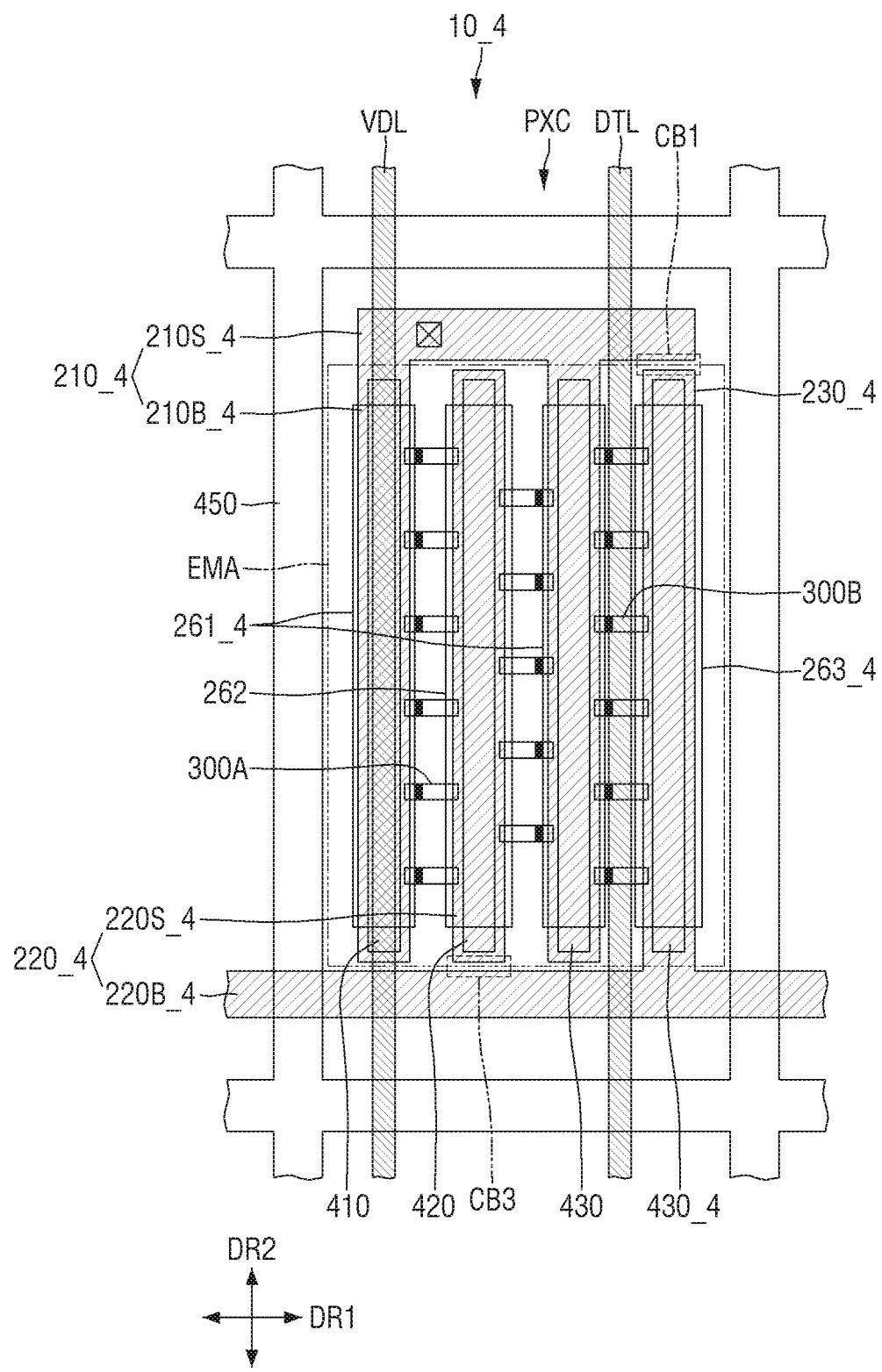

FIGS. 18 to 20 are schematic plan views of a display element layer included in one sub-pixel of a display device according to one or more other embodiments. In FIGS. 18 to 20, for convenience of description, only a first voltage wiring line VDL and a data line DTL are further illustrated in addition to a display element layer.

Referring to FIGS. 18 to 20, in a first display substrate 10_4 of a display device 1 according to one or more embodiments, a larger number of internal banks and electrodes may be further included in each sub-pixel PXn. The electrode further provided for each sub-pixel PXn may be a repair electrode 230_4 that is provided in preparation for a defect in a first electrode 210_4 or a second electrode 220_4. The embodiment of FIGS. 18 to 20 is different from the embodiment of FIG. 7 in that each sub-pixel PXn further includes the repair electrode 230_4.

Each sub-pixel PXn may further include a third internal bank 430_4 provided between a first internal bank 410 and an external bank 450. The third internal bank 430_4 may have the same shape as a second internal bank 420 except for the location thereof. For example, the third internal bank 430_4 may have a shape extending in the second direction DR2 and may be spaced apart and face the first internal bank 410.

The repair electrode 230_4 may be provided on the third internal bank 430_4. The repair electrode 230_4 may have substantially the same shape as each of electrode branch portions 210B_4 and 220B_4. The repair electrode 230_4 may have a shape extending in the second direction DR2 and may be provided on the third internal bank 430_4. The repair electrode 230_4 may be spaced apart from and face a first electrode branch portion 210B_4, and light emitting elements 300 may be provided therebetween.

Further, a third contact electrode 263_4 may be further provided on the repair electrode 230_4. The third contact electrode 263_4 may have substantially the same shape as a first contact electrode 261_4. A redundant detailed description of the arrangement and shape thereof will be omitted.

As the third internal bank 430_4 and the repair electrode 230_4 are further provided, the first electrode 210_4 may have a shape in which a first electrode stem portion 210S_4 further extends. The first electrode stem portion 210S_4 may protrude from a portion, which is connected to any one first electrode branch portion 210B_4, in the first direction DR1, and may face the repair electrode 230_4.

As the third internal bank 430_4 and the repair electrode 230_4 are further provided, each sub-pixel PXn may have a larger area. For example, an area surrounded by the external bank 450 may have a larger width in the first direction DR1. However, a circuit element layer may be provided in the same manner as in FIG. 7. According to one or more embodiments, the third internal bank 430_4 and the repair electrode 230_4 may be provided between the data line DTL and the external bank 450 in a plan view. The data line DTL may extend in the second direction DR2 between the second internal bank 420 and the third internal bank 4304 or between the first internal bank 410 and the third internal bank 430_4 while not overlapping the internal banks. The data line DTL may overlap the light emitting elements 300, which are electrically connected to the repair electrode 230_4, in the thickness direction. However, the present disclosure is not limited thereto.

The light emitting elements 300 may include a first light emitting element 300A provided between the first internal bank 410 and the second internal bank 420 and electrically connected to the first electrode 210_4 and the second electrode 220_4, and a second light emitting element 300B provided between the first internal bank 410 and the third internal bank 430_4 and having at least one end electrically connected to the repair electrode 230_4. The first light emitting element 300A may be the same as the light emitting element 300 described above. However, because one end of the second light emitting element 300B is electrically connected to the repair electrode 230_4, whether light is emitted may be determined according to the connection of the repair electrode 230_4.

For example, as shown in FIG. 18, the first display substrate 10 of the display device 1 may include a first type (e.g., first kind) sub-pixel PXA in which the repair electrode 230_4 is not electrically connected to the first electrode 210_4 or the second electrode 220_4. The repair electrode 230_4 may be provided to be spaced apart from the first electrode stem portion 210S_4 and a second electrode stem portion 220S_4 and may be formed in a disconnected state without being connected thereto ("CB1" in FIG. 18). The repair electrode 230_4 may be provided to be spaced apart from the first electrode stem portion 210S_4 or the second electrode stem portion 220S_4 by being formed in a state of being electrically connected to the first electrode stem portion 210S_4 or the second electrode stem portion 220S_4 and then being disconnected from the electrode stem portions during a manufacturing process.

When the first electrode 210_4 and the second electrode 220_4 are smoothly connected and thus a defect does not occur, the repair electrode 230_4 may be disconnected from each of the electrode stem portions 210S_4 and 220S_4 and may remain as a floating electrode that is not electrically connected thereto. The second light emitting element 300B electrically connected to the repair electrode 230_4 may be provided in the sub-pixel PXn in a state in which an electrical signal is not transmitted thereto and thus light is not emitted. However, the present disclosure is not limited thereto. In some embodiments, when all the electrodes 210_4 and 220_4 and the contact electrodes are smoothly connected, the repair electrode 230_4 may also be provided in a state of being electrically connected to the first electrode 210_4 or the second electrode 220_4.

On the other hand, when either the first electrode 210_4 or the second electrode 220_4 is partially disconnected or the electrical connection is defective, the repair electrode 230_4 may be connected by replacing the disconnected or defective electrode.

As shown in FIGS. 19 and 20, the first display substrate 10_4 may include a second type sub-pixel PXB in which any one first electrode branch portion 210B_4 is disconnected and the repair electrode 230_4 is electrically connected to the first electrode 210_4, and a third type sub-pixel PXC in which a second electrode branch portion 220B_4 is disconnected and the repair electrode 230_4 is electrically connected to the second electrode 220_4.

In the second type sub-pixel PXB, the first electrode branch portion 210B_4 between the second electrode branch portion 220B_4 and the repair electrode 230_4 may be disconnected from the first electrode stem portion 210S_4 ("CB2" in FIG. 19). The repair electrode 230_4 may be electrically connected to the first electrode stem portion 210S_4, and the electrical signal may also be transmitted to the second light emitting elements 300B through the repair electrode 230_4 and the third contact electrode 203_4.

In the third type sub-pixel PXC, the second electrode branch portion 220B_4 may be disconnected from the second electrode stem portion 220S_4 ("CB3" in FIG. 20), and the repair electrode 230_4 may be electrically connected to the second electrode stem portion 220S_4. In the third type sub-pixel PXC, the second electrode branch portion 220B_4 may remain as a floating electrode.

In the first display substrate 10 of the display device 1, the display element layer on which the light emitting elements 300 are provided and the circuit element layer may be provided so as not to overlap in the thickness direction. According to one embodiment, in the first display substrate 10, the light emitting area and the non-light emitting area may be defined as areas distinguished from each other on the first substrate 101. The light emitting elements 300 may be provided in the light emitting area, and the circuit elements may be provided in the non-light emitting area.

Figure 21:
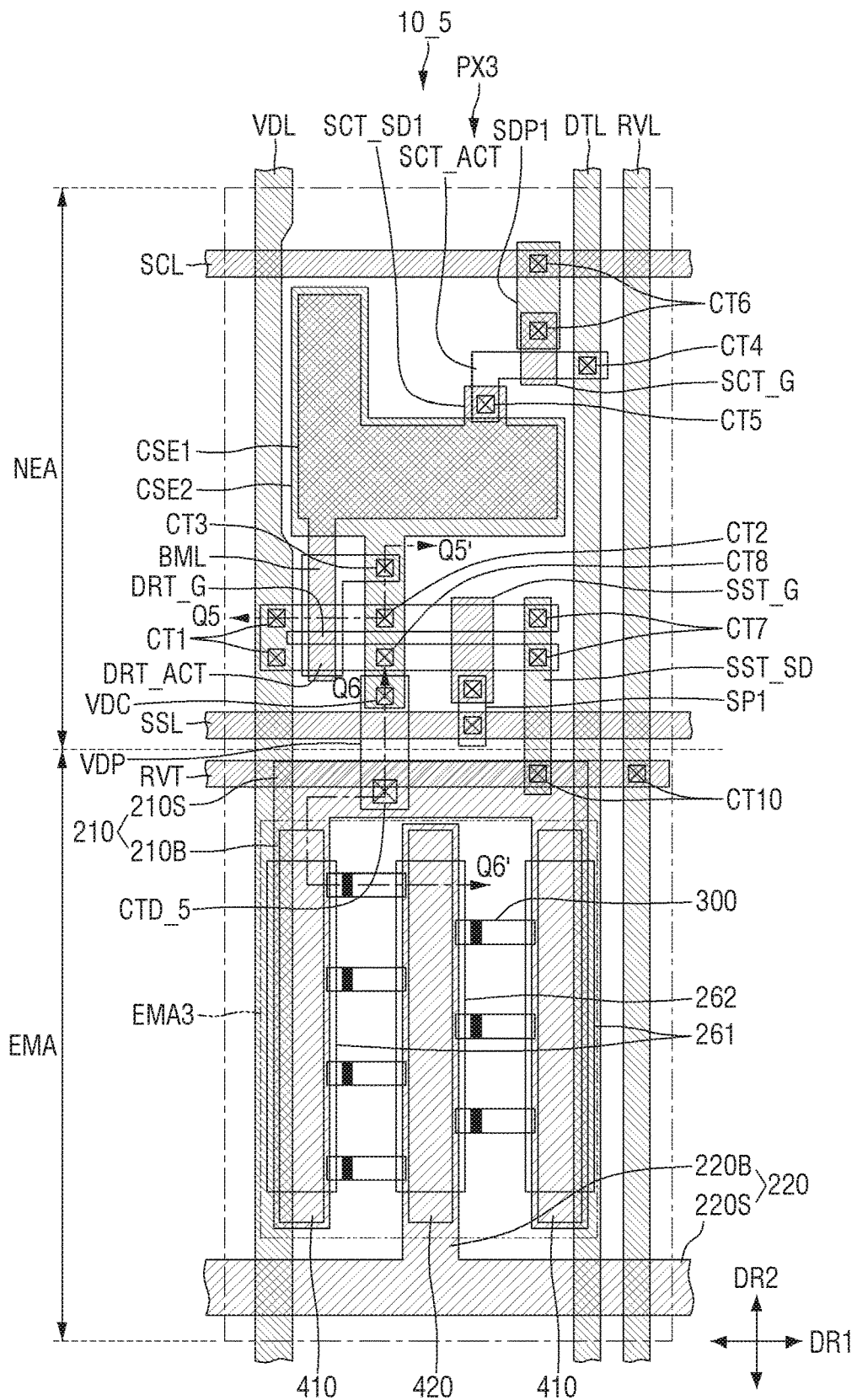
FIG. 21 is a schematic plan view illustrating one sub-pixel of a display device according to one or more other embodiments.
Figure 22:
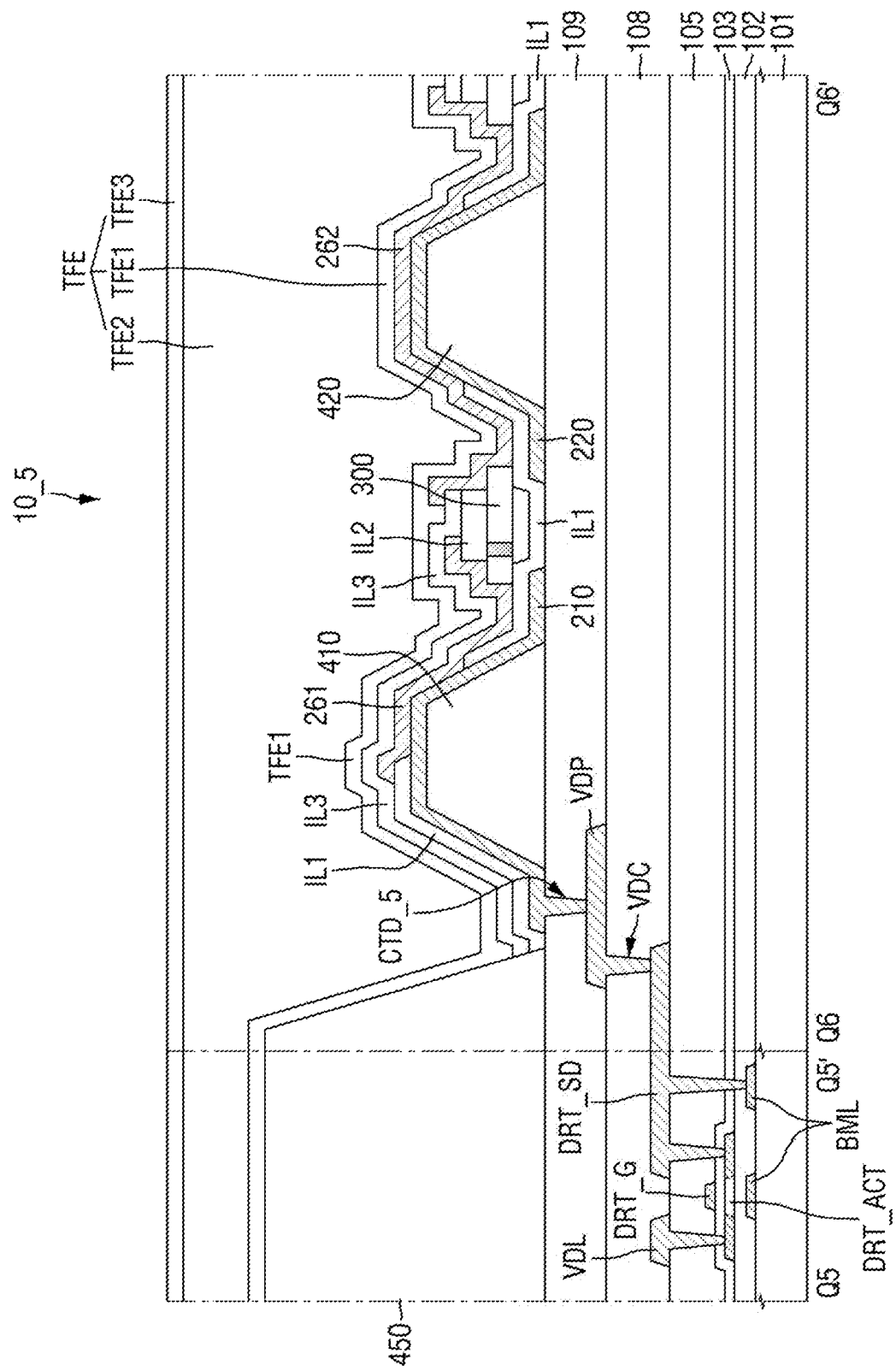
FIG. 22 is a cross-sectional view taken along lines Q5-Q5' and Q6-Q6' of FIG. 21.

FIG. 21 is a schematic plan view illustrating one sub-pixel of a display device according to one or more embodiments. FIG. 22 is a cross-sectional view taken along lines Q5-Q5' and Q6-Q6' of FIG. 21. Portion Q5-Q5' of FIG. 21 is a cross section of a partial area of a non-light emitting area NEA of each sub-pixel PXn and portion Q6-Q6' is a cross section of a partial area of a light emitting area EMA of each sub-pixel PXn.

Referring to FIGS. 21 and 22, in each pixel PX or sub-pixel PXn of a first display substrate 10_5 of a display device according to one embodiment, a display element layer and a circuit element layer may not overlap each other in the thickness direction. Each of the sub-pixels PXn may include a light emitting area EMA, in which light emitting elements 300 are provided, and a non-light emitting area NEA, in which circuit elements such as a driving transistor DRT are provided, which may be respectively provided in areas distinguished from each other on the first substrate 101. For example, the light emitting elements 300 may not be provided on the circuit elements of each sub-pixel PXn, and light may be emitted in an upward or backward direction with respect to an area in which the light emitting elements 300 are provided. Hereinafter, repeated descriptions will be omitted, and descriptions will be provided based on differences from the above-described contents.

Each of the sub-pixels PXn of the first display substrate 10 may include the light emitting area EMA and the non-light emitting area NEA. The light emitting elements 300, and a first electrode 210 and a second electrode 220 may be provided in the light emitting area EMA, and circuit elements including the driving transistor DRT may be provided in the non-light emitting area NEA located on one side of the light emitting area EMA. In FIG. 21, the light emitting area EMA and the non-light emitting area NEA are illustrated as being provided in the second direction DR2, but the present disclosure is not limited thereto. In the display device of the first display substrate 10, the arrangement of the light emitting area EMA and the non-light emitting area NEA is not particularly limited as long as the light emitting element 300 and the circuit elements provided in each of the sub-pixels PXn do not overlap each other in the thickness direction.

For example, a semiconductor layer including active layers of each of transistors, a first gate conductive layer, and a first data conductive layer may be provided in the non-light emitting area NEA. However, as wiring lines included in the first gate conductive layer and the first data conductive layer, a first voltage wiring line VDL, a data line DTL, a reference voltage wiring line RVL, and a second voltage wiring line VSL may be provided to extend in the second direction DR2 and thus may be provided over the non-light emitting area NEA and the light emitting area EMA.

In the light emitting area EMA, in addition to the wiring lines extending in the second direction DR2, internal banks 410 and 420, the electrodes 210 and 220, the light emitting elements 300, and contact electrodes 261 and 262 may be provided. These may be provided not to overlap the circuit element layer in the thickness direction. For example, a plurality of light emitting elements 300 may not overlap a first capacitor electrode CSE1 and a second capacitor electrode CSE2. The arrangement of the internal banks 410 and 420, the electrodes 210 and 220, the light emitting elements 300, and the contact electrodes 261 and 262 are substantially the same as described above with reference to FIG. 8.

Because the display elements and the circuit elements are provided in the light emitting area EMA and the non-light emitting area NEA, respectively, a larger number of layers may be provided to electrically connect the display elements and the circuit elements. According to one embodiment, the first display substrate 10_5 may further include a second interlayer insulating layer 108 and a second data conductive layer provided between a first planarization layer 109 and the first data conductive layer. The second interlayer insulating layer 108 may be provided on the first data conductive layer and the first interlayer insulating layer 105, and the second data conductive layer may be provided on the second interlayer insulating layer 108. The description of the second interlayer insulating layer 108 is substantially the same as described above with respect to the first interlayer insulating layer 105.

The second data conductive layer may include a third conductive pattern VDP provided at a boundary of the light emitting area EMA and the non-light emitting area NEA. The third conductive pattern VDP may be in contact with a source/drain electrode DRT_SD of the driving transistor DRT through a contact hole VDC that exposes a portion of the source/drain electrode DRT_SD of the driving transistor DRT through the second interlayer insulating layer 108. The contact hole VDC may be formed in the non-light emitting area NEA. The first electrode 210 may be formed in an area in which a first electrode stem portion 210S overlap the third conductive pattern VDP, and may be in contact with the third conductive pattern VDP through an electrode contact hole CTD_5 that exposes a portion of an upper surface of the third conductive pattern VDP through the first planarization layer 109. The first electrode 210 may be electrically connected to the driving transistor DRT through the third conductive pattern VDP.

An external bank 450 may be provided to surround the light emitting area EMA in which the light emitting elements 300 are provided, and may entirely cover the non-light emitting area NEA. According to one embodiment, the external bank 450 may be provided to cover the non-light emitting area NEA and may be provided to expose the light emitting area EMA in which the light emitting elements 300 are provided. For example, the external bank 450 may have a structure that is entirely provided on the first substrate 101 and has an opening formed so as to expose a portion of the light emitting area EMA. In addition, the arrangement of each of the wiring lines and the conductive layers, the electrode, and the light emitting element is the same as described above, and thus, a redundant detailed description thereof will be omitted.

In the display device according to one embodiment, the first display substrate 10_5 may include the light emitting area EMA and the non-light emitting area NEA that are areas distinguished from each other. Because the light emitting elements 300 are provided in the light emitting area EMA, and pixel circuit elements are provided in the non-light emitting area NEA, the light emitting element 300 and the pixel circuit element may not overlap each other in the thickness direction. In the first display substrate 10_5, light emitted from the light emitting element 300 may be emitted in a backward direction with respect to the first substrate 101, in addition to an upward direction with respect to the first substrate 101, and the first display substrate 10_5 may have a bottom emission structure.

Meanwhile, in the display device 1, the second display substrate 50 may include more members. More color control structures may be provided between the second substrate 501 of the second display substrate 50 and the thin-film encapsulation structure TFE of the first display substrate 10.

Figure 23:
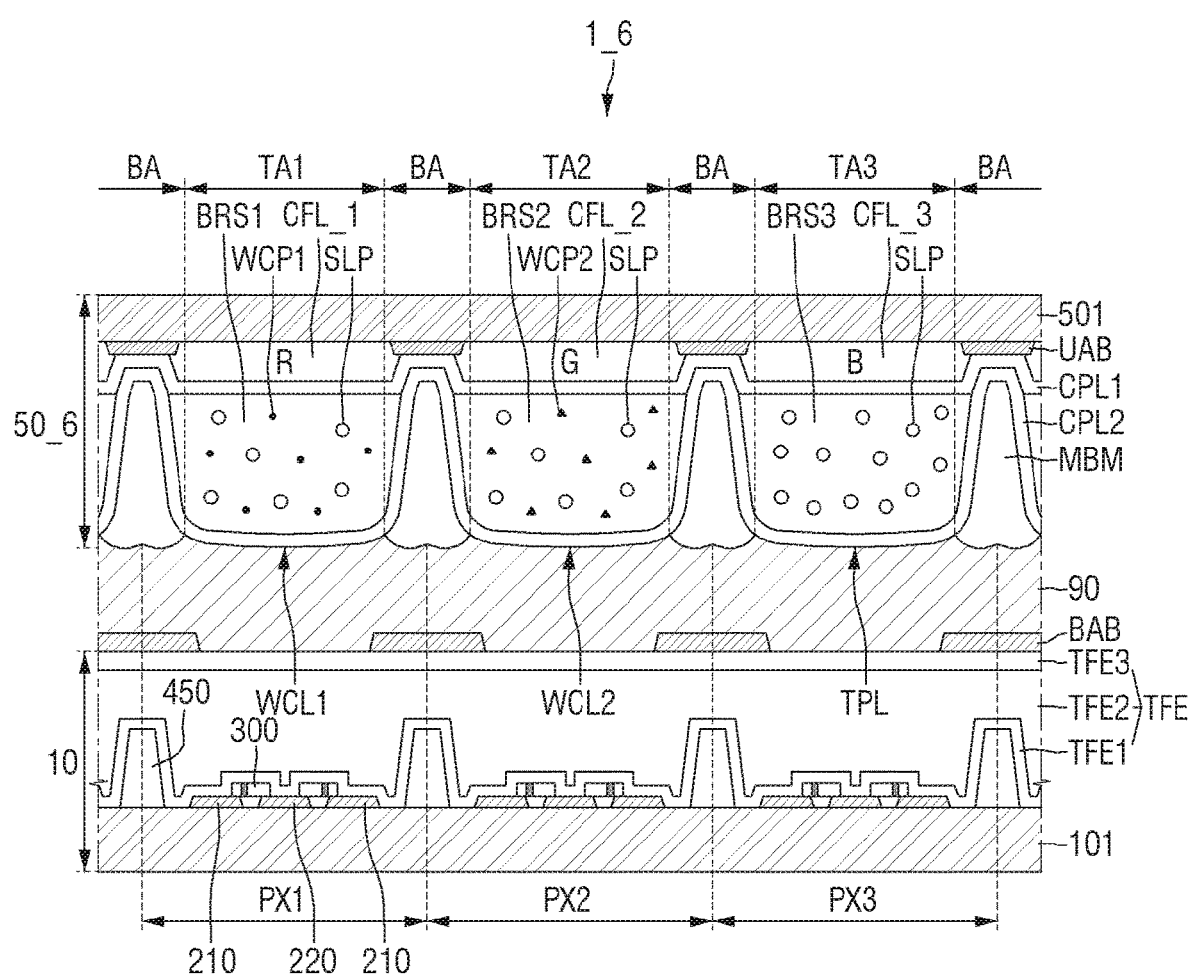
FIG. 23 is a schematic cross-sectional view of a display device according to one or more other embodiments.

FIG. 23 is a schematic cross-sectional view of a display device according to one or more other embodiments.

Referring to FIG. 23, in a display device 1_6 according to one or more embodiments, a second display substrate 50_6 may further include color control layers WCL and TPL and a color mixing prevention member MBM. The display device 1_6 of FIG. 23 is different from the embodiment of FIG. 12 in that the second display substrate 50_6 further includes the color control layers WCL and TPL and the color mixing prevention member MBM. Hereinafter, repeated descriptions will be omitted, and descriptions will be provided based on differences from the above-described contents.

The color control layers WCL and TPL may be provided on a first capping layer CPL1 of the second display substrate 50_6. The color control layers may include a wavelength conversion layer WCL that converts a wavelength of incident light and/or a light-transmitting layer TPL that allows incident light to pass therethrough in a state in which a wavelength of the incident light is maintained. The wavelength conversion layer WCL and/or the light-transmitting layer TPL may be provided separately for each sub-pixel PXn. The wavelength conversion layer WCL and/or the light-transmitting layer TPL may overlap a light emitting area EMA and a light outputting area TA in the thickness direction. Adjacent wavelength conversion layers WCL and/or light-transmitting layers TPL may be spaced apart from each other. The separation space between the adjacent wavelength conversion layers WCL and/or light-transmitting layers TPL may substantially overlap a light blocking area BA. The separation space forms a valley having a grid shape in a plan view.

The wavelength conversion layer WCL may be provided on the sub-pixel PXn in which a wavelength of light incident from a light emitting element 300 is different from a color of the corresponding sub-pixel PXn and thus the wavelength of the light needs to be converted. The light-transmitting layer TPL may be provided on the sub-pixel PXn in which a wavelength of light incident from the light emitting element 300 is the same as a color of the corresponding sub-pixel PXn. In the display device 1_6 of FIG. 23, the light emitting element 300 of each sub-pixel PXn emits light of a third color, and thus the wavelength conversion layer WCL may be provided on a first sub-pixel PX1 and a second sub-pixel PX2, and the light-transmitting layer TPL may be provided on a third sub-pixel PX3. However, the present disclosure is not limited thereto, and when the light emitting element 300 of each sub-pixel PXn emits light, which has a wavelength different from that of each light outputting area TA, such as ultraviolet light, only the wavelength conversion layer WCL may be provided without the light-transmitting layer TPL. As another example, when the light emitting element 300 of each sub-pixel PXn emits light corresponding to a color of each light outputting area TA, only the light-transmitting layer TPL may be provided without the wavelength conversion layer WCL.

In the illustrated embodiment, the wavelength conversion layer WCL may include a first wavelength conversion pattern WCL1 provided in the first sub-pixel PX1 and a second wavelength conversion pattern WCL2 provided in the second sub-pixel PX2.

The first wavelength conversion pattern WCL1 may include a first base resin BRS1 and a first wavelength conversion material WCP1 provided in the first base resin BRS1. The second wavelength conversion pattern WCL2 may include a second base resin BRS2 and a second wavelength conversion material WCP2 provided in the second base resin BRS2. The light-transmitting layer TPL may include a third base resin BRS3 and scatterers SLP provided in the third base resin BRS3.

The first to third base resins BRS1, BRS2, and BRS3 may include a transparent organic material. For example, the first to third base resins BRS1, BRS2, and BRS3 may be made of an epoxy-based resin, an acrylic-based resin, a cardo-based resin, an imide-based resin, or the like. All of the first to third base resins BRS1, BRS2, and BRS3 may be made of the same material, but the present disclosure is not limited thereto.

The scatterers SLP may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide ($ZnO$), tin oxide ($SnO_2$), and the like. Examples of a material of the organic particle may include an acrylic-based resin, a urethane-based resin, and the like.

The first wavelength conversion material WCP1 may be a material that converts blue light into red light, and the second wavelength conversion material WCP2 may be a material that converts blue light into green light. The first wavelength conversion material WCP1 and the second wavelength conversion material WCP2 may be quantum dots, quantum rods, fluorescent materials, or the like. The quantum dots may include group IV-based nanocrystals, group II-VI-based compound nanocrystals, group III-V-based compound nanocrystals, group IV-VI-based nanocrystals, or combinations thereof. The first wavelength conversion pattern WCL1 and the second wavelength conversion pattern WCL2 may further include the scatterers SLP for increasing wavelength conversion efficiency.

The light-transmitting layer TPL provided in the third sub-pixel PX3 transmits blue light incident from the light emitting element 300 while maintaining a wavelength of the blue light. The scatterers SLP of the light-transmitting layer TPL may serve to scatter light and adjust an emission angle of light emitted through the light-transmitting layer TPL. The light-transmitting layer TPL may not include a wavelength conversion material.

A second capping layer CPL2 is provided on the wavelength conversion layer WCL and the light-transmitting layer TPL. The second capping layer CPL2 may be made of an inorganic material. The second capping layer CPL2 may be made of at least one material selected from the materials described as the materials of the first capping layer CPL1. The second capping layer CPL2 and the first capping layer CPL1 may be made of the same material, but the present disclosure is not limited thereto.

The second capping layer CPL2 may cover each of the wavelength conversion patterns WCL1 and WCL2 and the light-transmitting layer TPL. The second capping layer CPL2 may cover not only one surface but also side surfaces of each of the wavelength conversion patterns WCL1 and WCL2 and the light-transmitting layer TPL. The second capping layer CPL2 may be in contact with the first capping layer CPL1 in a separation space between adjacent color control layers WCL and TPL. The second capping layer CPL2 may have a shape conformal to a surface stepped portion formed by the color control layers WCL and TPL. A valley of the separation space between the color control layers WCL and TPL may not be completely filled with the second capping layer CPL2 and may have a certain depth.

The color mixing prevention member MBM is provided on the second capping layer CPL2. The color mixing prevention member MBM is made of a material capable of blocking or reducing light transmission and serves to prevent or reduce the intrusion of light into adjacent sub-pixels PXn to cause color mixing. The color mixing prevention member MBM may be provided along a boundary between the sub-pixels PXn. For example, the color mixing prevention member MBM may be provided along the separation space between the color control layers WCL and TPL. The color mixing prevention member MBM may fill the valley formed in the separation space between the color control layers WCL and TPL. The present disclosure is not limited thereto, and one surface of the color mixing prevention member MBM may further protrude in the thickness direction as compared with a corresponding one surface of each of the color control layers WCL and TPL. A height (or thickness) by which the color mixing prevention member MBM protrudes from the surrounding wavelength conversion pattern WCL1 or WCL2 and/or the light-transmitting layer TPL may be in a range of 1 µm to 3 µm, a range of 1.4 µm to 1.8 µm, or about 1.6 µm, but the present disclosure is not limited thereto.

The color mixing prevention member MBM may include an organic material. The color mixing prevention member MBM may include a light absorbing material that absorbs a visible light wavelength range. In one embodiment, the color mixing prevention member MBM may include an organic light-blocking material. The color mixing prevention member MBM is a kind of light-blocking member, and may be made of the same material as that of the above-described upper light absorbing member UAB, but the present disclosure is not limited thereto.

Figure 24:
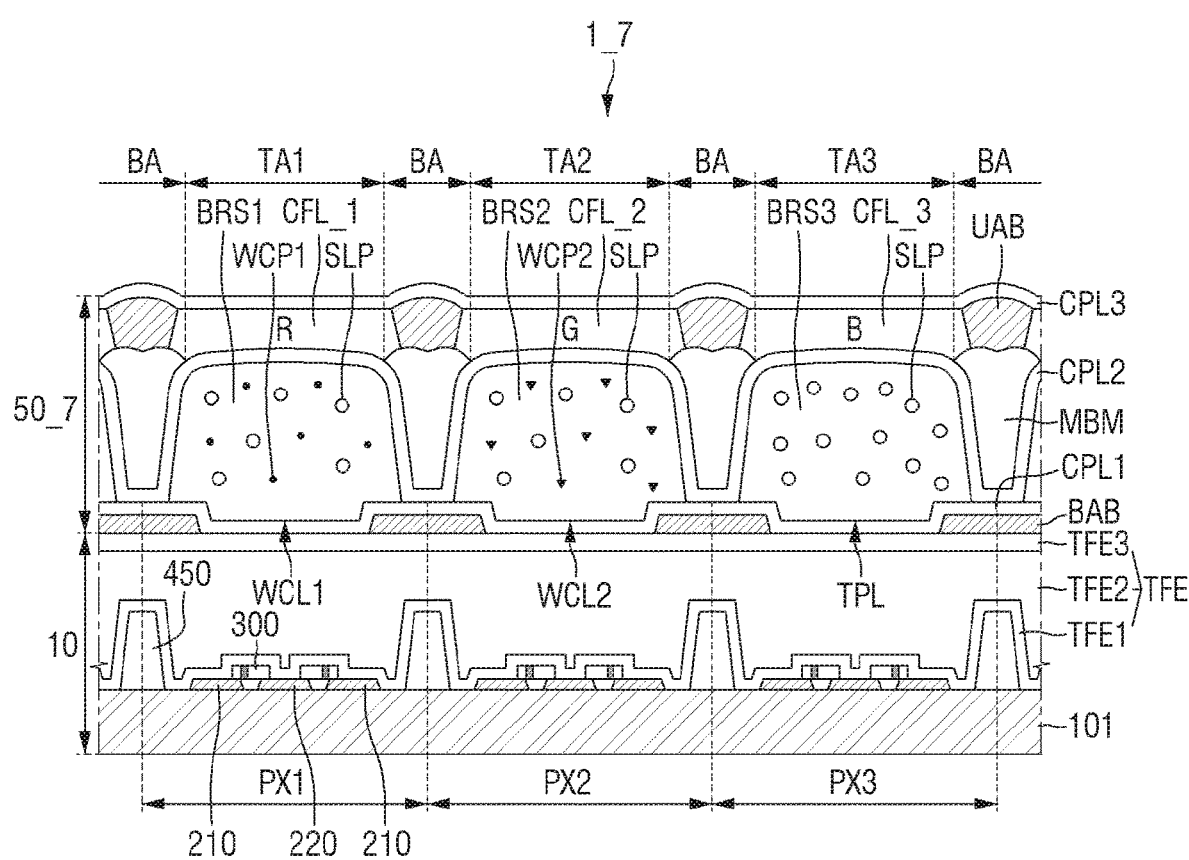
FIG. 24 is a schematic cross-sectional view of a display device according to one or more other embodiments.

FIG. 24 is a schematic cross-sectional view of a display device according to one or more other embodiments.

Referring to FIG. 24, in a display device 1_7 according to one or more embodiments, color control layers WCL and TPL and a color mixing prevention member MBM of a second display substrate 50_7 may be provided directly on a first display substrate 10. According to one embodiment, a second substrate 501 may be omitted, and the second display substrate 50_7 may be formed to be substantially integrated with the first display substrate 10.

For example, a first capping layer CPL1 may be provided on a lower light absorbing member BAB of the first display substrate 10. The color control layers WCL and TPL may be provided on the first capping layer CPL1 to correspond to each sub-pixel PXn, and a second capping layer CPL2 may be provided on the color control layers WCL and TPL. The color mixing prevention member MBM is provided in a valley between adjacent color control layers WCL and TPL on the second capping layer CPL2. A color filter layer CFL and an upper light absorbing member UAB may be provided on the second capping layer CPL2 and the color mixing prevention member MBM for each sub-pixel PXn, and a third capping layer CPL3 may be provided on the color filter layer CFL and the upper light absorbing member UAB.

In the display device 1_7 of FIG. 24, a light outputting area TA and a light blocking area BA may be defined by the color mixing prevention member MBM and/or the color control layers WCL and TPL. In addition, because the members of the second display substrate 50_7 may be directly formed on the first display substrate 10, a filler 90 and a sealing portion 70 for coupling the first display substrate 10 and the second display substrate 50_7 may be omitted. Hereinafter, repeated descriptions will be omitted.

Figure 25:
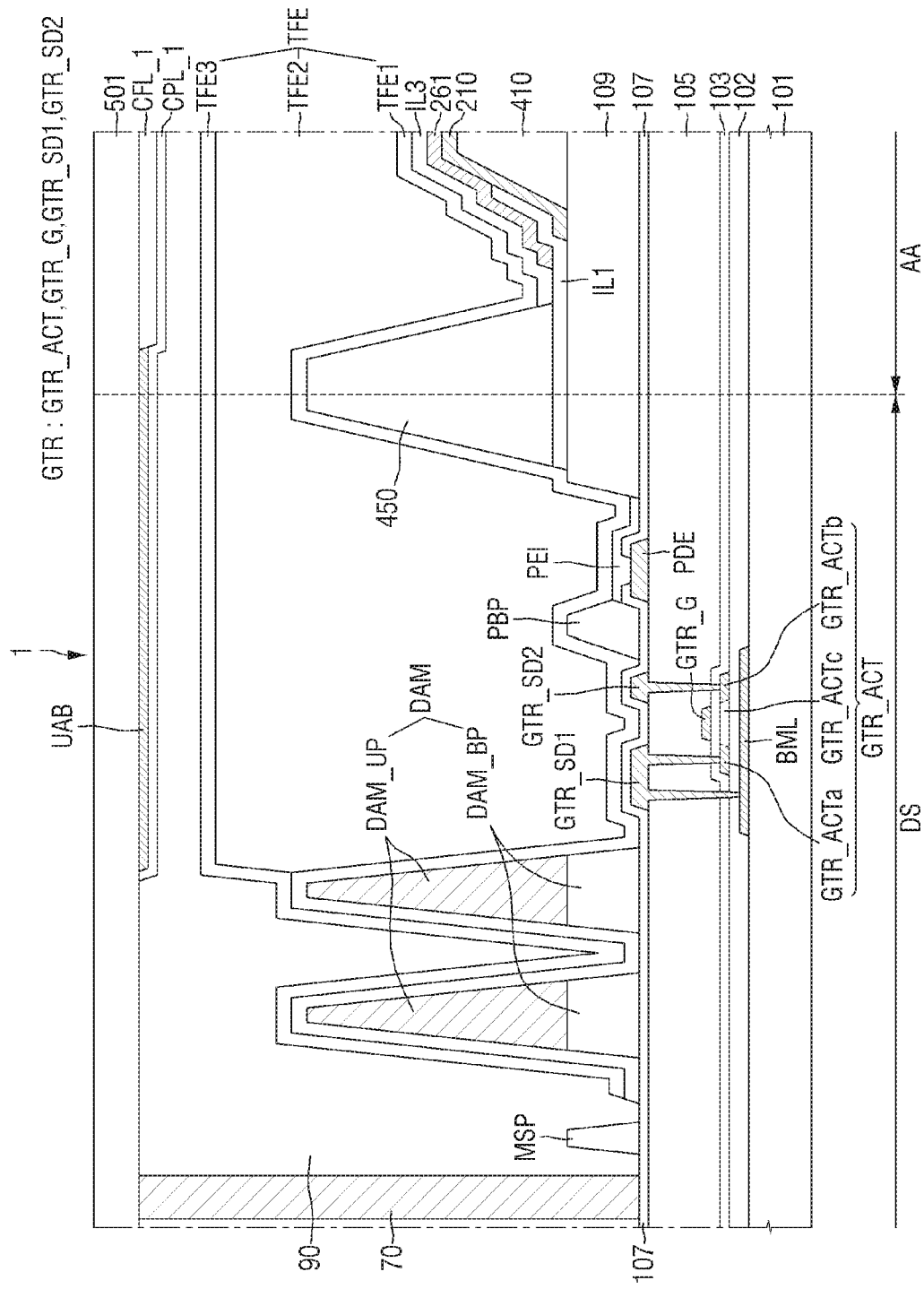
FIG. 25 is a schematic cross-sectional view of a portion of the display device, in which an inactive area is located, according to one or more embodiments.

FIG. 25 is a schematic cross-sectional view of a portion of the display device, in which the inactive area is located, according to one or more embodiments.

Referring to FIG. 25, a metal wiring line PDE, a transistor GTR of the scan driver SDR, a dam structure DAM, and a plurality of patterns PBP and MSP may be provided in the inactive area DS of the display device 1. The metal wiring line PDE, the transistor GTR of the scan driver SDR, and the dam structure DAM may be sequentially provided from the active area AA to an outermost portion of the display device 1. However, the present disclosure is not limited thereto.

The metal wiring line PDE may be provided on the first interlayer insulating layer 105 and may be provided in the inactive area DS of the first display substrate 10. For example, the metal wiring line PDE may be provided on the same layer as the first data conductive layer of the active area AA. Although not specifically illustrated in the drawing, a plurality of metal wiring lines PDE may be provided in the inactive area DS and may be electrically connected to the wiring lines provided in the active area AA. For example, the metal wiring line PDE may be electrically connected to a plurality of wiring lines provided in the active area AA, such as the first voltage wiring line VDL, the second voltage wiring line VSL, the data line DTL, and the reference voltage wiring line RVL. The metal wiring line PDE may extend in the inactive area DS along the active area AA and may be connected to the pads WPD provided in the pad area PDA, and the wiring lines provided in the active area AA may be electrically connected to the pad WPD through the metal wiring line PDE. An electrical signal may be applied to the wiring line through the metal wiring line PDE.

On the metal wiring line PDE, a wiring line protective layer PEI may be further provided in addition to the first protective layer 107. The wiring line protective layer PEI may include an insulating material and protect the metal wiring line PDE.

An insulation pattern PBP may be provided to be spaced apart from the metal wiring line PDE. The insulation pattern PBP may be substantially the same layer as the first planarization layer 109. For example, the insulation pattern PBP may have the same material and the same thickness as the first planarization layer 109.

The transistor GTR of the scan driver SDR may be provided in the inactive area DS of the first display substrate 10. In the drawing, it is illustrated that only one transistor GTR is provided, but the present disclosure is not limited thereto, and one or more transistors GTR may be provided according to the driving circuit of the scan driver SDR. The transistor GTR of the scan driver SDR may include an active layer GTR_ACT (see FIG. 25), a gate electrode GTR_G (see FIG. 25), and source/drain electrodes GTR_SD1 and GTR_SD2 (see FIG. 25), similar to the driving transistor DRT. The description thereof is the same as described above with reference to the driving transistor DRT.

In addition, a light blocking layer BML may be provided below the active layer GTR_ACT of the transistor GTR of the scan driver SDR, and a first source/drain electrode GTR_SD1 of the transistor GTR of the scan driver SDR may be connected to the light blocking layer BML. However, the present disclosure is not limited thereto.

The dam structure DAM may be provided on an outer periphery of the scan driver SDR. A plurality of dam structures DAM may be provided in the inactive area DS, and the number thereof is not particularly limited. In the embodiments, although only a cross-sectional shape of the dam structure DAM is shown in the drawing, the dam structure DAM may be provided to surround the active area AA of the first display substrate 10. For example, the dam structure DAM may be provided in a shape extending in the first direction DR1 and the second direction DR2.

The dam structure DAM may include a plurality of layers. As an example, the dam structure DAM may include a dam base layer DAM_BP and a dam upper layer DAM_UP provided on the dam base layer DAM_BP. The dam base layer DAM_BP and the dam upper layer DAM_UP may be formed simultaneously (e.g., concurrently) with the layers provided in the active area AA. For example, the dam base layer DAM_BP may be formed in the same process as the first planarization layer 109, and a thickness of the dam base layer DAM_BP may be the same as a thickness of the first planarization layer 109. The dam upper layer DAM_UP may be formed in the same process as the external bank 450. However, the first insulating layer IL1 may be provided between the external bank 450 and the first planarization layer 109, and the dam upper layer DAM_UP may be directly provided on the dam base layer DAM_BP. The dam upper layer DAM_UP and the external bank 450 may have different thicknesses or heights, but the present disclosure is not limited thereto.

A dummy pattern MSP may be further provided between the sealing portion 70 and the dam structure DAM. The dummy pattern MSP may be provided on an outermost portion of the inactive area DS of the first display substrate 10. The dummy pattern MSP may support masks used in a process of forming the members provided on the first display substrate 10. As an example, the dummy pattern MSP may serve as a mask support during a manufacturing process of the first display substrate 10.

Figure 26:
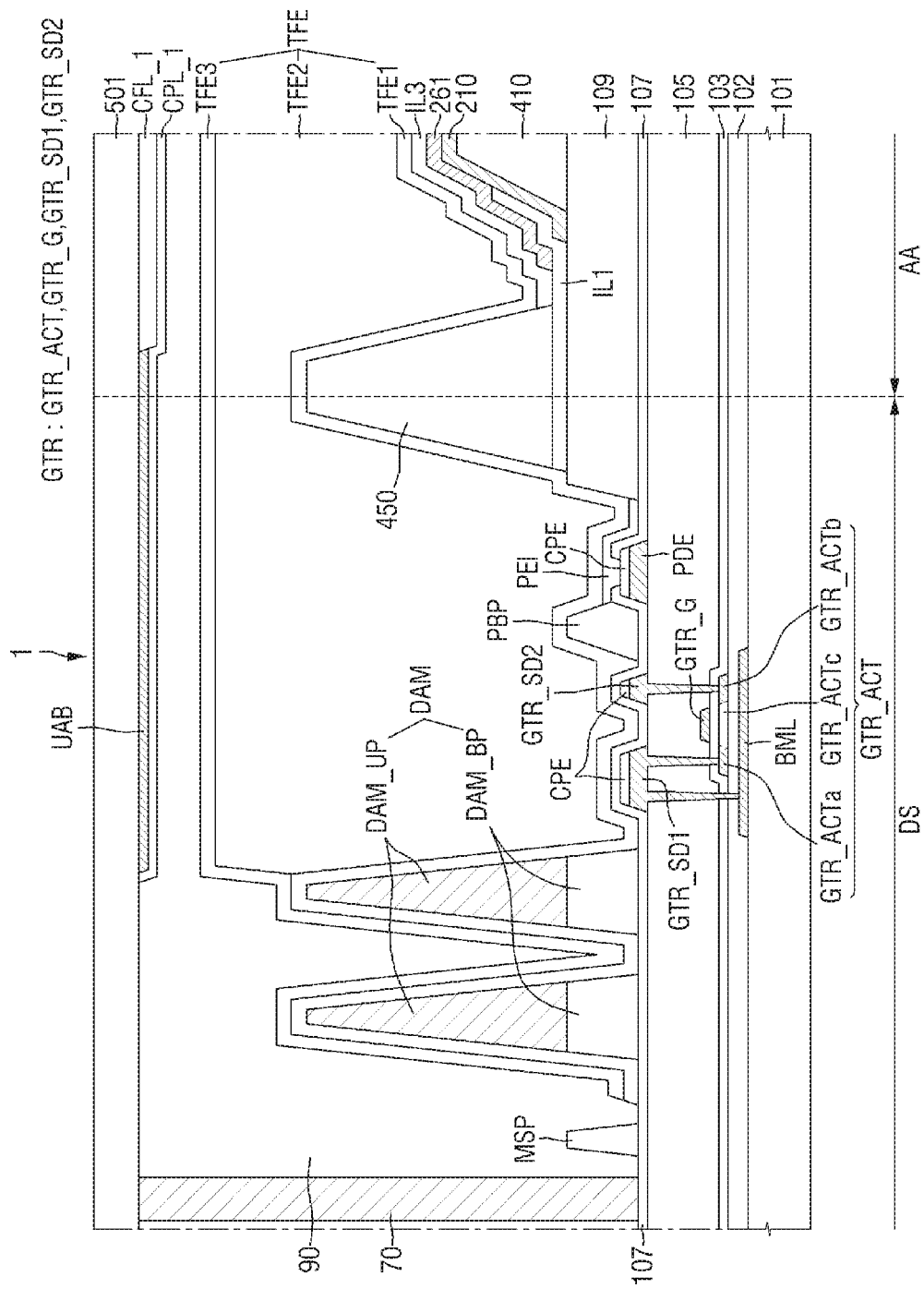
FIGS. 26 and 27 are schematic cross-sectional views of a portion of a display device, in which an inactive area is located, according to one or more other embodiments.
Figure 27:
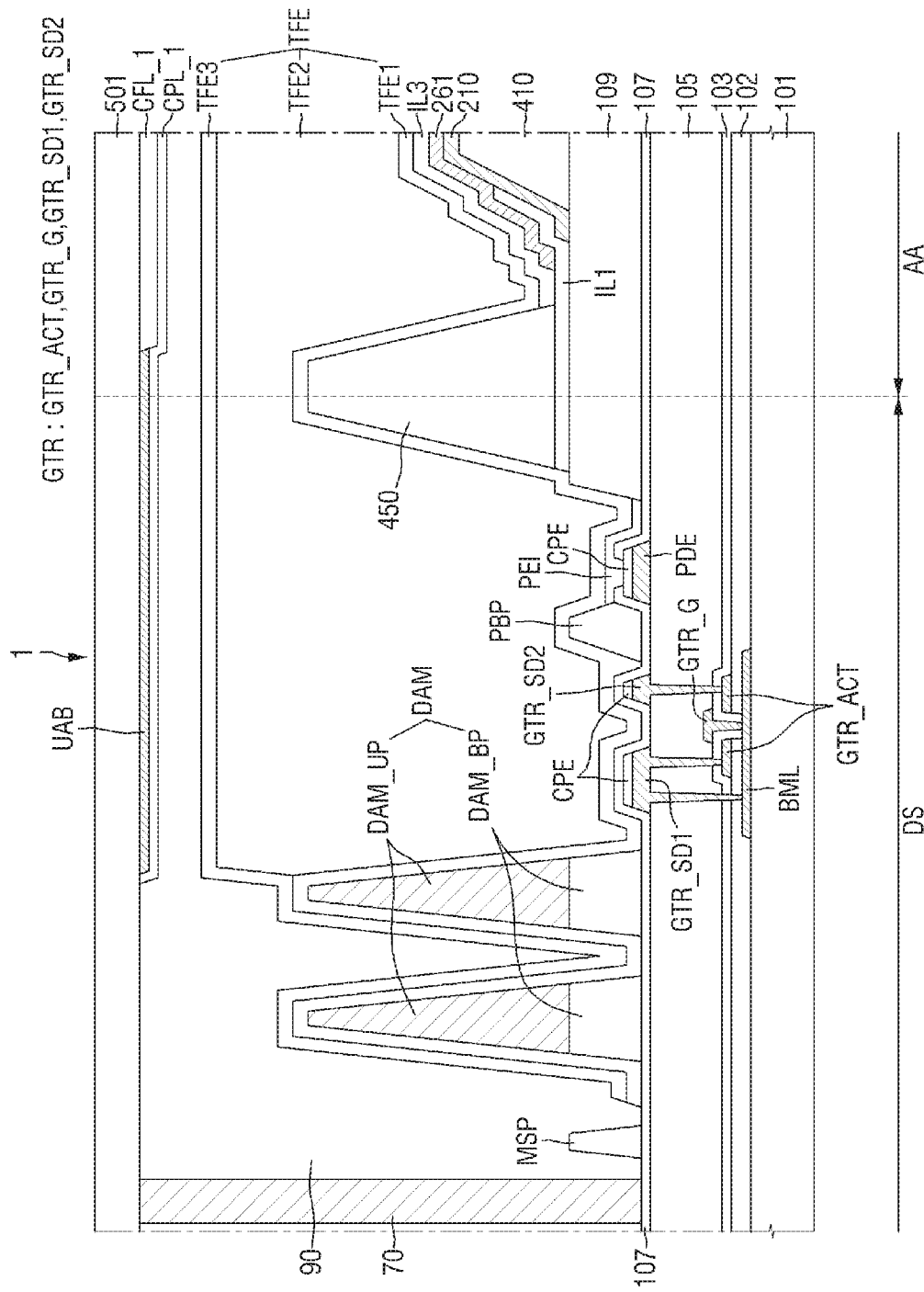

FIGS. 26 and 27 are schematic cross-sectional views of a portion of a display device, in which an inactive area is located, according to one or more other embodiments.

Referring to FIG. 26, a display device 1 may further include a capping electrode layer CPE provided on a first data conductive layer. The capping electrode layer CPE may be provided on wiring lines included in the first data conductive layer, for example, a metal wiring line PDE, source/drain electrodes GTR_SD1 and GTR_SD2 of a transistor GTR of a scan driver SDR. In addition, although not shown in the drawing, the capping electrode layer CPE may also be provided on the first data conductive layer provided in the active area AA, such as a first voltage wiring line VDL, a data line DTL, a reference voltage wiring line RVL, and source/drain electrodes of each of transistors.

The capping electrode layer CPE may be provided to lower (reduce) contact resistance between electrodes or wiring lines, which are provided in the first data conductive layer, and members which are provided in another layer, in an area in which the electrodes or the wiring lines are in contact with the members. For example, when a first electrode 210 is in contact with a source/drain electrode DRT_SD of a driving transistor DRT, or a second electrode 220 is in contact with a second conductive pattern VCP, the capping electrode layer CPE may be provided therebetween to lower contact resistance. In one or more embodiments, the capping electrode layer CPE may include materials such as indium tin oxide (ITO), indium zinc oxide (IZO), indium tin-zinc oxide (ITZO), and the like, but the present disclosure is not limited thereto.

Referring to FIG. 27, in the display device 1, a gate electrode GTR_G of the transistor GTR of the scan driver SDR may be connected to a light blocking layer BML. The gate electrode GTR_G of the transistor GTR of the scan driver SDR may have the same voltage as the light blocking layer BML, the gate electrode GTR_G may serve as an upper gate electrode, and the light blocking layer BML may serve as a lower gate electrode. The transistor GTR of the scan driver SDR may be driven in a double gate manner, and may prevent or reduce leakage current from flowing in a channel area GTR_ACTc of the active layer GTR_ACT when the transistor GTR is turned off. Other repeated descriptions will be omitted.

In concluding the detailed description, those skilled in the art will appreciate that many variations and modifications can be made to the embodiments described herein without substantially departing from the principles of the present disclosure. Therefore, the disclosed embodiments of the present disclosure are used in a generic and descriptive sense only and not for purposes of limitation.

The invention claimed is:

1. A display device comprising:
    a first voltage wiring line extending in a first direction;
    a data line spaced apart from the first voltage wiring line and extending in the first direction;

a scan line extending in a second direction different from the first direction;

a sensing line spaced apart from the scan line and extending in the second direction;

a first internal bank and a second internal bank on the first voltage wiring line and the data line and extending in the first direction, the first internal bank and the second internal bank being spaced apart from each other and facing each other;

a first electrode on the first internal bank and extending in the first direction;

a second electrode on the second internal bank and extending in the first direction;

a plurality of light emitting elements between the first electrode and the second electrode, a reference voltage wiring line extending in the first direction and spaced apart from the data line in the second direction; and a reference voltage distribution line extending in the second direction and spaced apart from the sensing line in the first direction, wherein each of the plurality of light emitting elements comprises a semiconductor core comprising a light emitting layer, and an insulating film around at least a portion of an outer surface of the semiconductor core, and wherein the data line is between the first voltage wiring line and the reference voltage wiring line, and the sensing line is between the scan line and the reference voltage distribution line.

2. The display device of claim 1, wherein the reference voltage distribution line is electrically connected to the reference voltage wiring line.

3. The display device of claim 2, further comprising a second voltage wiring line extending in the first direction and spaced apart from the reference voltage wiring line, wherein the first electrode is electrically connected to the first voltage wiring line through a driving transistor, and the second electrode is electrically connected to the second voltage wiring line.

4. The display device of claim 3, wherein the second voltage wiring line further comprises a portion extending in the second direction, and the portion of the second voltage wiring line extending in the second direction partially overlaps the second electrode in a plan view.

5. The display device of claim 1, wherein the first internal bank partially overlaps the first voltage wiring line in a plan view, and the second internal bank does not overlap the data line in a thickness direction of the display device.

6. The display device of claim 5, further comprising an external bank extending in the first direction and the second direction to surround an area in which the first internal bank and the second internal bank are provided, wherein the first voltage wiring line extends in the first direction between the second internal bank and the external bank, and the data line overlaps, in the thickness direction, a portion of the external bank that extends in the first direction.

7. The display device of claim 5, further comprising a shielding electrode comprising at least a portion overlapping the first electrode, the shielding electrode being around an area in which the plurality of light emitting elements are provided, wherein the shielding electrode covers a portion of an outer side of each of the first electrode and the first internal bank with respect to the area in which the plurality of light emitting elements are provided.

8. The display device of claim 5, further comprising:

a third internal bank spaced apart from and facing the first internal bank; and a repair electrode on the third internal bank, wherein the plurality of light emitting elements further comprise a first light emitting element between the first electrode and the second electrode, and a second light emitting element between the first electrode and the repair electrode.

9. The display device of claim 1, wherein the semiconductor core of the each of the plurality of light emitting elements further comprises a first semiconductor layer and a second semiconductor layer, and the light emitting layer is between the first semiconductor layer and the second semiconductor layer, and the insulating film is around at least an outer surface of the light emitting layer.

10. The display device of claim 9, further comprising:

a first contact electrode on the first electrode, the first contact electrode being electrically connected to the first electrode and to one end of a light emitting element of the plurality of light emitting elements; and a second contact electrode on the second electrode, the second contact electrode being electrically connected to the second electrode and to another end of the light emitting element.

11. A display device comprising:

a first substrate;

a semiconductor layer on the first substrate, the semiconductor layer comprising a first active layer of a driving transistor;

a first gate insulating layer on the first substrate and the semiconductor layer;

a first gate conductive layer on the first gate insulating layer, the first gate conductive layer comprising a first gate electrode of the driving transistor;

a first interlayer insulating layer on the first gate conductive layer;

a first data conductive layer on the first interlayer insulating layer, the first data conductive layer comprising a source electrode and a drain electrode of the driving transistor, and a first voltage wiring line;

a first protective layer on the first data conductive layer;

a first planarization layer on the first protective layer;

a first internal bank and a second internal bank on the first planarization layer, the first internal bank and the second internal bank being spaced apart from each other and facing each other;

a first electrode and a second electrode on the first internal bank and the second internal bank, respectively; and a light emitting element between the first electrode and the second electrode, wherein the light emitting element comprises a semiconductor core comprising a light emitting layer, and an insulating film around at least a portion of an outer surface of the semiconductor core, wherein the first gate conductive layer further comprises a second voltage wiring line, and the second electrode is electrically connected to the second voltage wiring line, wherein the first data conductive layer further comprises a conductive pattern in contact with the second voltage wiring line through a first wiring line contact hole passing through the first interlayer insulating layer, and the second electrode is in contact with the conductive pattern through a second wiring line contact hole passing through the first protective layer and the first planarization layer.

12. The display device of claim 11, wherein the first electrode is electrically connected to one of the source electrode or the drain electrode of the driving transistor through an electrode contact hole passing through the first protective layer and the first planarization layer.

13. The display device of claim 12, wherein the first data conductive layer further comprises a second voltage wiring line, and
the second electrode is electrically connected to the second voltage wiring line.

14. The display device of claim 11, further comprising:
a first contact electrode on the first electrode and electrically connected to the first electrode and to one end of the light emitting element; and
a second contact electrode on the second electrode and electrically connected to the second electrode and to another end of the light emitting element.

15. The display device of claim 14, further comprising:
a thin-film encapsulation structure on the first contact electrode and the second contact electrode; and
a color filter layer on the thin-film encapsulation structure.

16. The display device of claim 15, further comprising a color control layer between the color filter layer and the thin-film encapsulation structure.

17. The display device of claim 14, further comprising an external bank on the first planarization layer and spaced apart from each of the first internal bank and the second internal bank,
wherein a height of the external bank is greater than a height of each of the first internal bank and the second internal bank.

18. The display device of claim 17, further comprising a reflective layer on one surface of the external bank.

19. The display device of claim 11, further comprising:
a buffer layer between the first substrate and the semiconductor layer; and
a light blocking layer between the buffer layer and the first substrate, the light blocking layer being configured to partially overlap the first active layer.

20. A display device comprising:
a first substrate in which a light emitting area and a non-light emitting area are defined;
a semiconductor layer on the non-light emitting area of the first substrate and comprising a first active layer of a driving transistor;
a first gate conductive layer in the non-light emitting area, the first gate conductive layer comprising a first gate electrode to overlap the first active layer;
a first voltage wiring line in the non-light emitting area and the light emitting area and extending in a first direction;
a first internal bank and a second internal bank in the light emitting area, the first internal bank and a second internal bank extending in the first direction and being spaced apart from each other in a second direction different from the first direction;
a first electrode comprising a portion extending in the first direction, at least a portion of the first electrode being on the first internal bank;
a second electrode comprising a portion extending in the first direction, at least a portion of the second electrode being on the second internal bank; and
a plurality of light emitting elements between the first electrode and the second electrode and electrically connected to the first electrode and the second electrode,
wherein each of the plurality of light emitting elements comprises a semiconductor core comprising a light emitting layer, and an insulating film around at least a portion of an outer surface of the semiconductor core,
wherein the first electrode comprises a first electrode stem portion extending in the second direction, and a first electrode branch portion branched from the first electrode stem portion in the first direction, and
the second electrode comprises a second electrode stem portion extending in the second direction, and a second electrode branch portion branched from the second electrode stem portion in the first direction.

21. The display device of claim 20, further comprising:
a scan line in the non-light emitting area and extending in the second direction; and
a sensing line extending in the second direction and spaced apart from the scan line.

22. The display device of claim 21, further comprising:
a reference voltage wiring line in the non-light emitting area and the light emitting area, the reference voltage wiring line extending in the first direction; and
a reference voltage distribution line in the non-light emitting area, the reference voltage distribution line extending in the second direction and being electrically connected to the reference voltage wiring line.

23. The display device of claim 20, further comprising:
a first contact electrode on the first electrode branch portion and electrically connected to the first electrode and to one end of a light emitting element of the plurality of light emitting elements; and
a second contact electrode on the second electrode branch portion and electrically connected to the second electrode and to another end of the light emitting element.

24. The display device of claim 23, further comprising an external bank to cover the non-light emitting area and surround the light emitting area,
wherein a height of the external bank is greater than a height of each of the first internal bank and the second internal bank.

* * * * *